(12) United States Patent
Matsuda et al.

(10) Patent No.: US 10,615,187 B2
(45) Date of Patent: Apr. 7, 2020

(54) TRANSISTOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Shinpei Matsuda, Hyogo (JP); Daigo Ito, Kanagawa (JP); Daisuke Matsubayashi, Kanagawa (JP); Yasutaka Suzuki, Kanagawa (JP); Etsuko Kamata, Kanagawa (JP); Yutaka Shionoiri, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 6 days.

(21) Appl. No.: 15/658,513

(22) Filed: Jul. 25, 2017

(65) Prior Publication Data

US 2018/0033807 A1    Feb. 1, 2018

(30) Foreign Application Priority Data

Jul. 27, 2016   (JP) ................................ 2016-147684

(51) Int. Cl.
*H01L 27/12* (2006.01)
*H01L 29/423* (2006.01)
(Continued)

(52) U.S. Cl.
CPC ...... *H01L 27/1251* (2013.01); *H01L 27/1052* (2013.01); *H01L 27/127* (2013.01); *H01L 27/1225* (2013.01); *H01L 29/42384* (2013.01); *H01L 29/7869* (2013.01); *H01L 29/78648* (2013.01); *H01L 29/78696* (2013.01)

(58) Field of Classification Search
CPC .................................................. H01L 27/1251
See application file for complete search history.

(56) References Cited

U.S. PATENT DOCUMENTS 8,384,080 B2   2/2013  Taniguchi et al.
8,547,771 B2  10/2013  Koyama
(Continued)

FOREIGN PATENT DOCUMENTS

JP    2011-124360 A    6/2011
JP    2011-138934 A    7/2011
JP    2012-257187 A   12/2012

*Primary Examiner* — Moazzam Hossain
*Assistant Examiner* — Omar F Mojaddedi
(74) *Attorney, Agent, or Firm* — Fish & Richardson P.C.

(57) ABSTRACT

A highly reliable semiconductor device capable of retaining data for a long period is provided. The transistor includes a first gate electrode, a first gate insulator over the first gate electrode, a first oxide and a second oxide over the first gate insulator, a first conductor over the first oxide, a second conductor over the second oxide, a third oxide covering the first gate insulator, the first oxide, the first conductor, the second oxide, and the second conductor, a second gate insulator over the third oxide, and a second gate electrode over the second gate insulator. An end portion of the second gate electrode is positioned between an end portion of the first conductor and an end portion of the second conductor in a channel length direction.

14 Claims, 30 Drawing Sheets

(51) Int. Cl.
    *H01L 29/786*    (2006.01)
    *H01L 27/105*    (2006.01)

(56) References Cited

U.S. PATENT DOCUMENTS

| | | | |
|---|---|---|---|
| 8,643,007 | B2 | 2/2014 | Nomura et al. |
| 8,692,252 | B2 | 4/2014 | Takata et al. |
| 8,995,174 | B2 | 3/2015 | Koyama |
| 9,231,111 | B2 | 1/2016 | Yamazaki et al. |
| 9,293,544 | B2 | 3/2016 | Yamazaki |
| 9,373,711 | B2 | 6/2016 | Yamazaki et al. |
| 2010/0117079 | A1 | 5/2010 | Miyairi et al. |
| 2010/0244031 | A1 | 9/2010 | Akimoto et al. |
| 2011/0156117 | A1 | 6/2011 | Yamazaki et al. |
| 2011/0180796 | A1 | 7/2011 | Yamazaki et al. |
| 2012/0032163 | A1 | 2/2012 | Yamazaki |
| 2014/0225104 | A1* | 8/2014 | Yamazaki ............ H01L 29/7869 257/43 |
| 2015/0069384 | A1* | 3/2015 | Kobayashi .......... H01L 29/7869 257/43 |
| 2015/0155362 | A1* | 6/2015 | Nakazawa .............. H01L 29/45 257/43 |
| 2015/0280691 | A1 | 10/2015 | Koyama |
| 2015/0348961 | A1* | 12/2015 | Isobe .................. H01L 27/0266 361/56 |
| 2016/0247830 | A1 | 8/2016 | Zhang et al. |
| 2017/0229486 | A1 | 8/2017 | Matsuda et al. |
| 2017/0236842 | A1 | 8/2017 | Matsuda et al. |
| 2017/0317111 | A1 | 11/2017 | Ando et al. |

\* cited by examiner

FIG. 2A
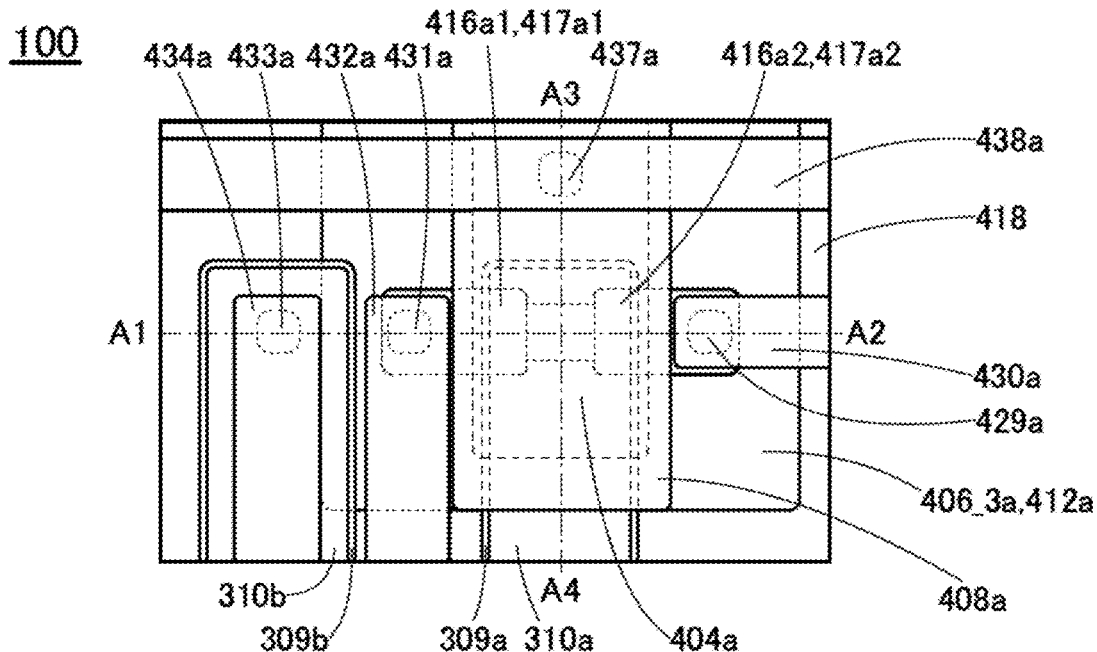
FIG. 2B
FIG. 2C
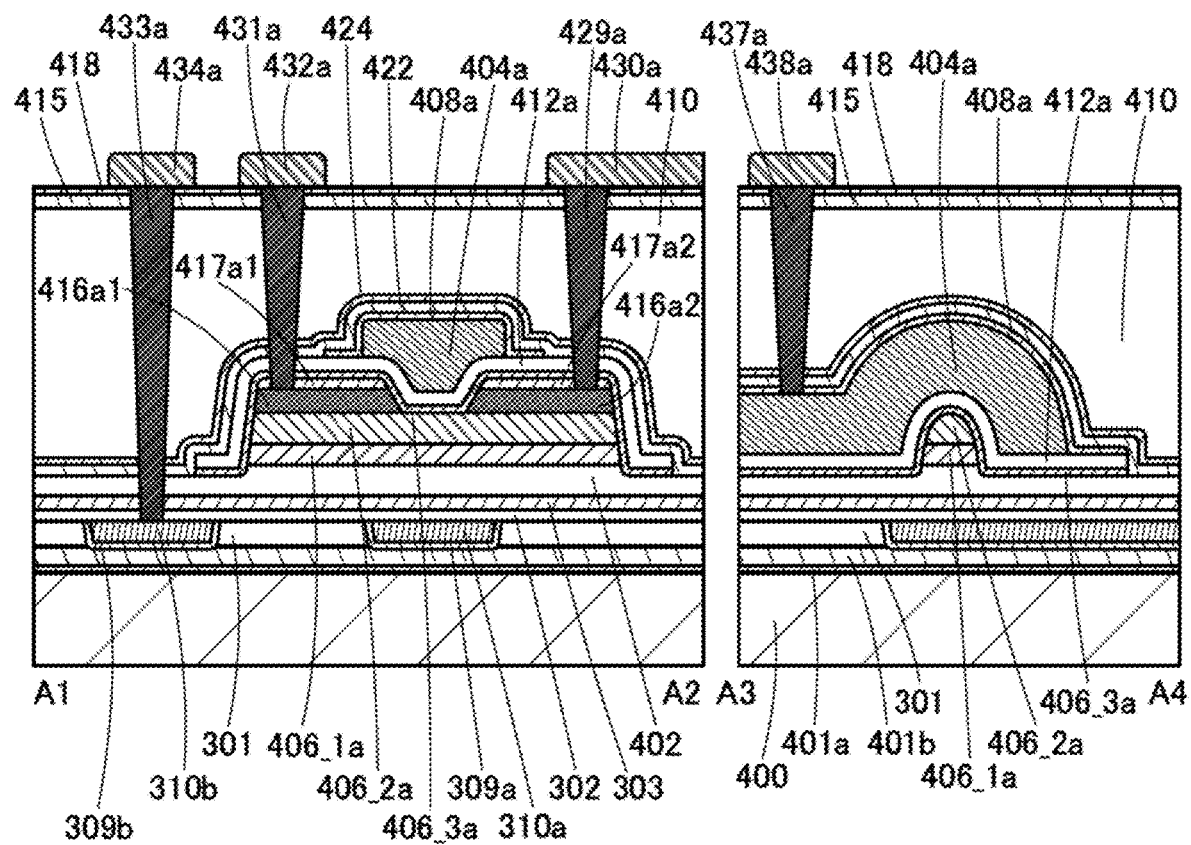

FIG. 3A
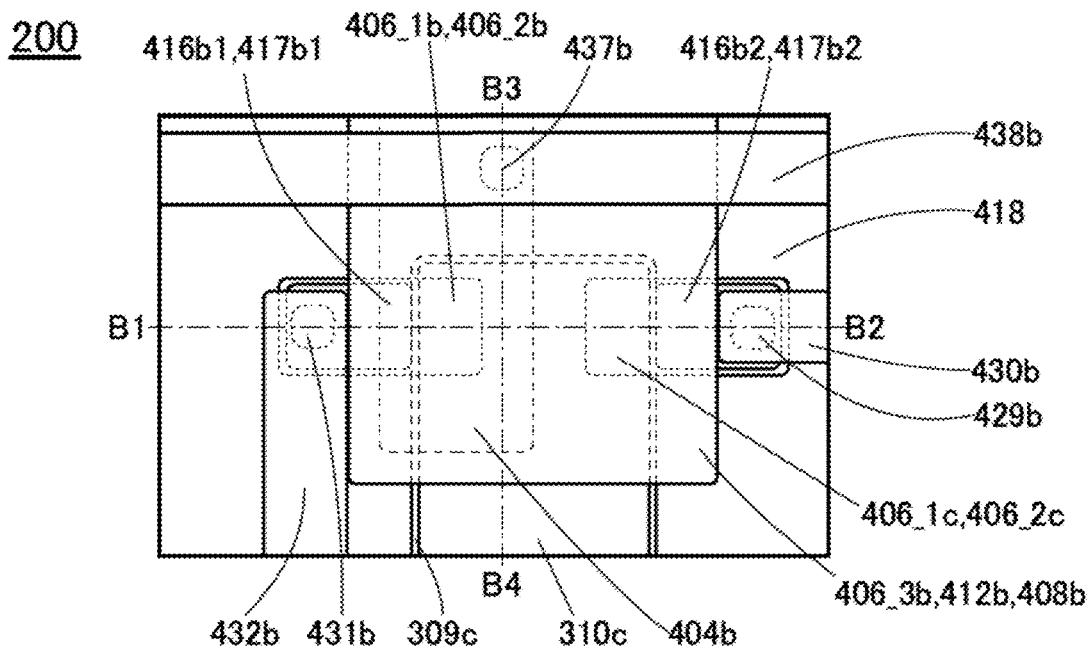
FIG. 3B
FIG. 3C
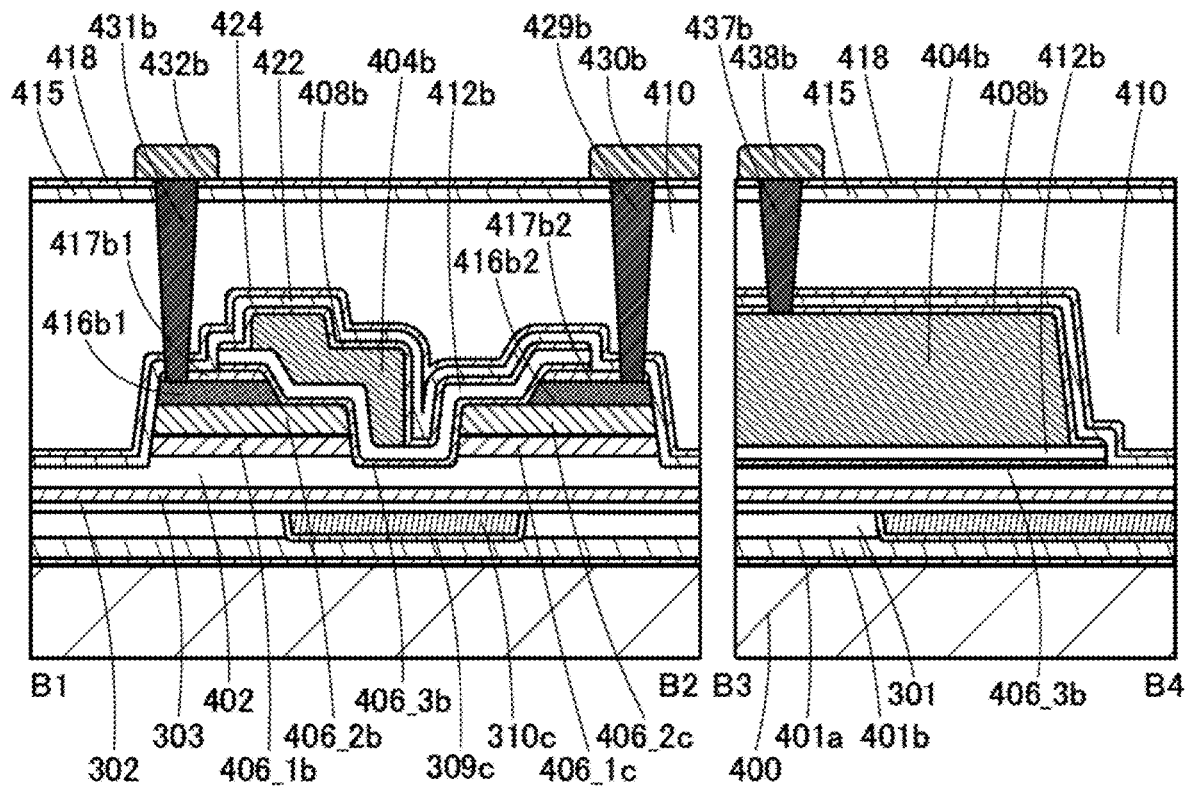

FIG. 4A
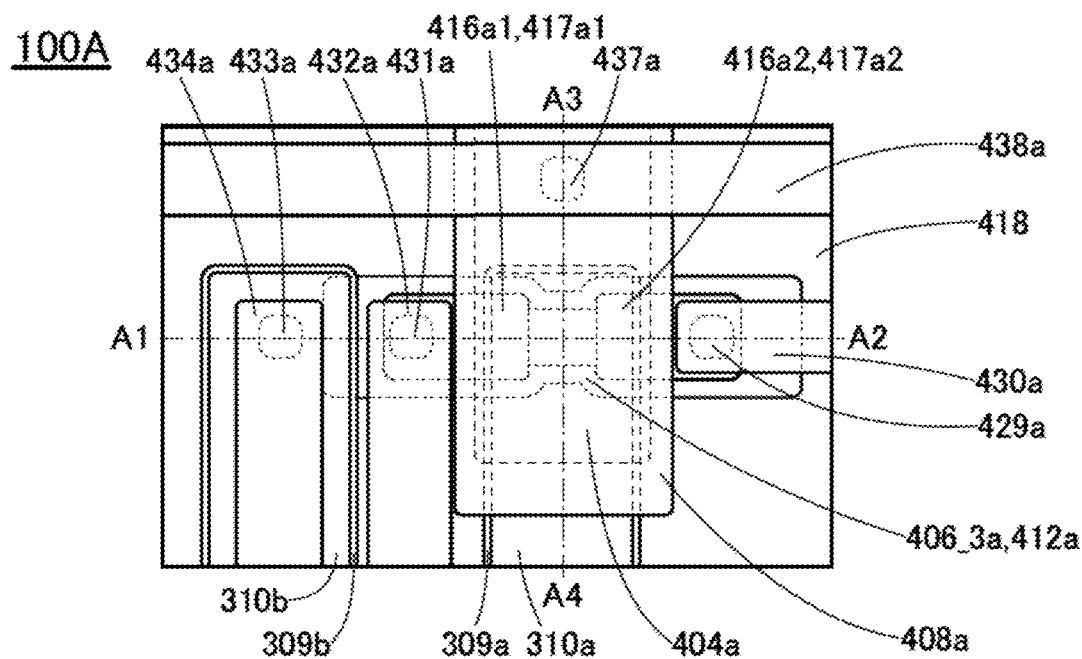
FIG. 4B
FIG. 4C
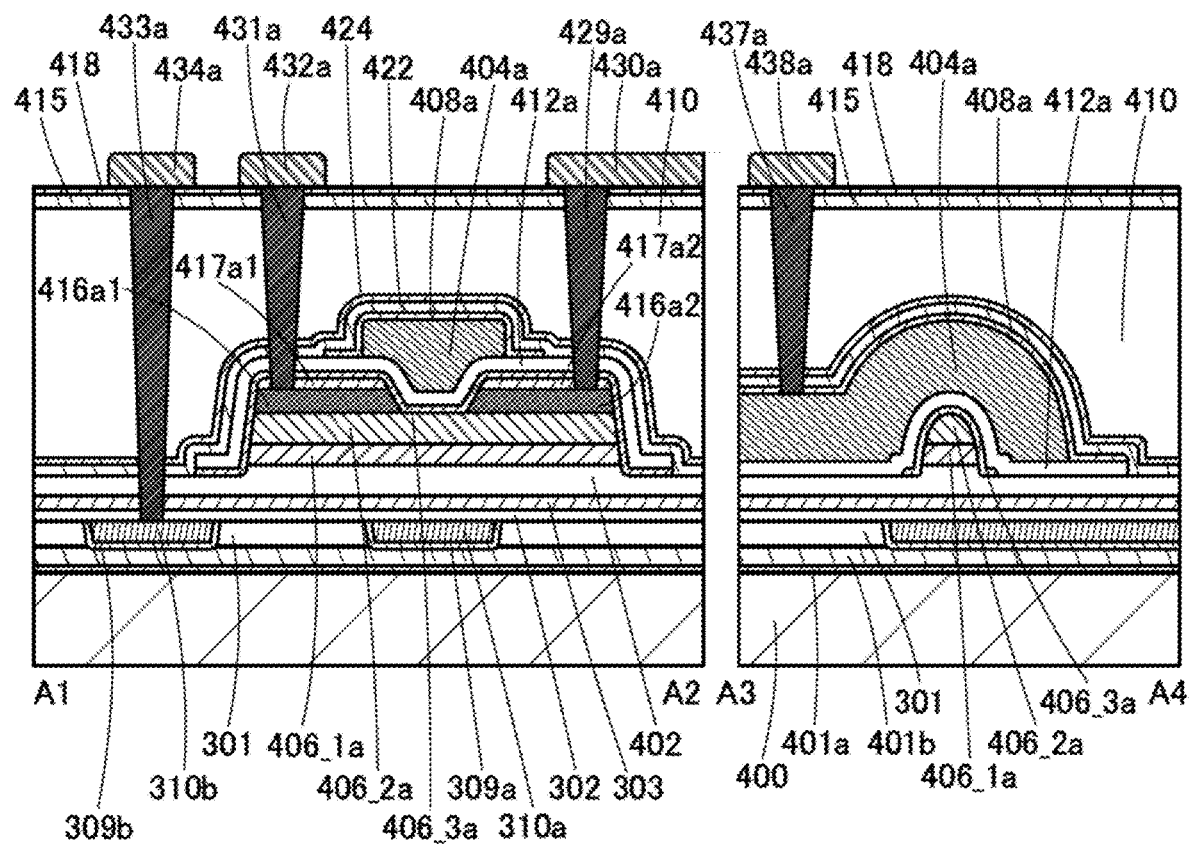

FIG. 5A
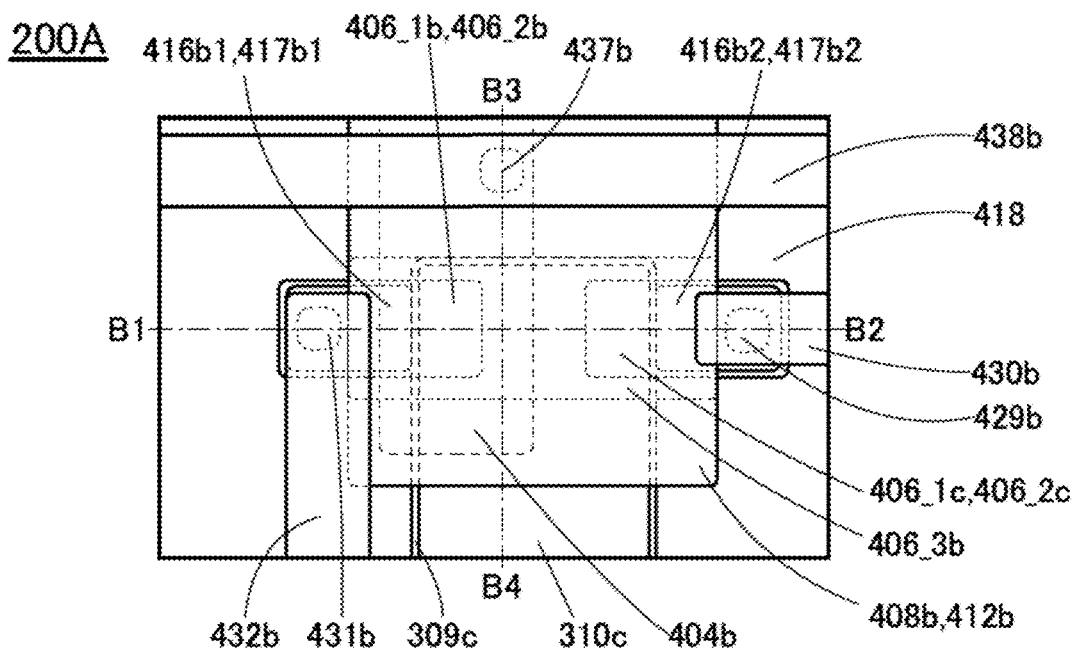
FIG. 5B
FIG. 5C
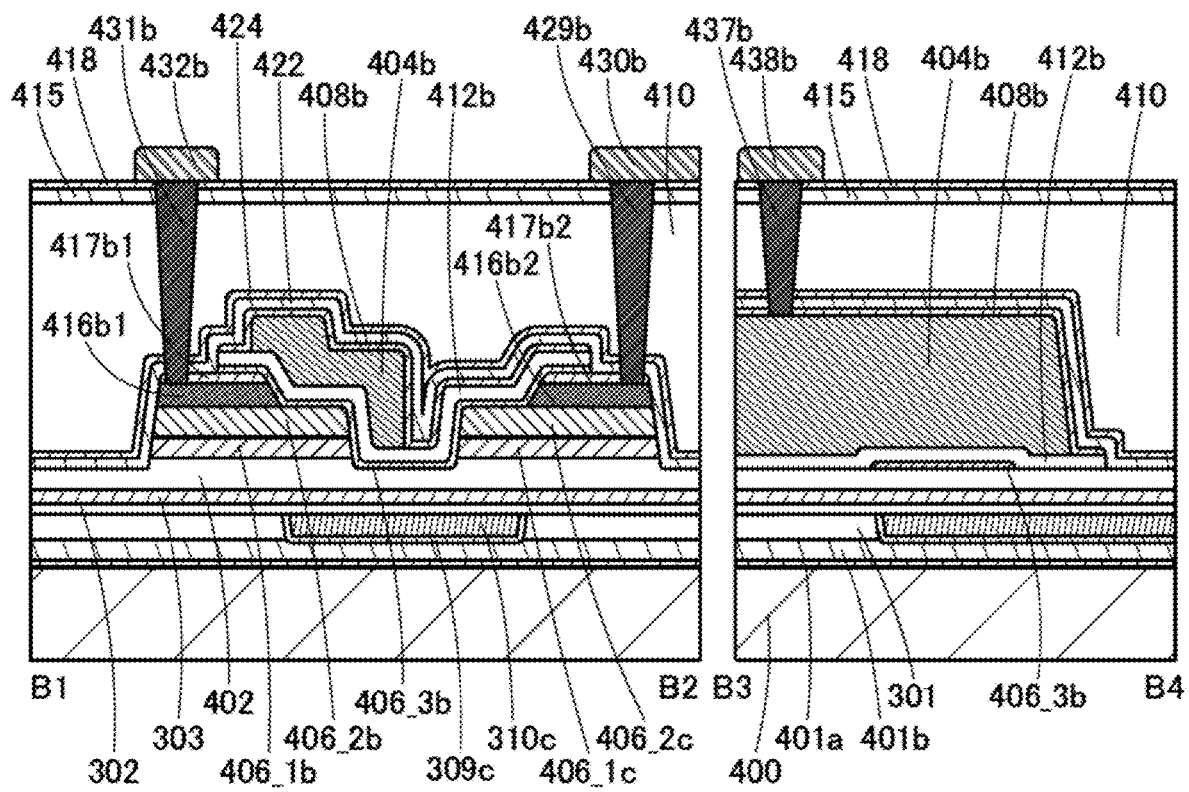

FIG. 7A
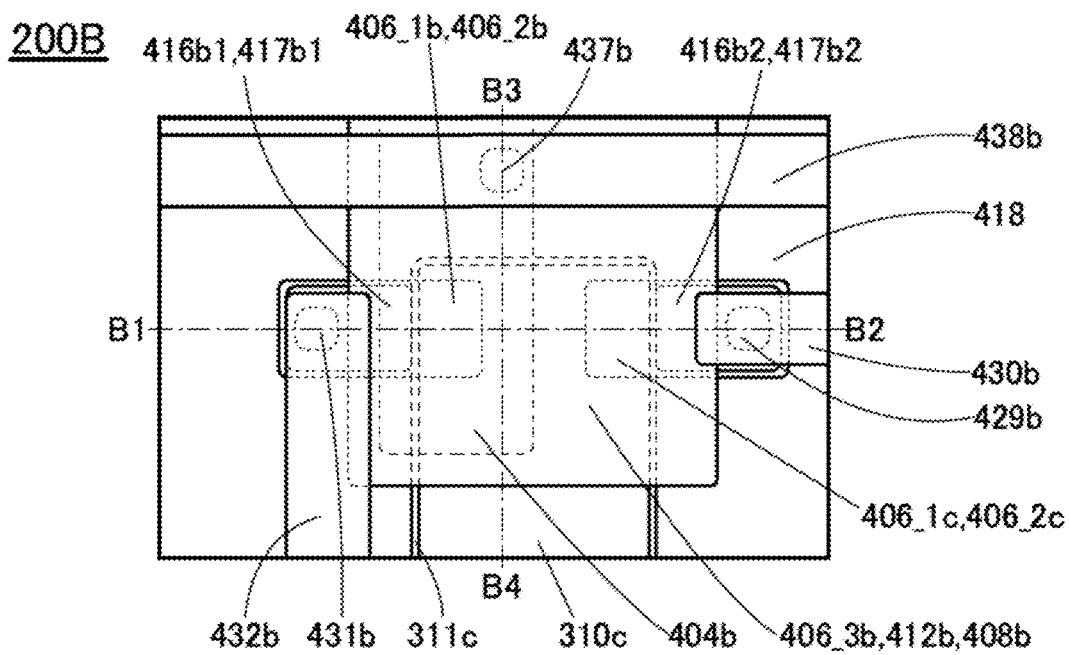
FIG. 7B
FIG. 7C
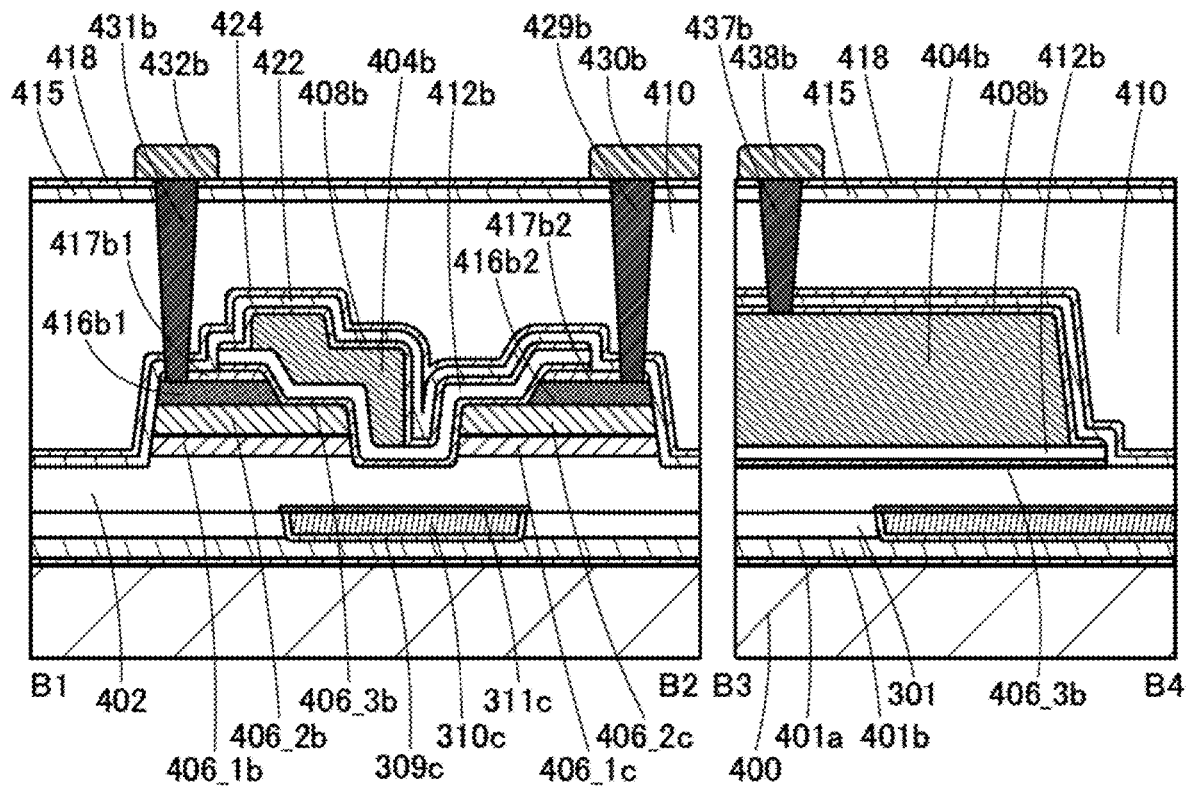

FIG. 8A
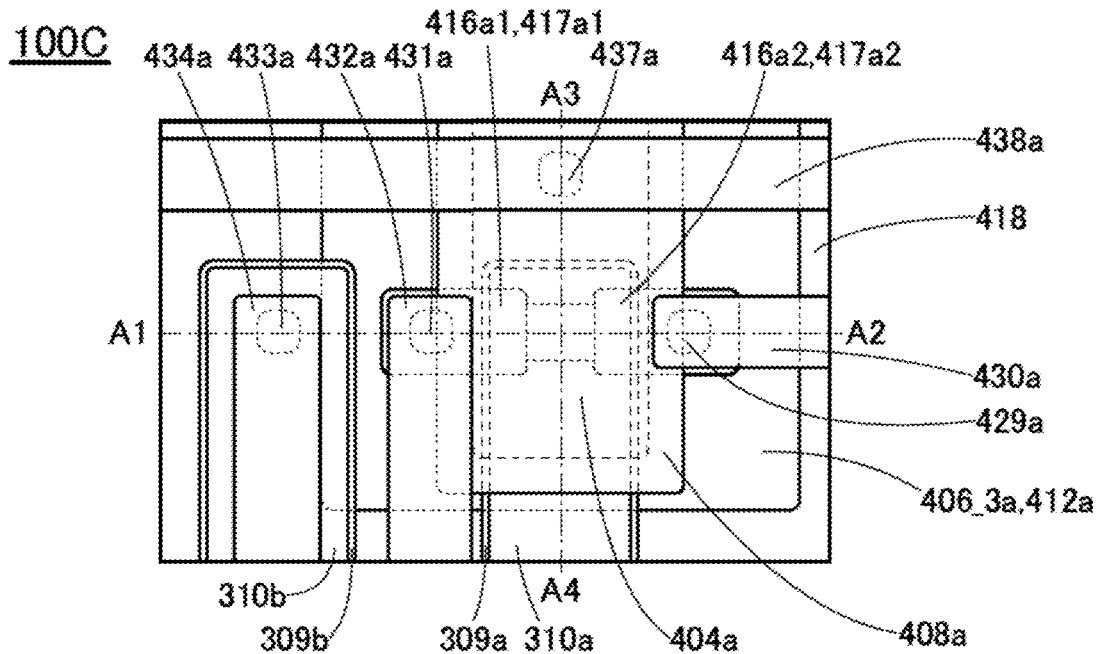
FIG. 8B
FIG. 8C
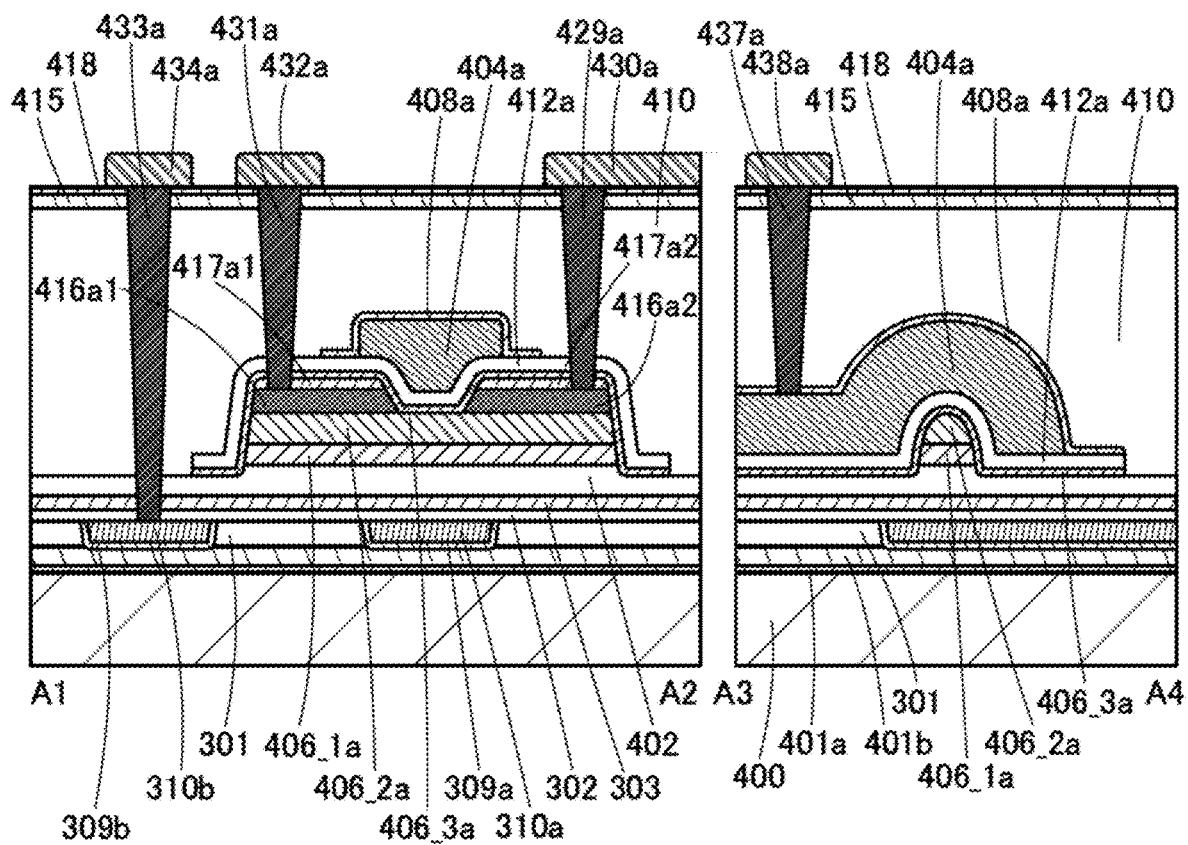

FIG. 9A
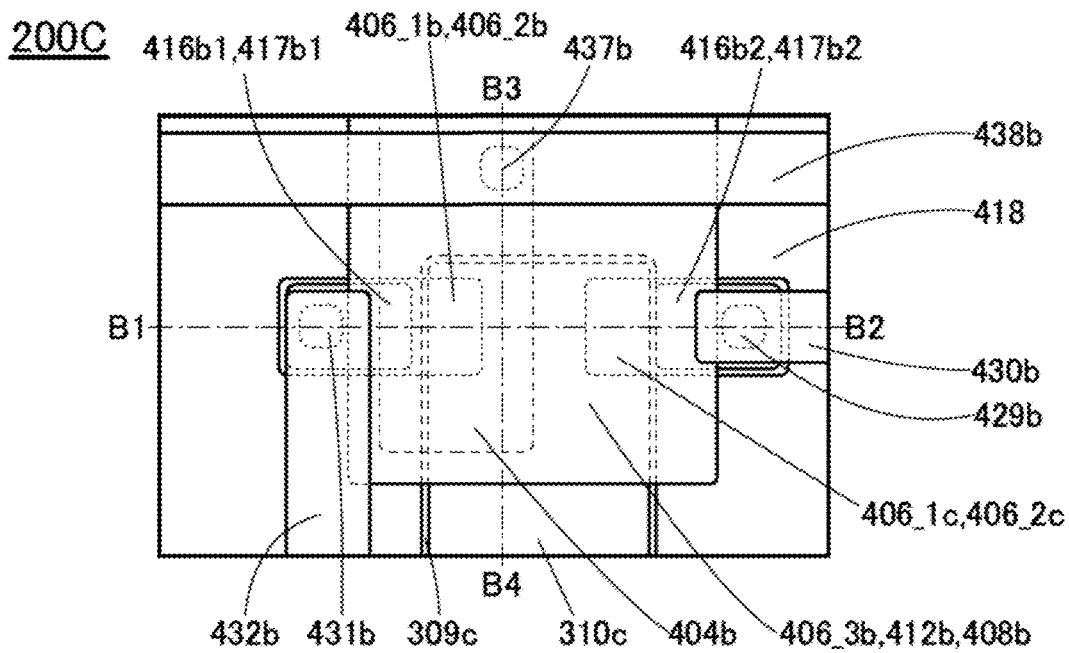
FIG. 9B
FIG. 9C
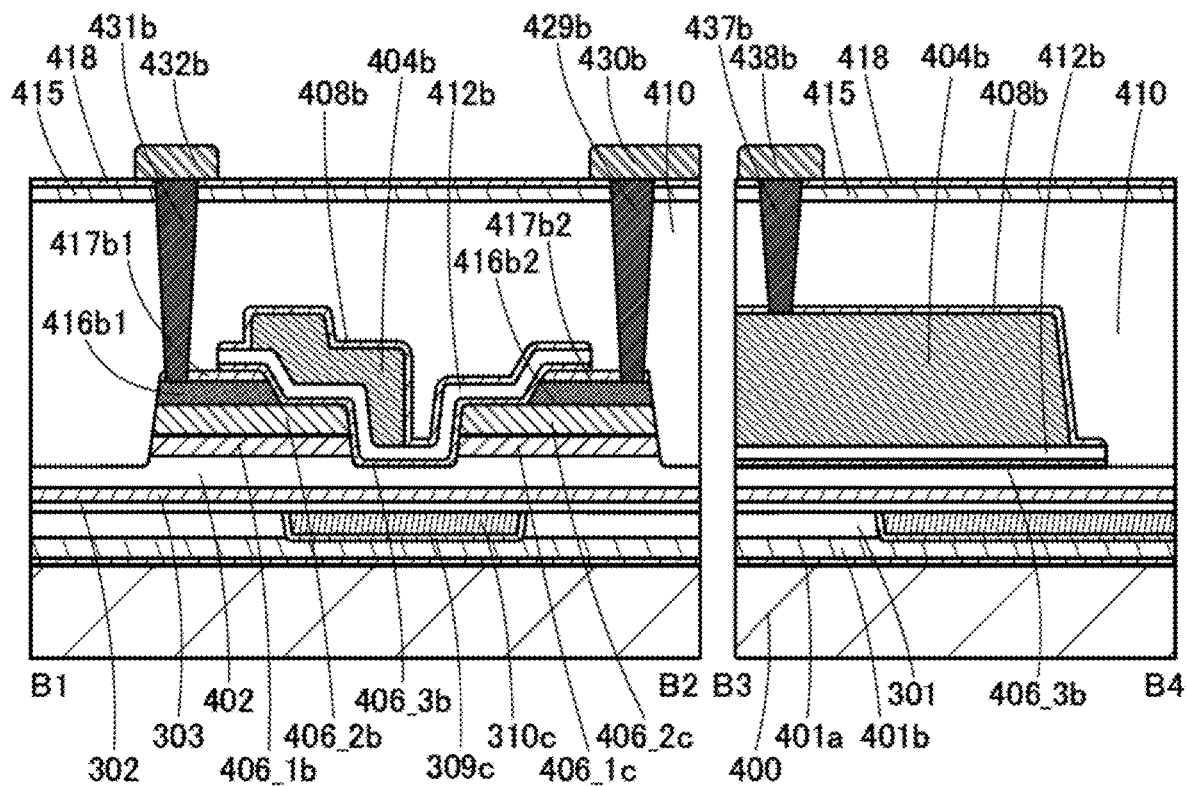

FIG. 16A
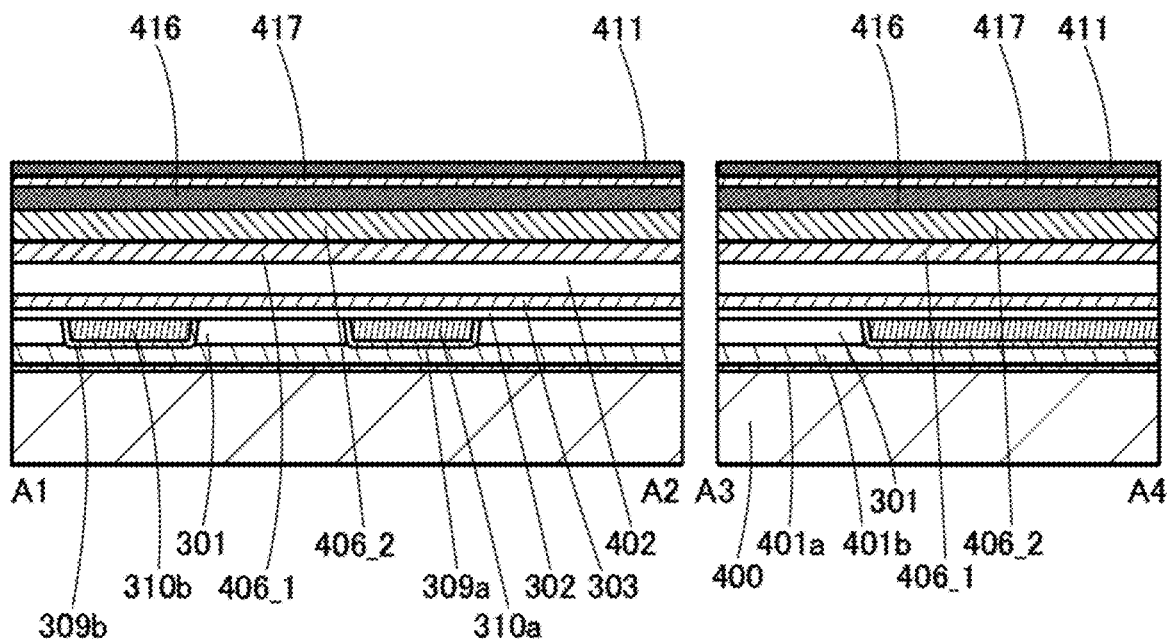
FIG. 16B
FIG. 16C
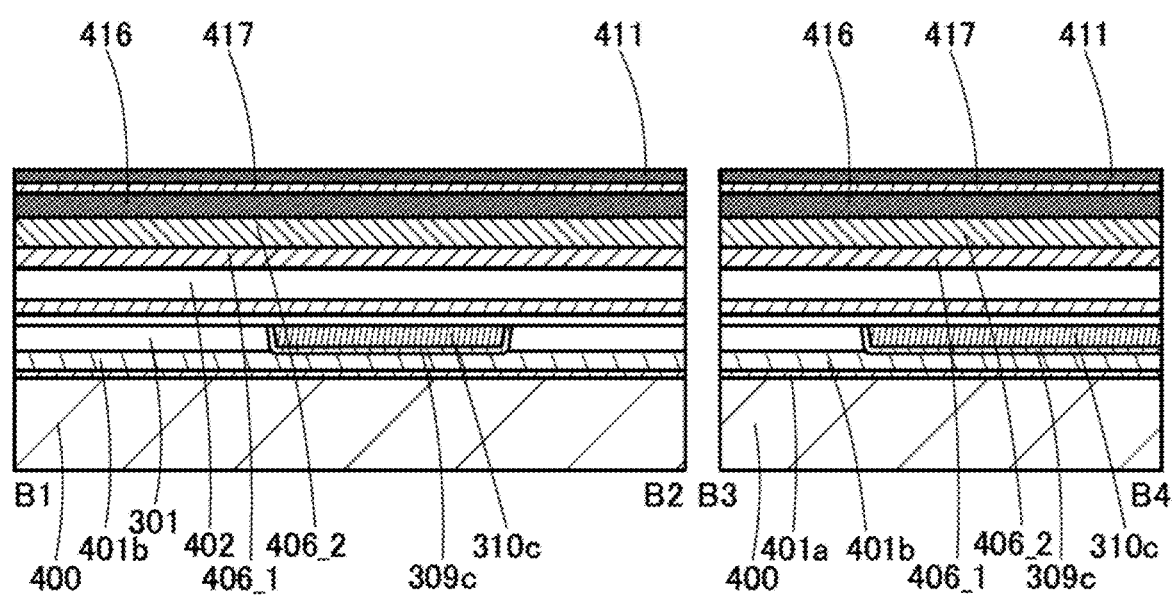
FIG. 16D

FIG. 17A
FIG. 17B
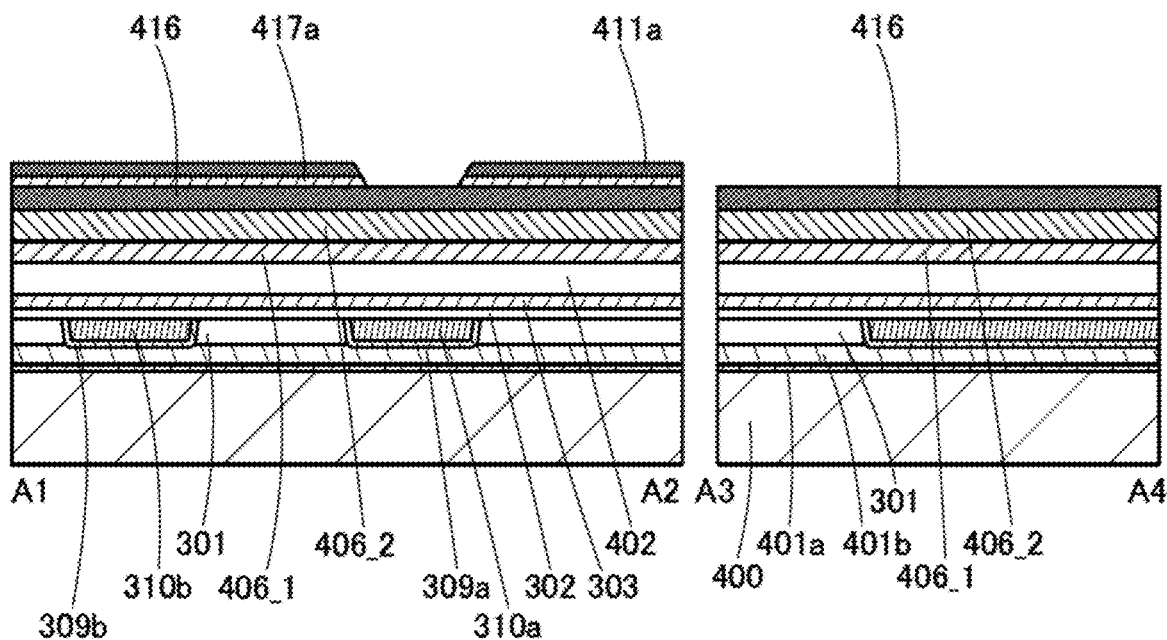
FIG. 17C
FIG. 17D
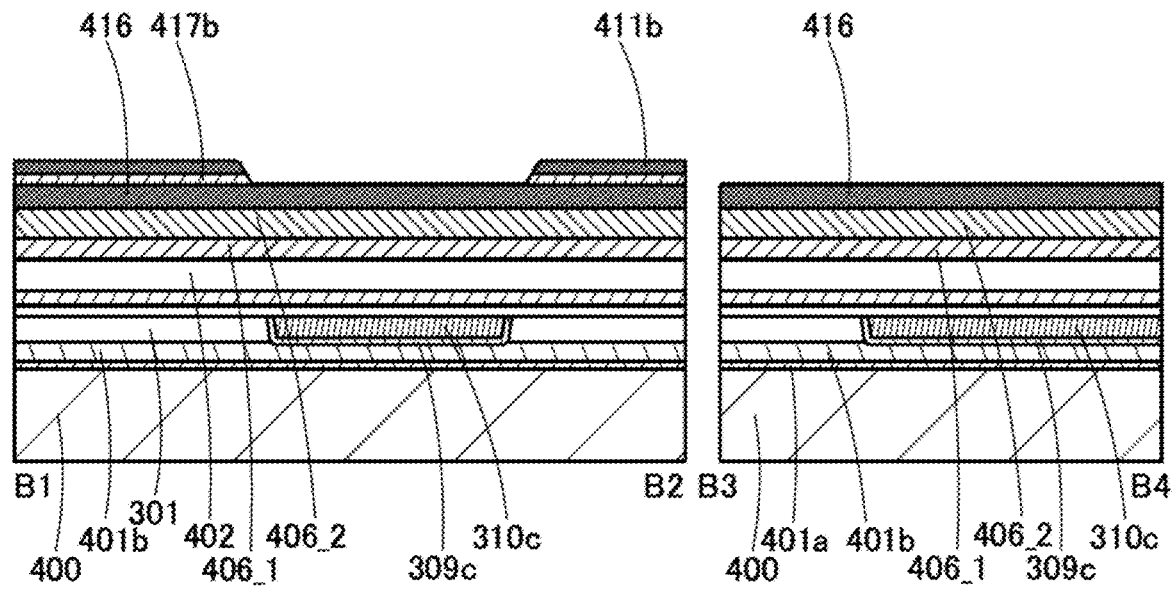

FIG. 18A
FIG. 18B
FIG. 18C
FIG. 18D
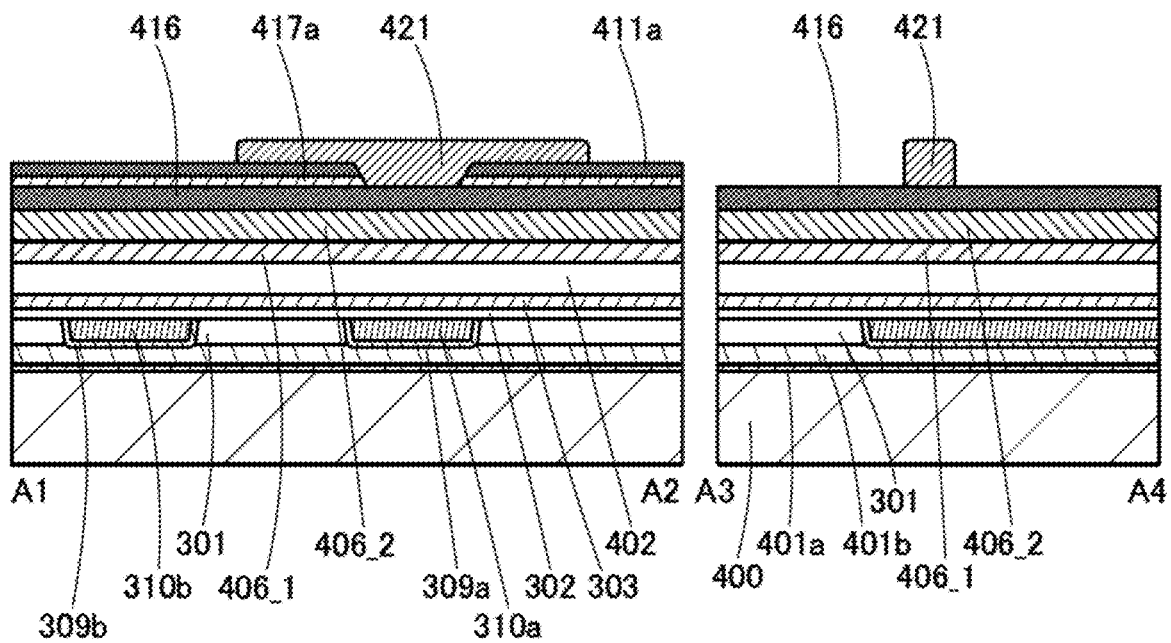
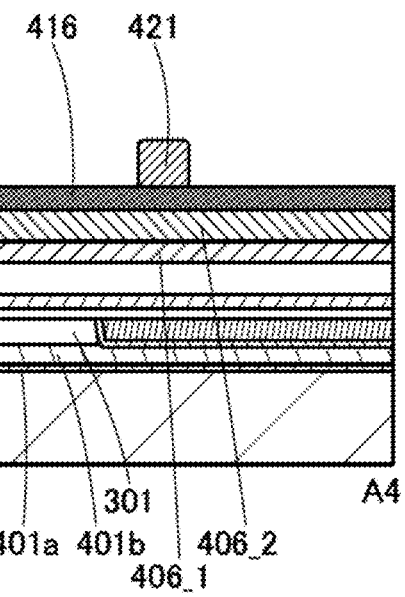
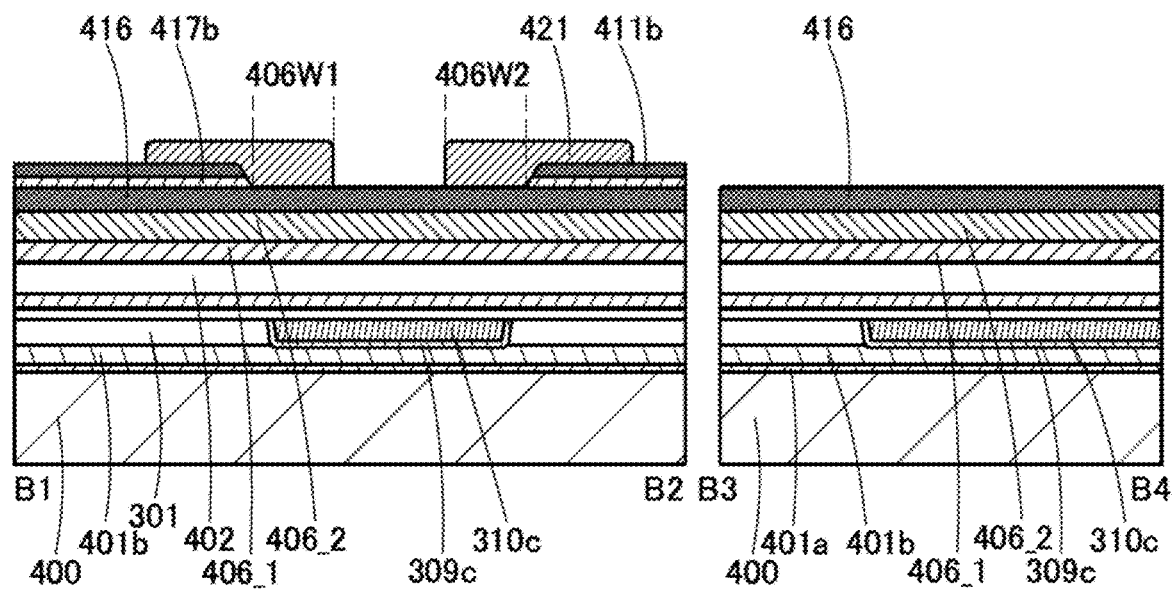

FIG. 19A
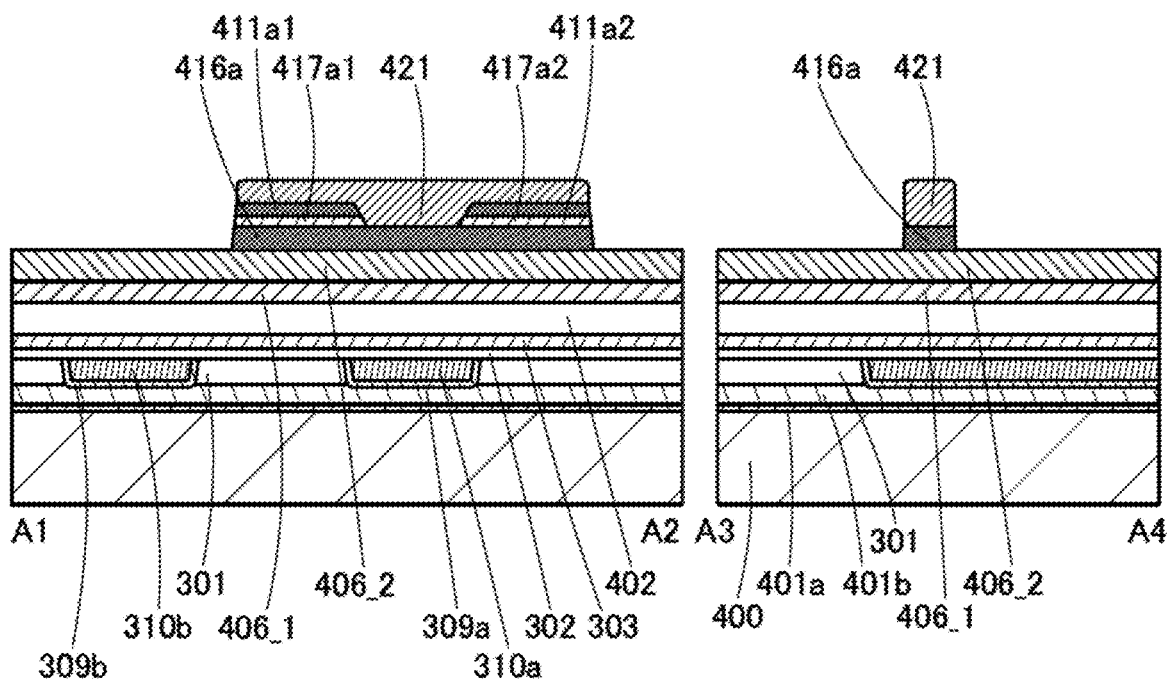
FIG. 19B
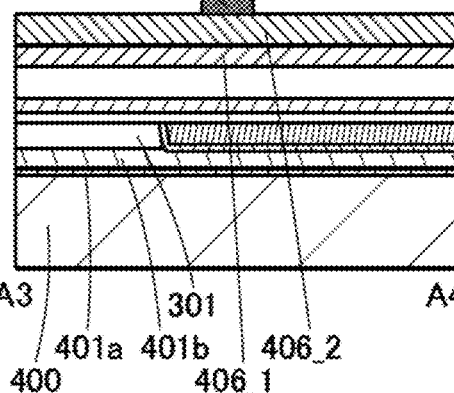
FIG. 19C
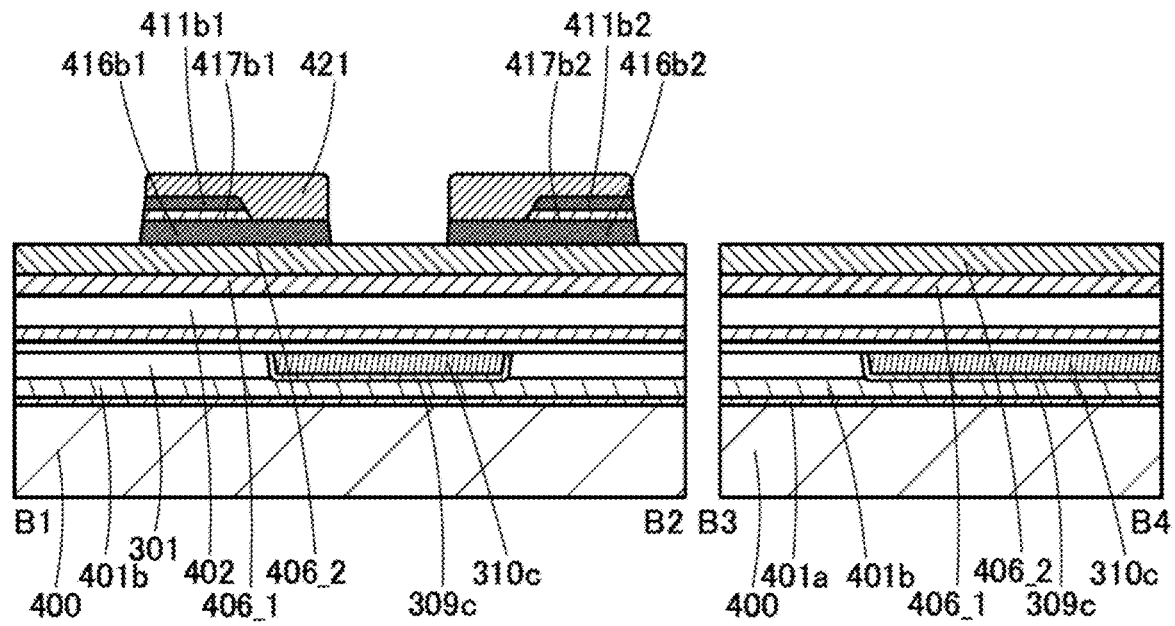
FIG. 19D

FIG. 20A
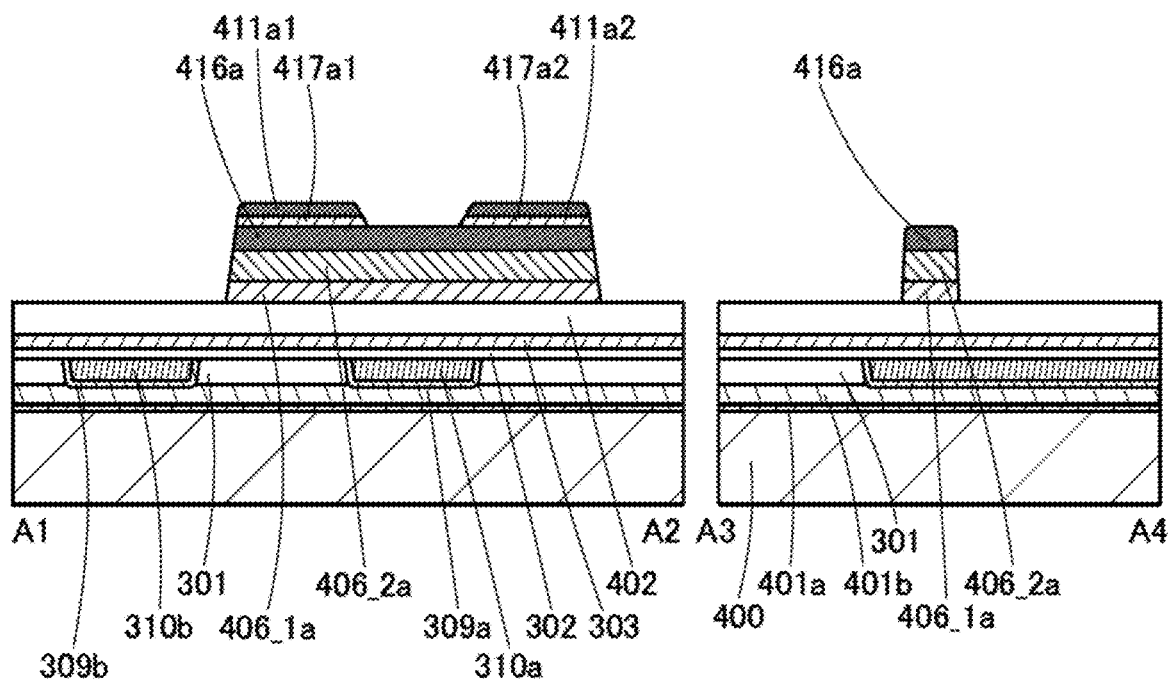
FIG. 20B
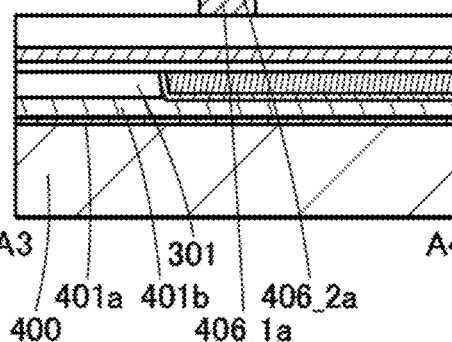
FIG. 20C
FIG. 20D
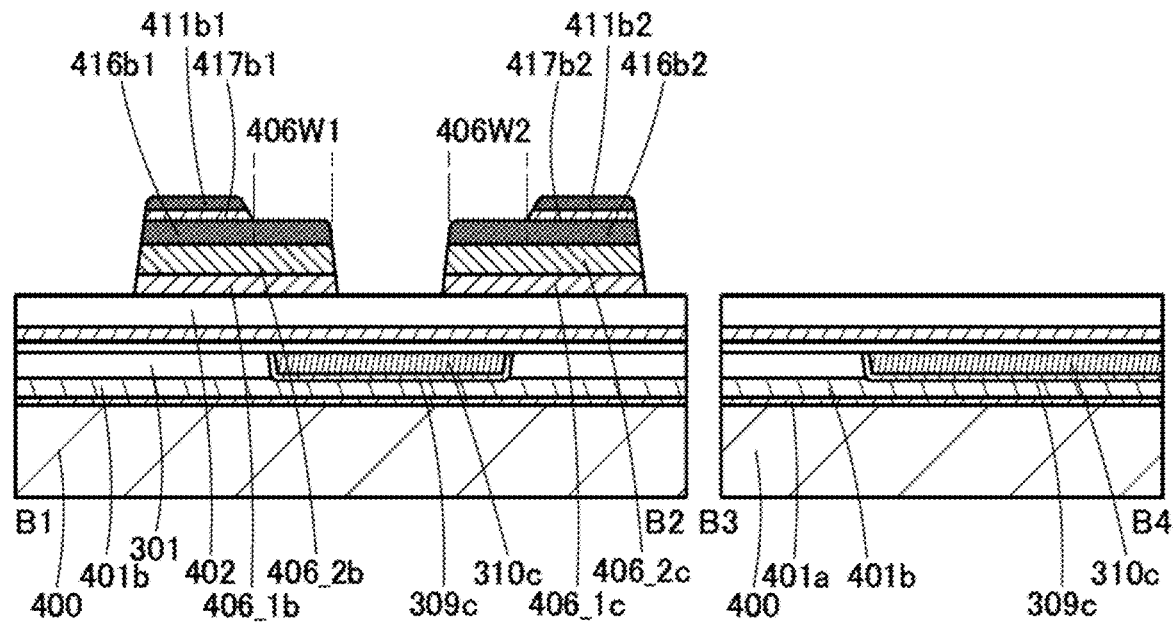

FIG. 21A
FIG. 21B
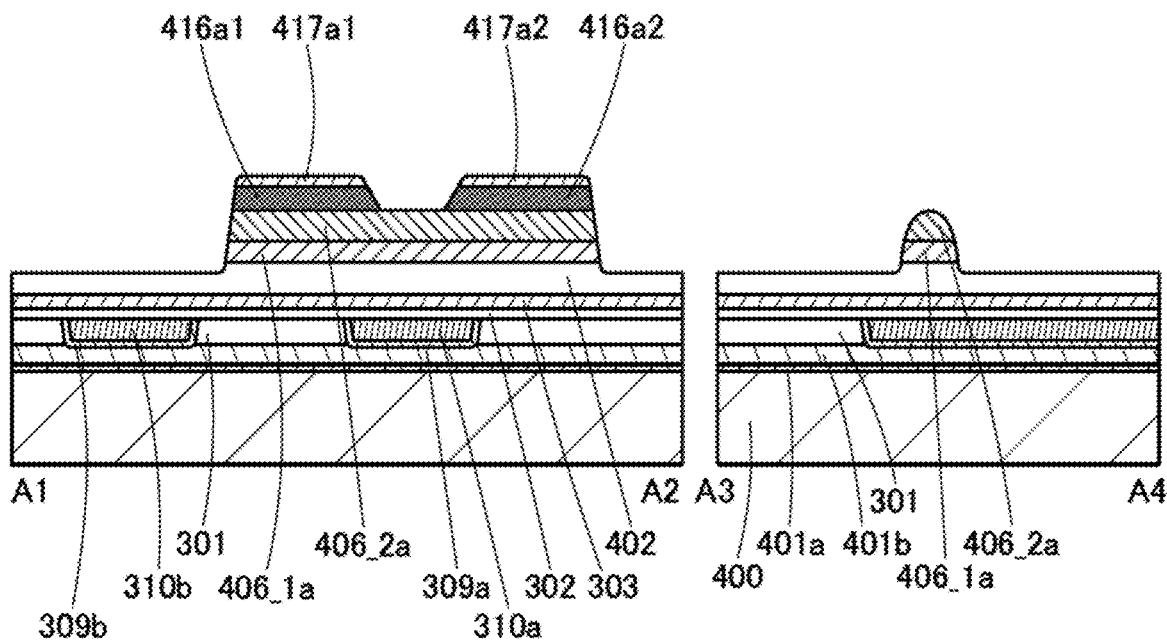
FIG. 21C
FIG. 21D
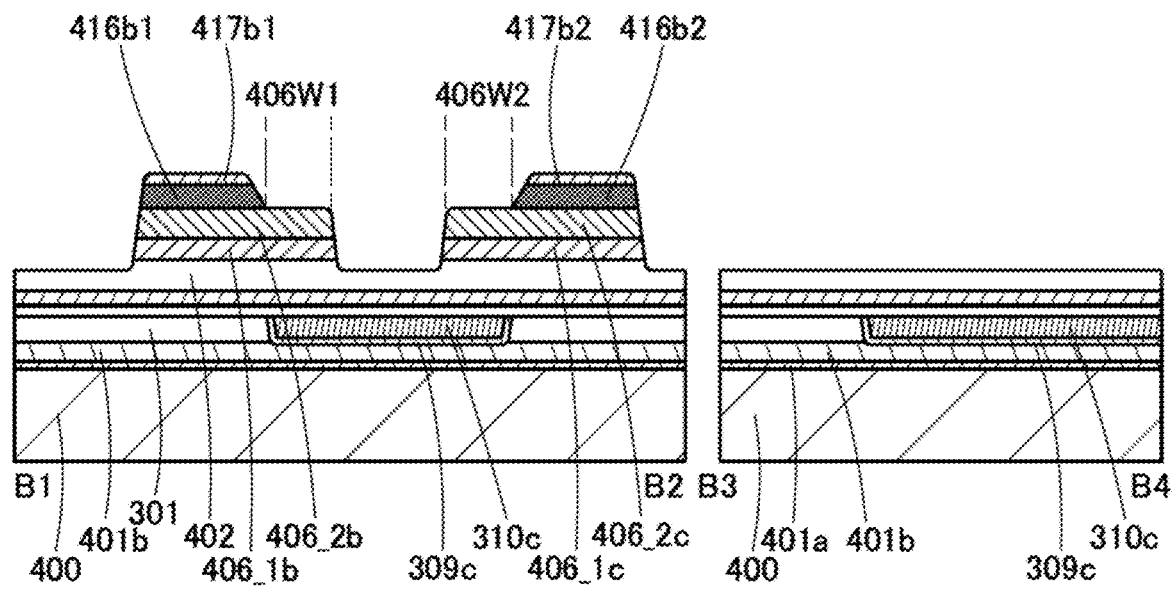

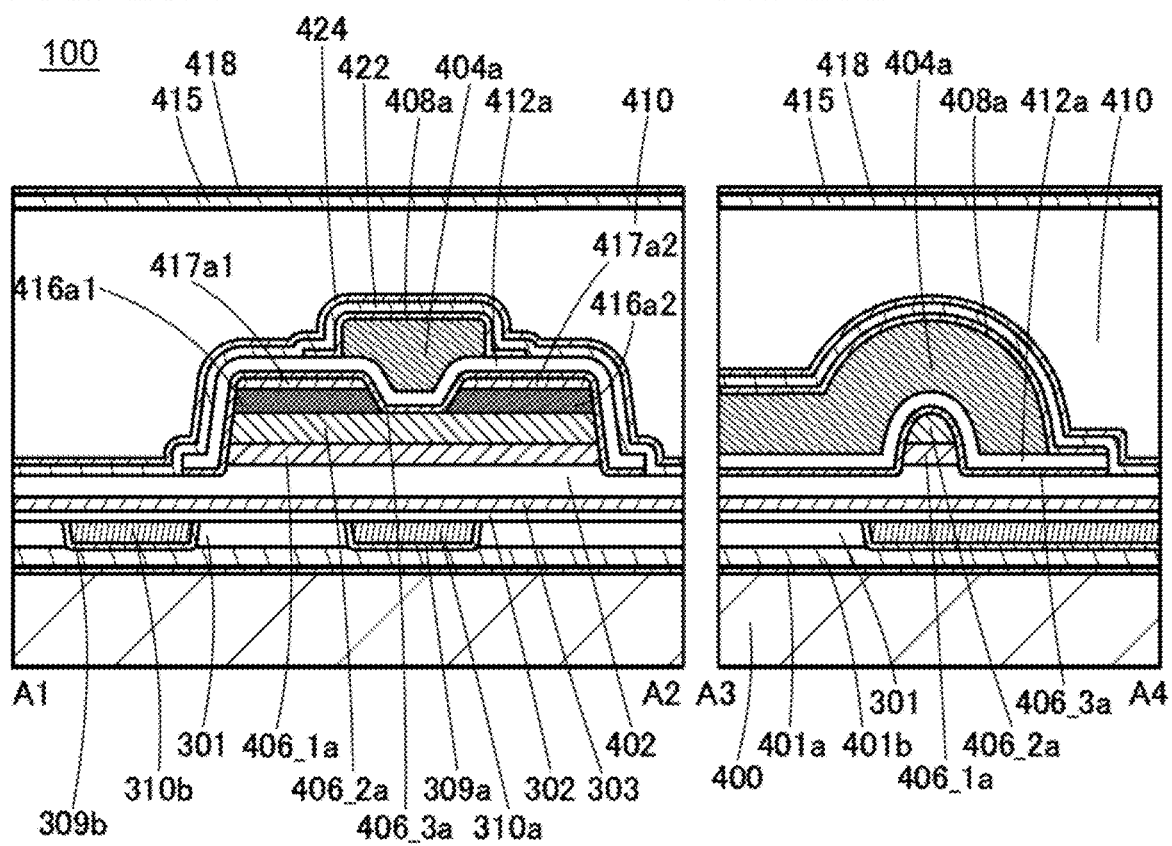

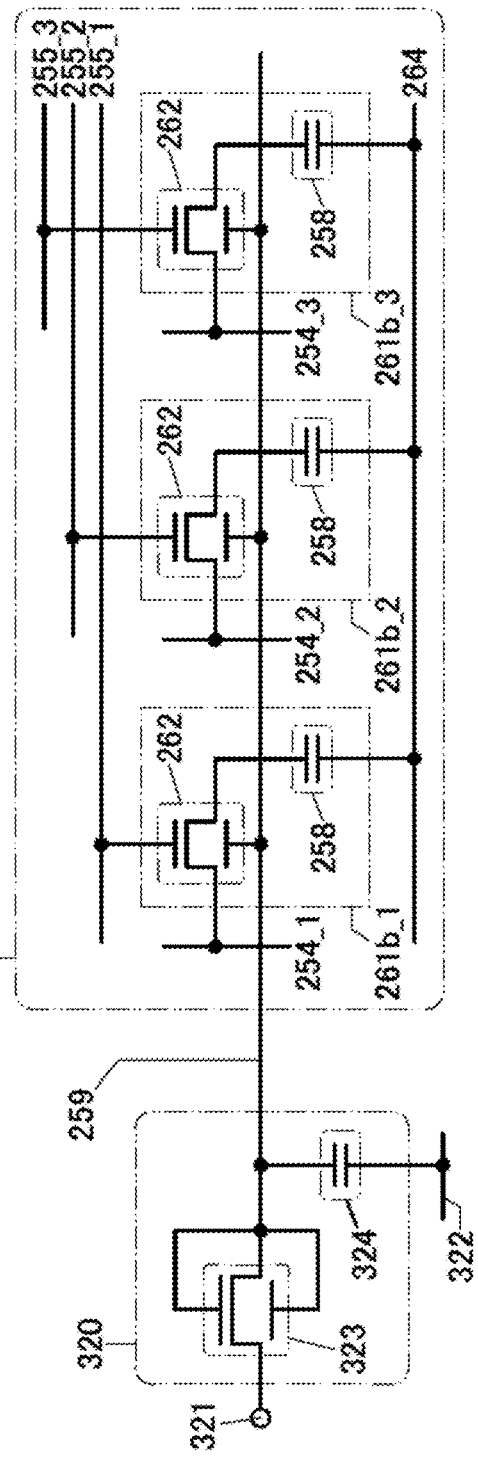
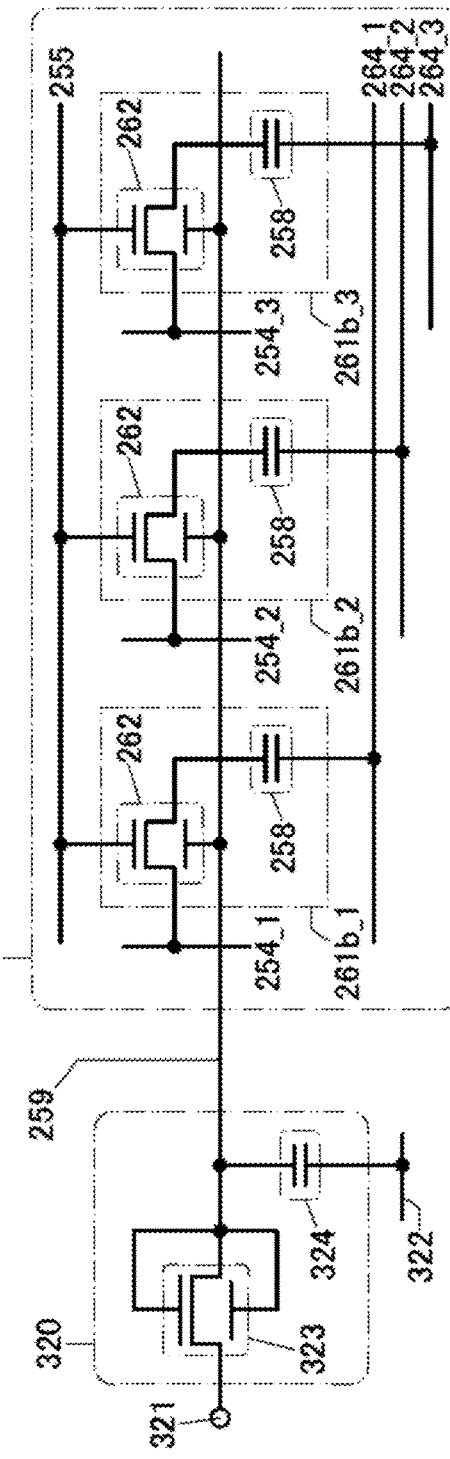
FIG. 26A 300
FIG. 26B 300a

TRANSISTOR, SEMICONDUCTOR DEVICE, AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a light-emitting device, a display device, an electronic device, a lighting device, and a manufacturing method thereof. In particular, one embodiment of the present invention relates to a light-emitting device using an organic electroluminescence (hereinafter also referred to as EL) phenomenon, and a method for fabricating the light-emitting device. For example, one embodiment of the present invention relates to an electronic device that includes, as a component, an LSI, a CPU, a power device mounted in a power circuit, or a semiconductor integrated circuit including a memory, a thyristor, a converter, an image sensor, or the like.

Note that one embodiment of the present invention is not limited to the above technical field.

In this specification, the term "semiconductor device" means all devices that can function by utilizing semiconductor characteristics. An electro-optical device, a semiconductor circuit, and an electronic device include a semiconductor device in some cases.

2. Description of the Related Art

A technique by which a transistor is formed with a semiconductor thin film has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely small leakage current in an off state. For example, a low-power-consumption CPU utilizing a characteristic of small leakage current of the transistor including an oxide semiconductor has been disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of the semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

SUMMARY OF THE INVENTION

An object of one embodiment of the present invention is to provide a semiconductor device having favorable electrical characteristics. An object of one embodiment of the present invention is to provide a semiconductor device having high reliability. An object of one embodiment of the present invention is to provide a semiconductor device that can be miniaturized or highly integrated. An object of one embodiment of the present invention is to provide a semiconductor device that can be manufactured with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a low-power semiconductor device. An object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

A first transistor and a second transistor having different electrical characteristics from those of the first transistor are provided over the same layer. For example, a first transistor having a first threshold voltage and a second transistor having a second threshold voltage are provided over the same layer. A semiconductor layer including a channel formation region of the first transistor and a semiconductor layer including a channel formation region of the second transistor are formed using semiconductor materials having different electron affinities.

Providing transistors having different electrical characteristics in one semiconductor device can increase circuit design flexibility. On the other hand, the transistors need to be separately manufactured; thus, the number of manufacturing steps of the semiconductor device is drastically increased. The drastic increase in manufacturing steps easily leads a decrease in yield, and the productivity of the semiconductor device is significantly decreased in some cases. According to one embodiment of the present invention, transistors having different electrical characteristics can be provided in one semiconductor device, without drastic increase in the manufacturing steps.

One embodiment of the present invention is a transistor including a first gate electrode, a first gate insulator over the first gate electrode, a first oxide and a second oxide over the first gate insulator, a first conductor over the first oxide, a second conductor over the second oxide, a third oxide covering the first gate insulator, the first oxide, the first conductor, the second oxide, and the second conductor, a second gate insulator over the third oxide, and a second gate electrode over the second gate insulator. The second gate electrode does not have a region overlapping with the first conductor, and the second gate electrode has a region overlapping with the second conductor.

In any of the above embodiments, the following structure may be employed: at one end portion of the first conductor, a side surface of the first conductor is not aligned with a side surface of the first oxide; at one end portion of the second conductor, a side surface of the second conductor is not aligned with a side surface of the second oxide to form a step-like shape; a distance between the first conductor and the second conductor is longer than a distance between the first oxide and the second oxide; at the other end portion of the first conductor, a side surface of the first conductor is aligned with a side surface of the first oxide; and at the other end portion of the second conductor, a side surface of the second conductor is aligned with a side surface of the second oxide.

In any of the above embodiments, the third oxide may serve as a channel formation region, the first conductor may serve as a source electrode, and the second conductor may serve as a drain electrode.

In any of the above embodiments, the first to third oxides may include a metal oxide.

In any of the above embodiments, the first gate electrode and the second conductor may be electrically connected to each other.

In any of the above embodiments, the first gate electrode, the second conductor, and the second gate electrode may be electrically connected to one another.

In any of the above embodiments, a region in the third oxide on the first conductor side which does not overlap with the second gate electrode may be larger than a region in the third oxide which overlaps with the second gate electrode.

One embodiment of the present invention is a semiconductor device including a first transistor and a second transistor. The first transistor includes a first gate electrode, a first gate insulator over the first gate electrode, a first oxide and a second oxide over the first gate insulator, a first conductor over the first oxide, a second conductor over the second oxide, a third oxide covering the first gate insulator, the first oxide, the first conductor, the second oxide, and the second conductor, a second gate insulator over the third oxide, and a second gate electrode over the second gate insulator. The second gate electrode does not have a region overlapping with the first conductor, and has a region overlapping with the second conductor. The second transistor includes a third gate electrode, a third gate insulator over the third gate electrode, a fourth oxide over the third gate insulator, a third conductor and a fourth conductor over the fourth oxide, a fifth oxide covering the fourth oxide, the third conductor, and the fourth conductor, a fourth gate insulator over the fifth oxide, and a fourth gate electrode over the fourth gate insulator.

In the above embodiment, the following structure may be employed: at one end portion of the first conductor, a side surface of the first conductor is not aligned with a side surface of the first oxide to form a step-like shape; at one end portion of the second conductor, a side surface of the second conductor is not aligned with a side surface of the second oxide; a distance between the first conductor and the second conductor is longer than a distance between the first oxide and the second oxide; at the other end portion of the first conductor, a side surface of the first conductor is aligned with a side surface of the first oxide; and at the other end portion of the second conductor, a side surface of the second conductor is aligned with a side surface of the second oxide.

In any of the above embodiments, the first to fifth oxides may include a metal oxide.

In any of the above embodiments, the first gate electrode and the second conductor may be electrically connected to each other.

In any of the above embodiments, the first gate electrode, the second conductor, and the second gate electrode may be electrically connected to one another.

In any of the above embodiments, a region in the third oxide on the first conductor side which does not overlap with the second gate electrode may be larger than a region in the third oxide which overlaps with the second gate electrode.

In any of the above embodiments, the first oxide, the second oxide, and the fourth oxide may have the same composition, and the third oxide and the fifth oxide may have the same composition.

In any of the above embodiments, the third oxide may serve as a channel formation region of the first transistor, the first conductor may serve as a source electrode of the first transistor, the second conductor may serve as a drain electrode of the first transistor, the fourth oxide may serve as a channel formation region of the second transistor, the third conductor may serve as one of a source electrode and a drain electrode of the second transistor, and the fourth conductor may serve as the other of the source electrode and the drain electrode of the second transistor.

In any of the above embodiments, a threshold voltage of the first transistor may be higher than a threshold voltage of the second transistor.

One embodiment of the present invention is a semiconductor device including a first transistor and a second transistor. The first transistor includes a first gate electrode, a first gate insulator over the first gate electrode, a first oxide and a second oxide over the first gate insulator, a first conductor over the first oxide, a second conductor over the second oxide, a third oxide covering the first gate insulator, the first oxide, the first conductor, the second oxide, and the second conductor, and a second gate insulator over the third oxide. The second transistor includes a second gate electrode, a third gate insulator over the second gate electrode, a fourth oxide over the third gate insulator, a third conductor and a fourth conductor over the fourth oxide, a fifth oxide covering the fourth oxide, the third conductor, and the fourth conductor, a fourth gate insulator over the fifth oxide, and a third gate electrode over the fourth gate insulator.

In the above embodiment, the following structure may be employed: at one end portion of the first conductor, a side surface of the first conductor is not aligned with a side surface of the first oxide to form a step-like shape; at one end portion of the second conductor, a side surface of the second conductor is not aligned with a side surface of the second oxide; a distance between the first conductor and the second conductor is longer than a distance between the first oxide and the second oxide; at the other end portion of the first conductor, a side surface of the first conductor is aligned with a side surface of the first oxide; and at the other end portion of the second conductor, a side surface of the second conductor is aligned with a side surface of the second oxide.

In any of the above embodiments, the first to fifth oxides may include a metal oxide.

In any of the above embodiments, the first gate electrode and the second conductor may be electrically connected to each other.

In any of the above embodiments, the first oxide, the second oxide, and the fourth oxide may have the same composition, and the third oxide and the fifth oxide may have the same composition.

In any of the above embodiments, the third oxide may serve as a channel formation region of the first transistor, the first conductor may serve as a source electrode of the first transistor, the second conductor may serve as a drain electrode of the first transistor, the fourth oxide may serve as a channel formation region of the second transistor, the third conductor may serve as one of a source electrode and a drain electrode of the second transistor, and the fourth conductor may serve as the other of the source electrode and the drain electrode of the second transistor.

In any of the above embodiments, a threshold voltage of the first transistor may be higher than a threshold voltage of the second transistor.

One embodiment of the present invention can provide a semiconductor device having favorable electrical characteristics. One embodiment of the present invention can provide a semiconductor device having high reliability. One embodiment of the present invention can provide a semiconductor device that can be miniaturized or highly integrated. One embodiment of the present invention can provide a semiconductor device that can be manufactured with high productivity.

One embodiment of the present invention can provide a semiconductor device capable of retaining data for a long time. One embodiment of the present invention can provide a semiconductor device capable of high-speed data writing. One embodiment of the present invention can provide a semiconductor device with high design flexibility. One embodiment of the present invention can provide a low-power semiconductor device. One embodiment of the present invention can provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

BRIEF DESCRIPTION OF THE DRAWINGS

FIGS. 2A to 2C are a top view and cross-sectional views illustrating a structure of a transistor of one embodiment of the present invention.

FIGS. 3A to 3C are a top view and cross-sectional views illustrating a structure of a transistor of one embodiment of the present invention.

FIGS. 4A to 4C are a top view and cross-sectional views illustrating a structure of a transistor of one embodiment of the present invention.

FIGS. 5A to 5C are a top view and cross-sectional views illustrating a structure of a transistor of one embodiment of the present invention.

FIGS. 7A to 7C are a top view and cross-sectional views illustrating a structure of a transistor of one embodiment of the present invention.

FIGS. 8A to 8C are a top view and cross-sectional views illustrating a structure of a transistor of one embodiment of the present invention.

FIGS. 9A to 9C are a top view and cross-sectional views illustrating a structure of a transistor of one embodiment of the present invention.

FIGS. 16A to 16D illustrate a method for manufacturing a transistor of one embodiment of the present invention.

FIGS. 17A to 17D illustrate a method for manufacturing a transistor of one embodiment of the present invention.

FIGS. 18A to 18D illustrate a method for manufacturing a transistor of one embodiment of the present invention.

FIGS. 19A to 19D illustrate a method for manufacturing a transistor of one embodiment of the present invention.

FIGS. 20A to 20D illustrate a method for manufacturing a transistor of one embodiment of the present invention.

FIGS. 21A to 21D illustrate a method for manufacturing a transistor of one embodiment of the present invention.

FIGS. 23A to 23D illustrate a method for manufacturing a transistor of one embodiment of the present invention.

FIGS. 26A and 26B are circuit diagrams each illustrating a memory device of one embodiment of the present invention.

DETAILED DESCRIPTION OF THE INVENTION

Figure 1A:
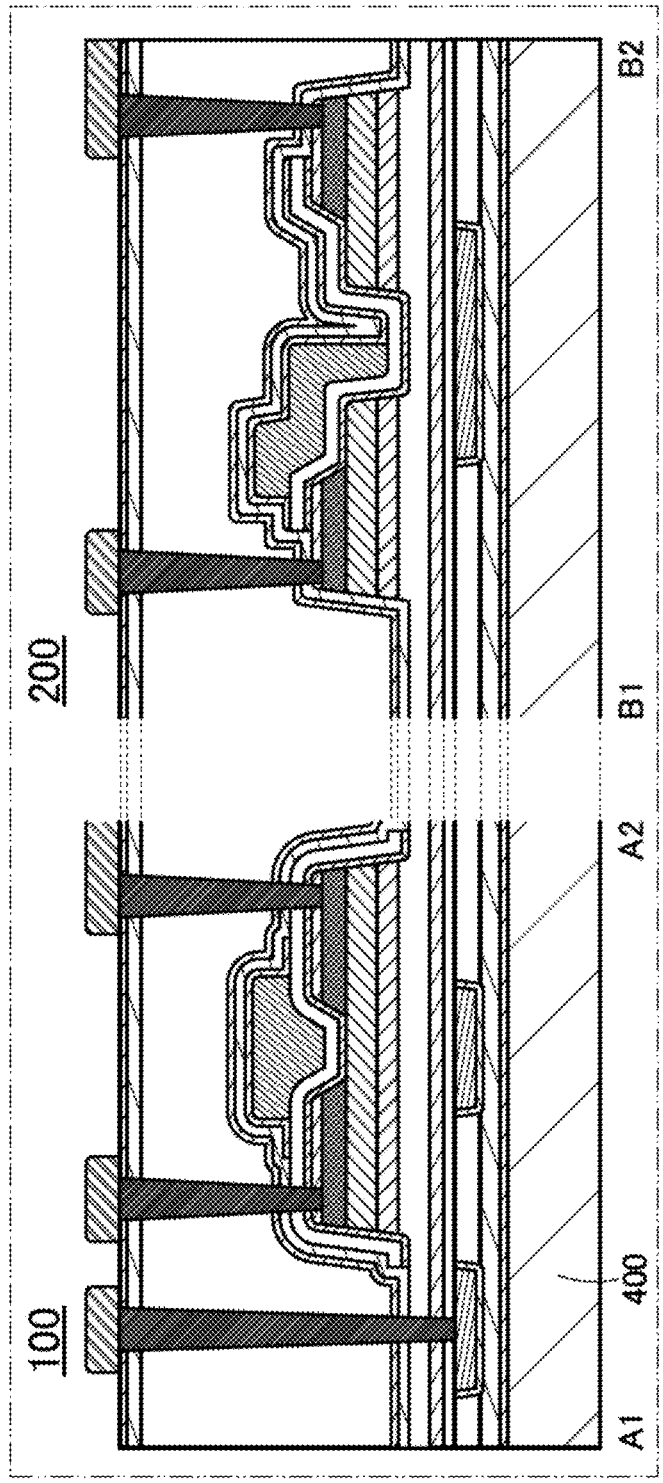
FIG. 1A is a cross-sectional view of transistors of embodiments of the present invention and FIGS. 1B and 1C show electrical characteristics of the transistors.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification and the like, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region where a channel of a transistor is formed and through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

Note that the channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, transistors described in this specification and the like are n-channel transistors. Thus, unless otherwise specified, the threshold voltage (also referred to as "Vth") is higher than 0 V.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor or merely called an oxide in some cases. That is to say, a metal oxide that has at least one of an amplifying function, a rectifying function, and a switching function can be called a metal oxide semiconductor, or OS for short. In addition, an OS FET or an OS transistor is a transistor including a metal oxide, an oxide semiconductor, or an oxide.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, CAC-OS or CAC metal oxide can be called a matrix composite or a metal matrix composite.

Embodiment 1

Providing transistors having different electrical characteristics over the same layer can increase the design flexibility of a semiconductor device and the integration degree in the semiconductor device. In this embodiment, an example of an embodiment where transistors having different electrical characteristics are provided over the same layer is described.
<Structure Example of Semiconductor Device 1000>

FIG. 1A is a cross-sectional view of a semiconductor device 1000. The semiconductor device 1000 includes a transistor 100 and a transistor 200. The transistors 100 and 200 have different structures. FIG. 1A illustrates cross sections of the transistors 100 and 200 over a substrate 400. FIG. 1A corresponds to a cross-sectional view taken along dashed-dotted line A1-A2 in FIG. 2A and dashed-dotted line B1-B2 in FIG. 3A.

Figure 1B:
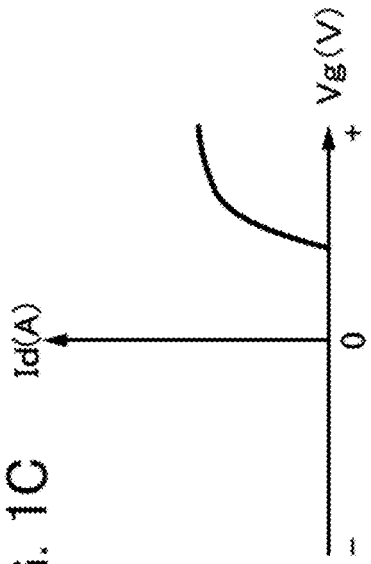
Figure 1C:
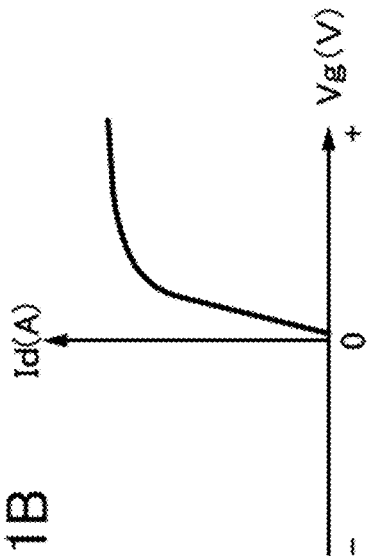

Although not illustrated in FIGS. 1A to 1C, the transistor 100 and the transistor 200 are electrically connected to each other. Specifically, a back gate of the transistor 100 and a drain of the transistor 200 are electrically connected to each other. The drain of the transistor 200 is electrically connected to a gate and a back gate of the transistor 200. That is, the drain, the gate, and the back gate of the transistor 200 are electrically connected to one another.

Note that in each of the transistor 100 and the transistor 200, the gate is positioned over the back gate.

FIG. 2A is a top view of the transistor 100. FIG. 2B is a cross-sectional view taken along dashed-dotted line A1-A2 in FIG. 2A. FIG. 2C is a cross-sectional view taken along dashed-dotted line A3-A4 in FIG. 2A. In FIG. 2B, the cross-sectional view along A1-A2 is taken in the channel length direction of the transistor 100. In FIG. 2C, the cross-sectional view along A3-A4 is taken in the channel width direction of the transistor 100. For simplification of the drawing, some components are not illustrated in the top view in FIG. 2A.

FIG. 3A is a top view of the transistor 200. FIG. 3B is a cross-sectional view taken along dashed-dotted line B1-B2 in FIG. 3A. FIG. 3C is a cross-sectional view taken along dashed-dotted line B3-B4 in FIG. 3A. In FIG. 3B, the cross-sectional view along B1-B2 is taken in the channel length direction of the transistor 200. In FIG. 3C, the cross-sectional view along B3-B4 is taken in the channel width direction of the transistor 200. For simplification of the drawing, some components are not illustrated in the top view in FIG. 3A.

As illustrated in FIG. 1A and FIGS. 3A and 3B, in one embodiment of the present invention, the gate electrode of the transistor 200 has a region overlapping with one of a source electrode and a drain electrode and does not have a region overlapping with the other of the source electrode and the drain electrode. In the semiconductor device 1000, one of the source electrode and the drain electrode of the transistor 200 which has a region overlapping with the gate electrode is referred to as a drain electrode side, the other which does not have a region overlapping with the gate electrode is referred to as a source electrode side, and the transistor 200 is preferably electrically connected to the transistor 100 as described above.

Although the details are described later, Vth of the transistor 100 needs to be sufficiently shifted in the positive direction in order to operate the semiconductor device 1000. Therefore, a certain negative potential needs to be applied to the back gate of the transistor 100.

As described above, the drain, the gate, and the back gate of transistor 200 are electrically connected to the back gate of the transistor 100. Therefore, a negative potential is applied to the back gate of the transistor 100 through the transistor 200 by application of the negative potential to the source of the transistor 200.

That is, in order to operate the semiconductor device 1000, a certain negative potential or higher is applied to the source of the transistor 200. For this reason, the transistor 200 is required to withstand the negative potential from the source of the transistor 200 (for example, a gate insulator has a resistance to an applied electric field and does not cause a breakdown).

With respect to this, since the source electrode of the transistor 200 does not have the region overlapping with the gate electrode as described above, when a high negative potential is applied to the source electrode of the transistor 200 in the time of data retention operation of the semiconductor device 1000, a breakdown of the gate insulator of the transistor 200 can be greatly suppressed.

In addition, it is more effective for preventing the breakdown that the region that does not overlap with the gate electrode (on the source electrode side) in the channel formation region of the transistor 200 is larger than the region that overlaps with the gate electrode (on the drain electrode side) in the channel formation region of the transistor 200.

In order to prevent the breakdown, it is also effective that the transistor 200 does not have the gate and channel formation is performed only by the back gate.

As illustrated in FIGS. 1A to 1C, FIGS. 2A and 2B, and FIGS. 3A and 3B, the transistor 100 and the transistor 200 differ in oxides which function as channel formation regions and in shapes of the source electrodes and the drain electrodes.

In the transistor 200, as illustrated in FIG. 1A and FIG. 3B, the source region and the drain region formed of an oxide are separated with the gate electrode positioned therebetween, and the source electrode and the drain electrode are formed over the source region and the drain region. An end portion of the source region facing to the drain region is not aligned with an end portion of the source electrode facing to the drain electrode. An end portion of the drain region facing to the source region is not aligned with an end portion of the drain electrode facing to the source electrode. The distance between the source electrode and the drain electrode is longer than the distance between the source region and the drain region. An oxide having a function of the channel formation region is positioned to cover the source region, the drain region, the source electrode, and the drain electrode. This structure improves the coverage of the source electrode and the drain electrode with the oxide having a function of the channel formation region; accordingly, the transistor 200 can have favorable electrical characteristics and little variation.

As illustrated in FIGS. 1A to 1C to FIGS. 3A to 3C, different semiconductor materials are used for the channel formation regions of the transistor 100 and the transistor 200. For this reason, the transistor 100 and the transistor 200 have different electrical characteristics as described later.

FIGS. 1B and 1C each show an example of a Vg-Id curve, which is one of the electrical characteristics of a transistor. In FIGS. 1B and 1C showing the Vg-Id curves, the horizontal axis represents a voltage (Vg) between a gate and a source of a transistor. Furthermore, the vertical axis represents current flowing to a drain (Id) of the transistor on a logarithmic scale.

The transistors 100 and 200 are each a transistor including a back gate. FIG. 1B shows the Vg-Id curve of the transistor 100 when the potential of the back gate is set to the same as that of the source. FIG. 1C shows the Vg-Id curve of the transistor 200 when the potential of the back gate is set to the same as that of the source. As shown in FIGS. 1B and 1C, the transistors 100 and 200 have different transistor characteristics. The Vg-Id curve of the transistor 200 is shifted in the positive direction compared with the Vg-Id curve of the transistor 100. In other words, the transistor 200 has higher Vth than the transistor 100.

Note that Vth of each of the transistors 100 and 200 in which an oxide semiconductor is formed for the channel formation region is further shifted in the positive direction compared with the case where Si or the like is used; accordingly, off-state current can be significantly reduced.

Since the transistor 100 and the transistor 200 with different electrical characteristics in the semiconductor device 1000 are electrically connected to each other as described above, the transistor 200 can have high reliability and the semiconductor device 1000 can achieve long-time data retention.

<Transistor Structure 1>

Structures of the transistor 100 of one embodiment of the present invention will be described below.

In FIGS. 2B and 2C, the transistor 100 is disposed over an insulator 401b over the substrate 400. Note that the insulator 401b is provided over the substrate 400 with an insulator 401a positioned therebetween. The transistor 100 includes a conductor 309a; a conductor 310a; a conductor 309b; and a conductor 310b; an insulator 302 over the conductor 309a, the conductor 310a, the conductor 309b, the conductor 310b, and an insulator 301; an insulator 303 over the insulator 302; an insulator 402 over the insulator 303; an oxide 406_1a over the insulator 402; an oxide 406_2a over the oxide 406_1a; a conductor 416a1 and a conductor 416a2 which are in contact with a top surface of the oxide 406_2a; an oxide 406_3a which is in contact with a side surface of the conductor 416a1, a side surface of the conductor 416a2, and a top surface of the oxide 406_2a; an insulator 412a over the oxide 406_3a; and a conductor 404a having a region overlapping with the oxide 406_3a with the insulator 412a positioned therebetween. Note that the conductor 309a, the conductor 310a, the conductor 309b, and the conductor 310b are formed in openings of the insulator 301.

Furthermore, a barrier film 417a1, a barrier film 417a2, an insulator 408a, an insulator 422, an insulator 424, an insulator 410, an insulator 415, and an insulator 418 are provided over the transistor 100.

A first opening that reaches the conductor 310b is formed in the insulator 418, the insulator 415, the insulator 410, the insulator 424, the insulator 422, the insulator 402, the insulator 303, and the insulator 302. A second opening that reaches the conductor 416a1 is formed in the insulator 418, the insulator 415, the insulator 410, the insulator 424, the insulator 422, the insulator 412a, the oxide 406_3a, and the barrier film 417a1. A third opening that reaches the conductor 416a2 is formed in the insulator 418, the insulator 415, the insulator 410, the insulator 424, the insulator 422, the insulator 412a, the oxide 406_3a, and the barrier film 417a2. A fourth opening that reaches the conductor 404a is formed in the insulator 418, the insulator 415, the insulator 410, the insulator 424, the insulator 422, and the insulator 408a. The semiconductor device 1000 including the transistor 100 includes a conductor 433a, a conductor 431a, a conductor 429a, and a conductor 437a which are respectively embedded in the first opening, the second opening, the third opening, and the fourth opening; a conductor 434a which is over the insulator 418 and has a region in contact with the conductor 433a; a conductor 432a which is over the insulator 418 and has a region in contact with the conductor 431a; a conductor 430a which is over the insulator 418 and has a region in contact with the conductor 429a; and a conductor 438a which is over the insulator 418 and has a region in contact with the conductor 437a.

The conductor 404a functions as a first gate electrode in the transistor 100. Furthermore, the conductor 404a can have a stacked structure including a conductor that has a function of inhibiting penetration of oxygen. For example, when the conductor that has a function of inhibiting penetration of oxygen is formed under the conductor 404a, an increase in the electric resistivity due to oxidation of the conductor 404a can be suppressed. The insulator 412a functions as a first gate insulator.

The conductors 416a1 and 416a2 function as a source electrode and a drain electrode. The conductors 416a1 and 416a2 each can have a stacked structure including a conductor that has a function of inhibiting penetration of oxygen. For example, when the conductor that has a function of inhibiting penetration of oxygen is formed over the conductor 416a1 and the conductor 416a2, an increase in the electric resistivity due to oxidation of the conductors 416a1 and 416a2 can be suppressed. Note that the electric resistivities of the conductors can be measured by a two-terminal method or the like.

The barrier films 417a1 and 417a2 each have a function of inhibiting penetration of oxygen and impurities such as hydrogen and water. The barrier film 417a1 is positioned over the conductor 416a1 and suppresses the diffusion of oxygen from above the barrier film 417a1 into the conductor 416a1. The barrier film 417a2 is positioned over the conductor 416a2 and suppresses the diffusion of oxygen from above the barrier film 417a2 into the conductor 416a2.

In the transistor 100, the resistance of the oxide 406_2a can be controlled by a potential applied to the conductor 404a. That is, conduction or non-conduction between the conductors 416a1 and 416a2 can be controlled by the potential applied to the conductor 404a.

As illustrated in FIGS. 2B and 2C, the top surface of the oxide 406_2a is in contact with the conductors 416a1 and 416a2. At least the oxide 406_2a can be electrically surrounded by an electric field of the conductor 404a functioning as the first gate electrode. A transistor structure in which a channel formation region is electrically surrounded by an electric field of a first gate electrode is referred to as a surrounded channel (s-channel) structure. Therefore, a channel is formed in the entire oxide 406_2a in some cases. In the s-channel structure, a large amount of current can flow between a source and a drain of the transistor, so that a current in an on state (on-state current) can be increased. In addition, since at least the oxide 406_2a is electrically surrounded by the electric field of the conductor 404a, a current in an off state (off-state current) can be reduced.

In the transistor 100, the conductor 404a functioning as the first gate electrode partly overlaps with each of the conductors 416a1 and 416a2 functioning as a source electrode and a drain electrode, whereby parasitic capacitance between the conductor 404a and the conductor 416a1 and parasitic capacitance between the conductor 404a and the conductor 416a2 are formed.

Since the transistor 100 includes the barrier film 417a1 as well as the insulator 412a and the oxide 406_3a between the conductor 404a and the conductor 416a1, the parasitic capacitance can be reduced. Similarly, the transistor 100 includes the barrier film 417a2 as well as the insulator 412a and the oxide 406_3a between the conductor 404a and the conductor 416a2, allowing a reduction in the parasitic capacitance. Thus, the transistor 100 has excellent frequency characteristics.

Furthermore, the above-described structure of the transistor 100 allows a reduction or prevention of generation of a leakage current between the conductor 404a and each of the conductors 416a1 and 416a2 when the transistor 100 operates, for example, when a potential difference is generated between the conductor 404a and each of the conductors 416a1 and 416a2.

The conductors 309a and 310a function as a second gate electrode. The conductor 309a functions as a conductive barrier film. Since the conductor 309a is provided so as to cover a bottom surface and side surfaces of the conductor 310a, oxidation of the conductor 310a can be suppressed.

The insulators 302, 303, and 402 function as a second gate insulator. The threshold voltage of the transistor 100 can be controlled by a potential applied to the conductors 309a and 310a. The first gate and the second gate are electrically connected to each other, whereby a large on-state current can be obtained. Note that the function of the first gate and that of the second gate may be interchanged.

The conductors 309b and 310b function as a wiring. The conductor 309b functions as a conductive barrier film. Since the conductor 309b is provided so as to cover a bottom surface and side surfaces of the conductor 310b, oxidation of the conductor 310b can be suppressed.

The structure of the transistor 200 which has different electrical characteristics from the transistor 100 will be described below.

In FIGS. 3B and 3C, the transistor 200 is disposed over an insulator 401b over the substrate 400. Note that the insulator 401b is provided over the substrate 400 with the insulator 401a positioned therebetween. The transistor 200 includes a conductor 309c and a conductor 310c; the insulator 302 over the conductor 309c, the conductor 310c, and the insulator 301; the insulator 303 over the insulator 302; the insulator 402 over the insulator 303; an oxide 406_1b and an oxide 406_1c over the insulator 402; an oxide 406_2b over the oxide 406_1b; an oxide 406_2c over the oxide 406_1c; a conductor 416b1 having a region in contact with a top surface of the oxide 406_2b; a conductor 416b2 having a region in contact with a top surface of the oxide 406_2c; an oxide 406_3b having regions in contact with a side surface of the conductor 416b1, a side surface of the conductor 416b2, a top surface and a side surface of the oxide 406_2b, a top surface and a side surface of the oxide 406_2c, a side surface of the oxide 406_1b, a side surface of the oxide 406_1c, and a top surface of the insulator 402; an insulator 412b over the oxide 406_3b; and a conductor 404b over the insulator 412b. Note that the conductor 309c and the conductor 310c are formed in an opening of the insulator 301.

Furthermore, a barrier film 417b1, a barrier film 417b2, an insulator 408b, the insulator 422, the insulator 424, the insulator 410, the insulator 415, and the insulator 418 are provided over the transistor 200.

A fifth opening that reaches the conductor 416b1 is formed in the insulator 418, the insulator 415, the insulator 410, the insulator 424, the insulator 422, and the barrier film 417b1. A sixth opening that reaches the conductor 416b2 is formed in the insulator 418, the insulator 415, the insulator 410, the insulator 424, the insulator 422, and the barrier film 417b2. A seventh opening that reaches the conductor 404b is formed in the insulator 418, the insulator 415, the insulator 410, the insulator 424, the insulator 422, and the insulator 408b. The semiconductor device 1000 including the transistor 200 includes a conductor 431b, a conductor 429b, and a conductor 437b which are respectively embedded in the fifth opening, the sixth opening, and the seventh opening; a conductor 432b which is over the insulator 418 and has a region in contact with the conductor 431b; a conductor 430b which is over the insulator 418 and has a region in contact with the conductor 429b; and a conductor 438b which is over the insulator 418 and has a region in contact with the conductor 437b.

The conductor 404b functions as a first gate electrode in the transistor 200. Furthermore, the conductor 404b can have a stacked structure including a conductor that has a function of inhibiting penetration of oxygen. For example, when the conductor that has a function of inhibiting penetration of oxygen is formed under the conductor 404b, an increase in the electric resistivity due to oxidation of the conductor 404b can be suppressed. The insulator 412b functions as a first gate insulator.

The conductors 416b1 and 416b2 function as a drain electrode and a source electrode, respectively. The conductors 416b1 and 416b2 each can have a stacked structure including a conductor that has a function of inhibiting penetration of oxygen. For example, when the conductor that has a function of inhibiting penetration of oxygen is formed over the conductors 416b1 and 416b2, an increase in the electric resistivity due to oxidation of the conductors 416b1 and 416b2 can be suppressed. Note that the electric resistivities of the conductors can be measured by a two-terminal method or the like.

The barrier films 417b1 and 417b2 each have a function of inhibiting penetration of oxygen and impurities such as hydrogen. The barrier film 417b1 is positioned over the conductor 416b1 and suppresses the diffusion of oxygen from above the barrier film 417b1 into the conductor 416b1. The barrier film 417b2 is positioned over the conductor 416b2 and suppresses the diffusion of oxygen from above the barrier film 417b2 into the conductor 416b2.

As illustrated in FIG. 3B, in the transistor 200, a layer including the oxide 406_1b, the oxide 406_2b, and the conductor 416b1 and a layer including the oxide 406_1c, the oxide 406_2c, and the conductor 416b2 are disposed with a region where part of a top surface of the insulator 402 and the oxide 406_3b are in contact with each other positioned therebetween. Here, a side surface of the layer including the oxide 406_1b, the oxide 406_2b, and the conductor 416b1 and a side surface of the layer including the oxide 406_1c, the oxide 406_2c, and the conductor 416b2, which face each other, are each called one side surface, and each of side surfaces of the layers, which do not face each other, is called the other side surface.

The oxide 406_3b is disposed to cover one side surface of the conductor 416b1, one side surface of the conductor 416b2, part of a top surface of the oxide 406_2b and one side surface of the oxide 406_2b, part of a top surface of the oxide 406_2c and one side surface of the oxide 406_2c, one side surface of the oxide 406_1b, one side surface of the oxide 406_1c, and part of a top surface of the insulator 402. That is, the one side surface of the oxide 406_1b and the one side surface of the oxide 406_2b are not aligned with the one side surface of the conductor 416b1. Similarly, the one side surface of the oxide 406_1c and the one side surface of the oxide 406_2c are not aligned with the one side surface of the conductor 416b2. The distance between the conductor 416b1 and the conductor 416b2 is longer than the distance between the oxides 406_1b and 406_2b and the oxides 406_1c and 406_2c. The other side surface of the oxide 406_1b, the other side surface of the oxide 406_2b, and the other side surface of the conductor 416b1 are aligned. The other side surface of the oxide 406_1c, the other side surface of the oxide 406_2c, and the other side surface of the conductor 416b2 are aligned. This structure of the transistor 200 improves the coverage of the conductor 416b1 and the conductor 416b2 with the oxide 406_3b; thus, the transistor 200 can have favorable electrical characteristics and little variation.

The conductor 404b has a region overlapping with the conductor 416b1 and does not have a region overlapping with the conductor 416b2. This structure can reduce the intensity of an electric field applied to the insulator 412b when a potential is applied to the conductor 416b2 as compared with the structure in which the conductor 404b has both the region overlapping with the conductor 416b1 and the region overlapping with the conductor 416b2. Accordingly, even when a high potential is applied to the conductor 416b2 having a function of a source electrode, a breakdown of the insulator 412b having a function of the first gate insulator can be prevented. Thus, the transistor 200 has high reliability.

Note that the loner the distance between the conductor 404b and the conductor 416b2 in the channel length direction is, the stronger the above-described effect of preventing a breakdown of the insulator 412b becomes. Specifically, the distance between the conductor 404b and the conductor 416b2 in the channel length direction is preferably a half or more of the distance between the conductor 416b1 and the conductor 416b2 in the channel length direction.

In the transistor 200, the conductor 404b functioning as the first gate electrode partly overlaps with the conductor 416b1 functioning as a drain electrode, whereby parasitic capacitance between the conductor 404b and the conductor 416b1 is formed.

Since the transistor 200 includes the barrier film 417b1 as well as the insulator 412b and the oxide 406_3b between the conductor 404b and the conductor 416b1, the parasitic capacitance can be reduced. Thus, the transistor 200 has frequency characteristics better than those of a transistor without the barrier film 417b1.

Furthermore, the above structure of the transistor 200 allows a reduction or prevention of generation of a leakage current between the conductor 404b and the conductor 416b1 when the transistor 200 operates, for example, when a potential difference is generated between the conductor 404b and the conductor 416b1.

The conductors 309c and 310c function as a second gate electrode. The conductor 309c functions as a conductive barrier film. Since the conductor 309c is provided so as to cover a bottom surface and side surfaces of the conductor 310c, oxidation of the conductor 310c can be suppressed.

In the transistor 200, a channel is formed in the oxide 406_3b when a potential is applied to the conductors 309c and 310c having a function of the second gate electrode. In the transistor 100, a channel is formed in the oxide 406_2a. Thus, the transistor 200 and the transistor 100 have different characteristics. Specifically, the transistor 200 has a larger Vth and a smaller off-state current than the transistor 100.

<Components of Semiconductor Device 1000>

Components that can be used in the semiconductor device 1000 which is one embodiment of the present invention and includes the transistor 100 and the transistor 200 will be described in detail below.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate formed of silicon or germanium, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μl m and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the substrate 400 that is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

The transistor is surrounded by an insulator that has a function of inhibiting penetration of oxygen and impurities such as hydrogen, whereby the transistor can have stable electrical characteristics. For example, an insulator with a function of inhibiting penetration of oxygen and impurities such as hydrogen may be used as each of the insulators 401a, 401b, 408a, 408b, and 415.

An insulator with a function of inhibiting penetration of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401a, 401b, 408a, 408b, 415, 418, 422, and 424 may be each formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401a, 401b, 408a, 408b, 415, 418, 422, and 424 each preferably include aluminum oxide.

For example, when the insulator 422 is formed using plasma including oxygen, oxygen can be added to the insulator 402 serving as a base layer. The added oxygen serves as excess oxygen in the insulator 402, and is supplied from the insulator 402 to the oxides 406_1a, 406_2a, 406_3a, and 406_3b by heat treatment or the like, so that oxygen vacancies in the oxides 406_1a, 406_2a, 406_3a, and 406_3b can be filled.

For example, when the insulator 415 is formed using plasma including oxygen, oxygen can be added to the insulator 410. The added oxygen serves as excess oxygen in the insulator 410, and is added from the insulator 410 to the oxides 406_1a, 406_2a, 406_3a, and 406_3b through the insulators 424, 422, and 402 by heat treatment or the like, so that oxygen vacancies in the oxides 406_1a, 406_2a, 406_3a, and 406_3b can be filled.

Furthermore, when the insulators 303, 401a, 408a, 408b, 424, and 418 include aluminum oxide, outward diffusion of the excess oxygen added to the oxides 406_1a, 406_2a, 406_3a, and 406_3b can be reduced.

The insulators 301, 302, 402, 412a, and 412b can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, 412a, and 412b preferably contain silicon oxide or silicon oxynitride.

In particular, the insulators 402, 412a, and 412b preferably include an insulator with high relative permittivity. For example, the insulators 402, 412a, and 412b each preferably contain gallium oxide, hafnium oxide, oxide containing aluminum and hafnium, oxynitride containing aluminum and hafnium, oxide containing silicon and hafnium, or oxynitride containing silicon and hafnium. Alternatively, the insulators 402, 412a, and 412b each preferably have a stacked-layer structure of silicon oxide or silicon oxynitride and an insulator with high relative permittivity. Because silicon oxide and silicon oxynitride have thermal stability, combination of silicon oxide or silicon oxynitride with an insulator with high relative permittivity allows the stacked-layer structure to be thermally stable and have high relative permittivity. For example, in the case where the insulator 412a has a stacked structure of an insulator with high relative permittivity, such as aluminum oxide, gallium oxide, or hafnium oxide, and silicon oxide or silicon oxynitride, the insulator with high relative permittivity is provided on the oxide 406_3a side, in which case silicon contained in the silicon oxide or the silicon oxynitride can be prevented from entering the oxide 406_2a through the insulator with high relative permittivity and the oxide 406_3a. In addition, for example, when the silicon oxide or the silicon oxynitride is provided on the oxide 406_3a side, trap centers might be formed at an interface between the insulator with high relative permittivity and the silicon oxide or the silicon oxynitride. The trap centers can shift the threshold voltage of the transistor in the positive direction by trapping electrons in some cases.

The insulator 410 preferably includes an insulator with low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An insulator with a function of inhibiting penetration of oxygen and impurities such as hydrogen may be used as each of the barrier films 417a1, 417a2, 417b1, and 417b2. The barrier films 417a1, 417a2, 417b1, and 417b2 can prevent excess oxygen included in the insulator 410 from diffusing to the conductors 416a1, 416a2, 416b1, and 416b2.

The barrier films 417a1, 417a2, 417b1, and 417b2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barrier films 417a1, 417a2, 417b1, and 417b2 preferably include silicon nitride.

<Conductor>

The conductors 404a, 404b, 309a, 309b, 309c, 310a, 310b, 310c, 416a1, 416a2, 416b1, 416b2, 429a, 429b, 431a, 431b, 433a, 437a, 437b, 430a, 430b, 432a, 432b, 434a, 438a, and 438b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With any of such materials, hydrogen contained in the oxides 406_1a, 406_2a, 406_3a, and 406_3b can be captured in some cases. Alternatively, hydrogen entering the oxides 406_1a, 406_2a, 406_3a, and 406_3b from an external insulator can be captured in some cases.

A stack of a plurality of conductive layers formed with the above materials may be used. For example, a stacked-layer structure formed using a combination of a material containing any of the metal elements listed above and a conductive material containing oxygen may be used. Alternatively, a stacked-layer structure formed using a combination of a material containing any of the metal elements listed above and a conductive material containing nitrogen may be used. Alternatively, a stacked-layer structure formed using a combination of a material containing any of the metal elements listed above, a conductive material containing oxygen, and a conductive material containing nitrogen may be used.

When an oxide semiconductor is used for the channel formation region of the transistor, a stacked-layer structure formed using a material containing the above-described metal element and a conductive material containing oxygen is preferably used for the first gate electrode or the second gate electrode. In that case, the conductive material containing oxygen is preferably formed on the channel formation region side. When the conductive material containing oxygen is formed on the channel formation region side, oxygen released from the conductive material is easily supplied to the channel formation region.

The conductors 429a, 429b, 431a, 431b, 433a, 437a, and 437b may be formed using, for example, a conductive material with high embeddability, such as tungsten or polysilicon. A conductive material with high embeddability and a conductive barrier film such as a titanium layer, a titanium nitride layer, or a tantalum nitride layer may be used in combination.

<Oxide>

As the oxides 406_1a, 406_2a, 406_3a, and 406_3b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

An oxide that can be used as the oxides 406_1a, 406_2a, 406_3a, 406_3b, and the like is described.

The oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the oxide is InMZnO containing indium, an element M, and zinc is considered. The element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

Oxides are classified into a single crystal oxide and a non-single-crystal oxide. Examples of a non-single-crystal oxide include a c-axis-aligned crystalline oxide semiconductor (CAAC-OS), a polycrystalline oxide, a nanocrystalline oxide semiconductor (nc-OS), an amorphous-like oxide semiconductor (a-like OS), and an amorphous oxide.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (InN,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide, depending on an analysis method.

The a-like OS has a structure between those of the nc-OS and the amorphous oxide. The a-like OS has a void or a low-density region. That is, the a-like OS has low crystallinity as compared with the nc-OS and the CAAC-OS.

An oxide can have various structures which show various different properties. Two or more of the amorphous oxide, the polycrystalline oxide, the a-like OS, the nc-OS, and the CAAC-OS may be included in an oxide of one embodiment of the present invention.

<Atomic Ratio>

Next, preferred ranges of the atomic ratio of indium, the element M, and zinc contained in an oxide according to the present invention are described with reference to FIGS. 14A to 14C. Note that the proportion of oxygen atoms is not shown in FIGS. 14A to 14C. The terms of the atomic ratio of indium, the element M, and zinc contained in the oxide are denoted by [In], [M], and [Zn], respectively.

Figure 14A:
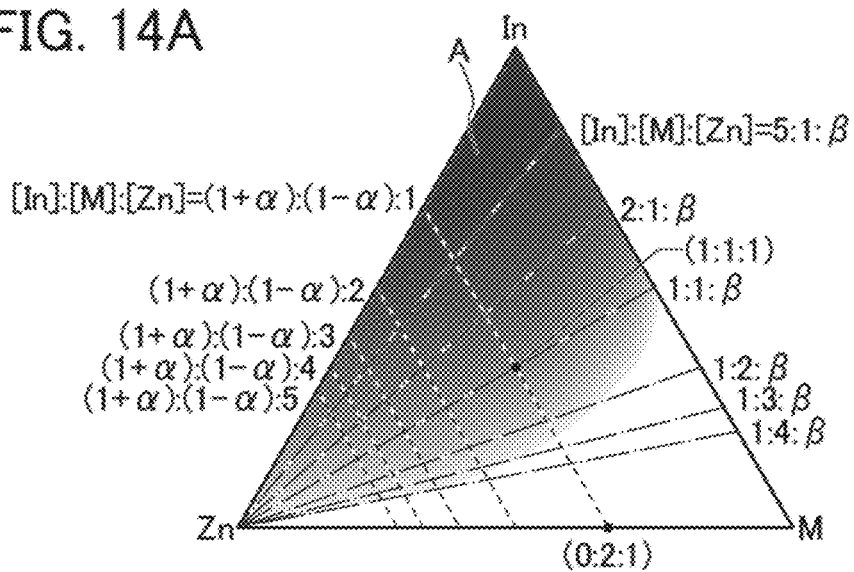
FIGS. 14A to 14C each illustrate an atomic ratio range of an oxide.
Figure 14B:
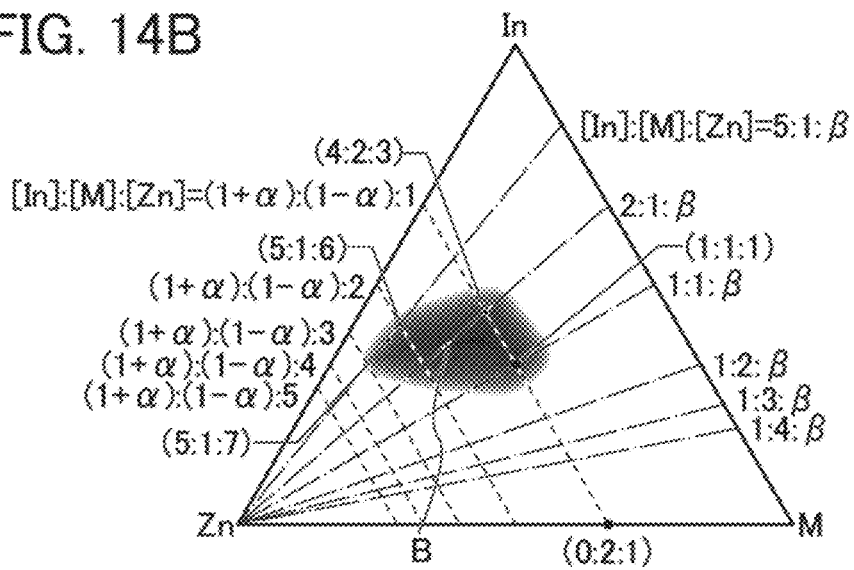
Figure 14C:
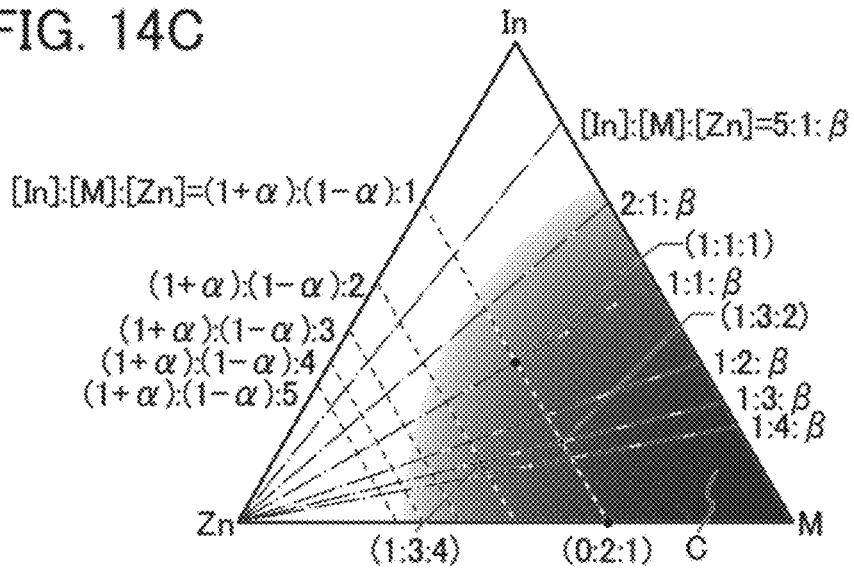

In FIGS. 14A to 14C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

An oxide with the atomic ratio [In]:[M]:[Zn] of 0:2:1 or around 0:2:1 in FIGS. 14A to 14C tends to have a spinel crystal structure.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

A region A in FIG. 14A shows an example of the preferred ranges of the atomic ratio of indium, the element M, and zinc contained in an oxide.

An oxide having a high content of indium can have high carrier mobility (electron mobility). Thus, an oxide having a high content of indium has higher carrier mobility than an oxide having a low content of indium.

In contrast, carrier mobility decreases as the indium content and the zinc content in an oxide become lower. Thus, with an atomic ratio of [In]:[M]:[Zn]=0:1:0 or around 0:1:0 (e.g., a region C in FIG. 14C), insulation performance becomes better.

Accordingly, an oxide of one embodiment of the present invention preferably has an atomic ratio represented by the region A in FIG. 14A. With the atomic ratio, a layered structure with high carrier mobility and few grain boundaries is easily obtained.

In the region A, in particular a region B in FIG. 14B, an excellent oxide which easily becomes a CAAC-OS and has high carrier mobility can be obtained.

The CAAC-OS is an oxide with high crystallinity. In contrast, in the CAAC-OS, a reduction in the electron mobility due to the grain boundary is less likely to occur because a clear grain boundary is difficult to observe. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In addition, [Zn] in the film might be smaller than [Zn] in the target depending on the substrate temperature in deposition. Thus, the illustrated regions each represent an atomic ratio with which an oxide tends to have specific characteristics, and boundaries of the regions A to C are not clear.

<Composition of CAC-OS>

Described below is the composition of a cloud aligned composite OS (CAC-OS) which can be used for a transistor disclosed in one embodiment of the present invention.

The CAC-OS refers to, for example, an oxide semiconductor material with a composition in which elements are unevenly distributed in regions each having a size of greater than or equal to 0.5 nm and less than or equal to 10 nm, preferably greater than or equal to 1 nm and less than or equal to 2 nm, or a similar size. Note that in the following description of an oxide semiconductor, the state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the metal element(s) are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like may be contained.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region has a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compound has a single-crystal structure, a polycrystalline structure, or a CAAC structure. Note that the CAAC structure is a crystal structure in which a plurality of IGZO nanocrystals has c-axis alignment and is connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

It is difficult to clearly observe a boundary between the region including $GaO_{X3}$ as a main component and the region including $In_{X2}Zn_{Y2}O_{Z2}$ or $InO_{X1}$ as a main component in some cases.

In part of the composition of a CAC-OS which contains, instead of gallium, one or more metal elements selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like, nanoparticle regions including the metal element(s) as a main component(s) and nanoparticle regions including In as a main component are observed. These nanoparticle regions are randomly dispersed in a mosaic pattern.

The CAC-OS can be formed by a sputtering method under a condition that a substrate is not heated, for example. In the case of forming the CAC-OS by a sputtering method, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, a high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be reduced and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$), a high field-effect mobility (µ) and a low off-state current ($I_{off}$) can be achieved.

A semiconductor element including a CAC-OS has high reliability. Thus, the CAC-OS is suitably used in a variety of semiconductor devices typified by a display.

<Transistor including Oxide>

Next, the case where the oxide is used for a transistor will be described.

In a transistor in which the oxide is used for a channel formation region, carrier scattering or the like at a grain boundary can be reduced as compared with a transistor in which silicon or the like is used for a channel formation region; thus, the transistor can have high field-effect mobility. Moreover, the transistor can have high reliability.

An oxide with a low carrier density is preferably used for a transistor. For example, an oxide whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used for the transistor.

A highly purified intrinsic or substantially highly purified intrinsic oxide has few carrier generation sources and thus can have a low carrier density. A highly purified intrinsic or substantially highly purified intrinsic oxide has a low density of defect states and accordingly has a low density of trap states in some cases.

Charges trapped by the trap states in the oxide take a long time to be released and may behave like fixed charges. Thus, a transistor whose channel formation region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, an alkali metal, an alkaline earth metal, iron, nickel, and silicon.

<Impurity>

Here, the influence of impurities in the oxide will be described.

When silicon or carbon, which is a Group 14 element, is contained in the oxide, defect states are formed in the oxide. Thus, the concentration of silicon or carbon in the oxide and around an interface between the oxide and another layer (the concentration obtained by secondary ion mass spectrometry (SIMS)) is set lower than or equal to $2\times10^{18}$ atoms/cm$^3$, preferably lower than or equal to $2\times10^{17}$ atoms/cm$^3$.

When the oxide contains an alkali metal or an alkaline earth metal, defect states are formed in the oxide by the metal and carriers are generated in some cases. Thus, a transistor using an oxide that contains an alkali metal or an alkaline earth metal for a channel formation region is likely to have normally-on characteristics. Accordingly, it is preferable to reduce the concentration of an alkali metal or an alkaline earth metal in the oxide. Specifically, the concentration of an alkali metal or an alkaline earth metal in the oxide measured by SIMS is set lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used for a channel formation region is likely to have normally-on characteristics. For this reason, nitrogen in the oxide is preferably reduced as much as possible. For example, the nitrogen concentration in the oxide measured by SIMS is set lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor in which an oxide containing hydrogen is used for a channel formation region is likely to have normally-on characteristics. Accordingly, it is preferable that hydrogen in the oxide be reduced as much as possible. Specifically, the hydrogen concentration in the oxide measured by SIMS is set lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

When an oxide with sufficiently reduced impurity concentration is used for a channel formation region in a transistor, the transistor can have stable electrical characteristics.

<Band Diagram>

Figure 15A:
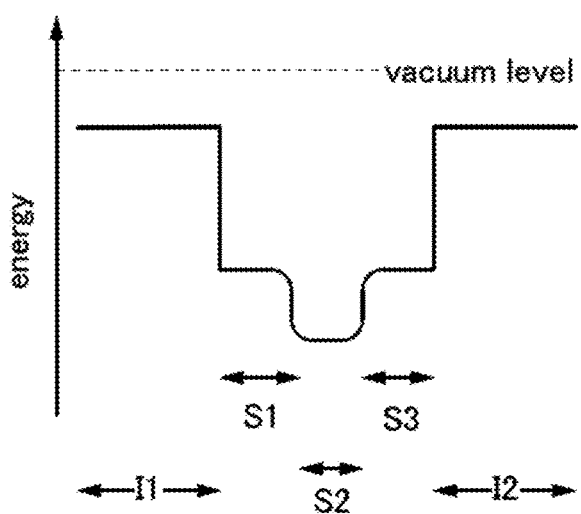
FIGS. 15A to 15C are band diagrams of stacked-layer structures of oxides.
Figure 15B:
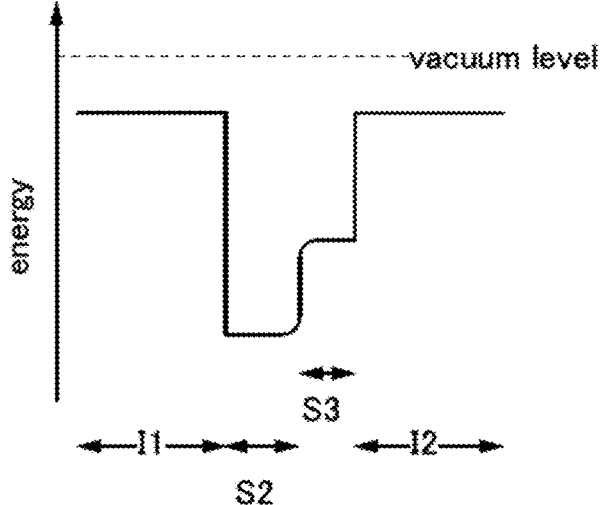
Figure 15C:
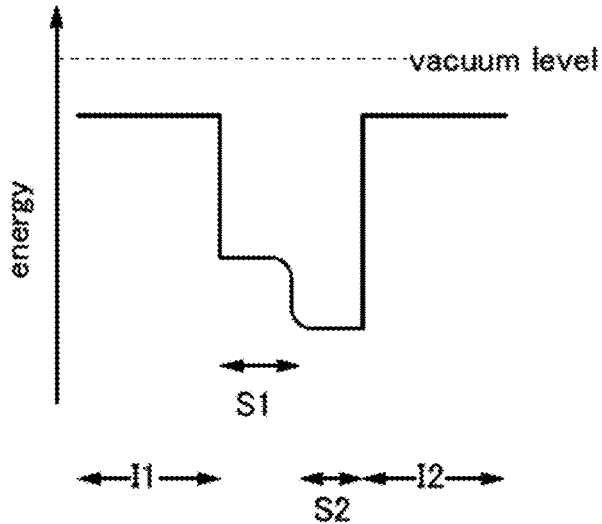
Figure 22A:
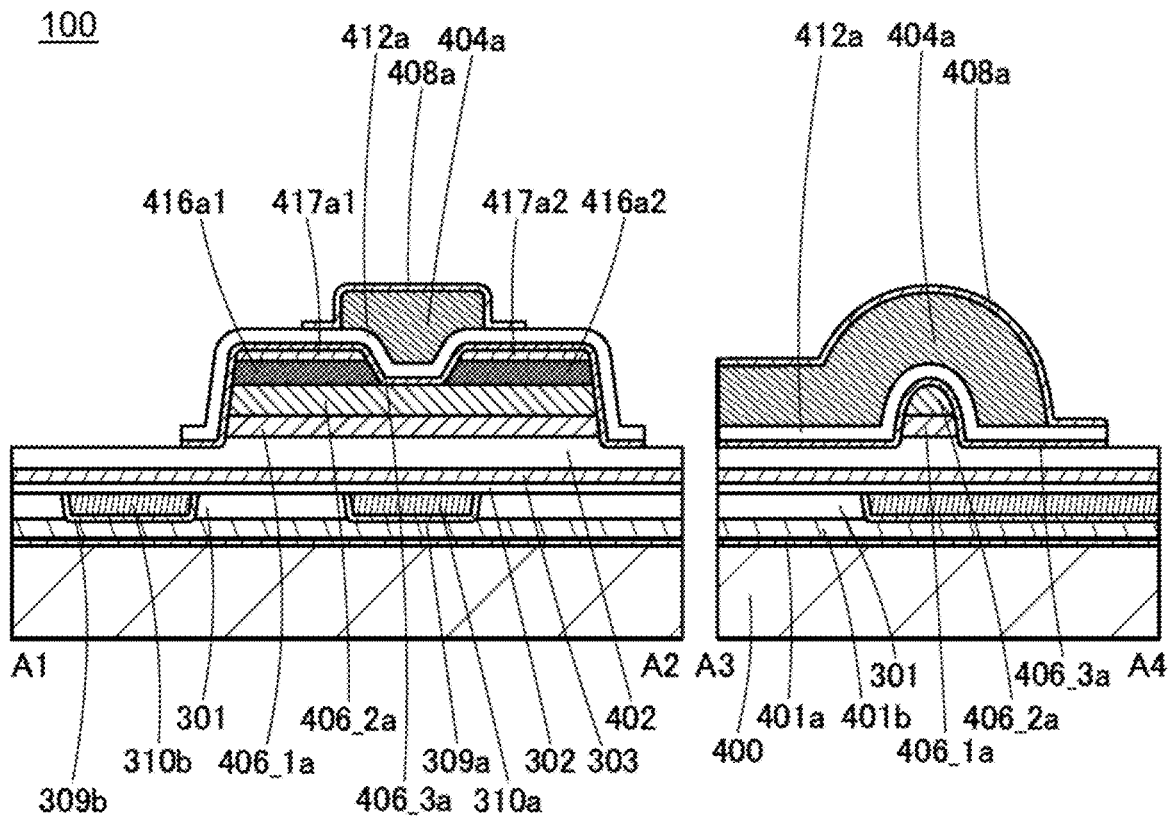
FIGS. 22A to 22D illustrate a method for manufacturing a transistor of one embodiment of the present invention.
Figure 22B:
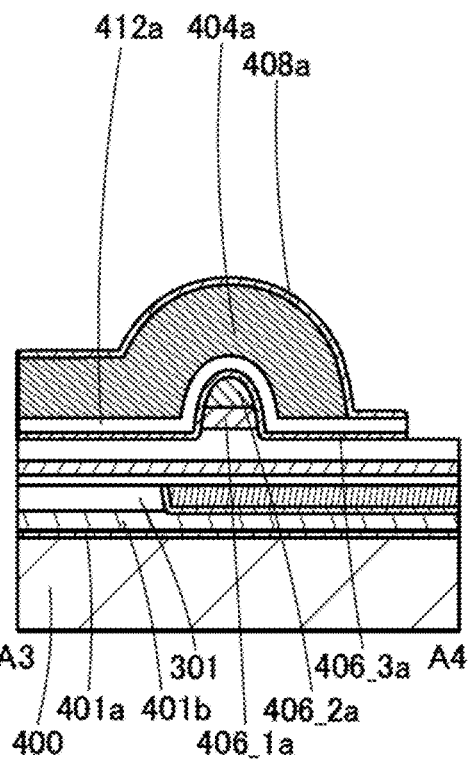
Figure 22C:
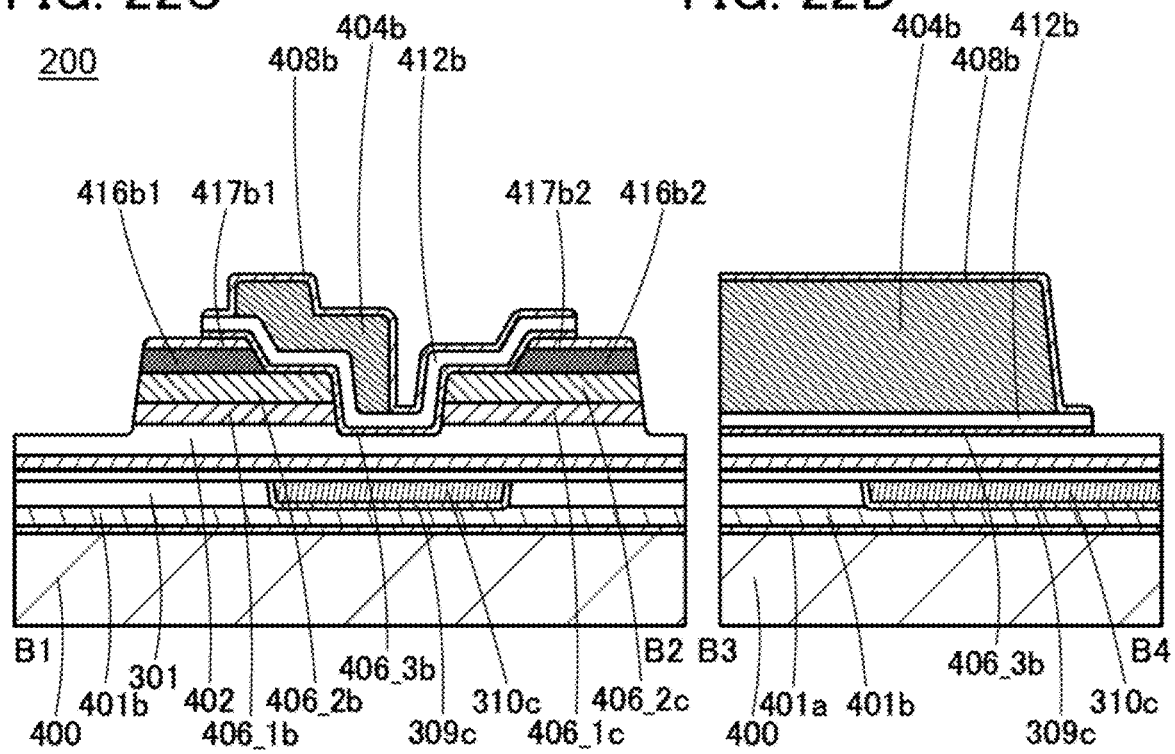
Figure 22D:
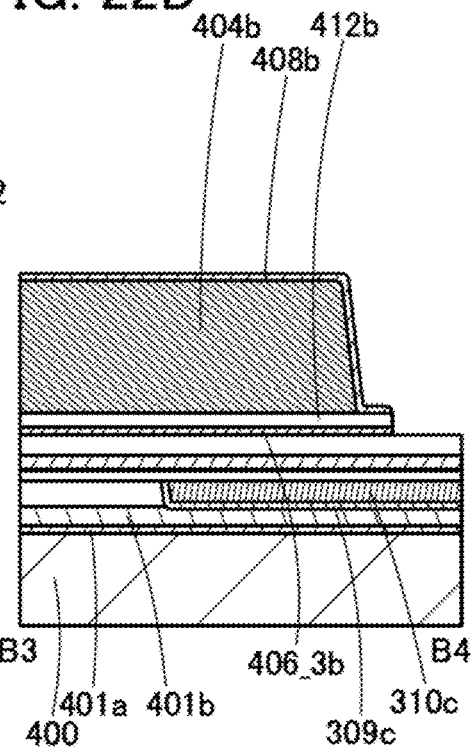

Next, the case where the oxide has a two-layer structure or a three-layer structure will be described. With reference to FIGS. 15A to 15C, the description is made on a band diagram of a layered structure of an oxide S1, an oxide S2, and an oxide S3 and insulators that are in contact with the layered structure; a band diagram of a layered structure of the oxide S2 and the oxide S3 and insulators that are in contact with the layered structure; and a band diagram of a layered structure of the oxide S1 and the oxide S2 and insulators that are in contact with the layered structure.

FIG. 15A is an example of a band diagram of a layered structure including an insulator I1, the oxide S1, the oxide S2, the oxide S3, and an insulator I2 in the thickness direction. FIG. 15B is an example of a band diagram of a layered structure including the insulator I1, the oxide S2, the oxide S3, and the insulator I2 in the thickness direction. FIG. 15C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 15A to 15C, the energy level of the conduction band minimum is gradually varied at each junction portion of the oxides S1 to S3. In other words, the energy level of the conduction band minimum of each of the oxides S1 to S3 is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed at the interface between the oxides S1 and S2 or the interface between the oxides S2 and S3. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering at the interfaces on carrier conduction is small; thus, a transistor having a channel formation region in the oxide S2 can have a high on-state current.

When an electron is trapped by a trap state at the interface between the oxide and the insulator I1 or the interface between the oxide and the insulator I2, the trapped electron behaves like a fixed charge; thus, the threshold voltage of a transistor in which the oxide S2 is in contact with the insulator I1 or the insulator I2 is shifted in the positive direction. In contrast, the oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel formation region of the transistor. For example, an oxide with high insulation performance and the atomic ratio represented by the region C in FIG. 14C can be used as the oxides S1 and S3. Note that the region C in FIG. 14C represents the atomic ratio [In]:[M]:[Zn] of 0:1:0, 1:3:2, and 1:3:4 and the vicinities thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

<Transistor Structure 2>

Here, a transistor 100A and a transistor 200A whose structures are different from those of FIGS. 2A to 2C and FIGS. 3A to 3C will be described.

FIGS. 4A to 4C are a top view and cross-sectional views illustrating the transistor 100A of one embodiment of the present invention. FIG. 4A is the top view. FIG. 4B is a cross-sectional view taken along dashed-dotted line A1-A2 in FIG. 4A. FIG. 4C is a cross-sectional view taken along dashed-dotted line A3-A4 in FIG. 4A. Note that for simplification of the drawing, some components are not illustrated in the top view in FIG. 4A.

The transistor 100A illustrated in FIGS. 4A to 4C is different from the transistor 100 illustrated in FIGS. 2A to 2C in the shape of the oxide 406_3a. In the transistor 100, the end portions of the insulators 408a and 412a are aligned with the end portion of the oxide 406_3a (FIG. 2C), whereas in the transistor 100A, the end portion of the oxide 406_3a is provided on an inner side than the end portions of insulators 408a and 412a (FIG. 4C). The above difference is caused by a difference in formation steps of the oxide 406_3a and the insulator 408a in the manufacturing process of the transistor, and the manufacture process of the transistor 100A is advantageous in that the oxide 406_3a can be shaped freely. The formation process of the transistor will be described later. For the other components, refer to the structure of the transistor 100.

FIGS. 5A to 5C are a top view and cross-sectional views illustrating the transistor 200A of one embodiment of the present invention. FIG. 5A is the top view. FIG. 5B is a cross-sectional view taken along dashed-dotted line B1-B2 in FIG. 5A. FIG. 5C is a cross-sectional view taken along dashed-dotted line B3-B4 in FIG. 5A. Note that for simplification of the drawing, some components are not illustrated in the top view in FIG. 5A.

The transistor 200A illustrated in FIGS. 5A to 5C is different from the transistor 200 illustrated in FIGS. 3A to 3C in the shape of the oxide 406_3b. In the transistor 200, the end portions of the insulators 408b and 412b are aligned with the end portion of the oxide 406_3b (FIG. 3C), whereas in the transistor 200A, the end portion of the oxide 406_3b is provided on an inner side than the end portions of insulators 408b and 412b (FIG. 5C). The above difference is caused by a difference in formation steps of the oxide 406_3b and the insulator 408b in the manufacturing process of the transistor, and the manufacture process of the transistor 200A is advantageous in that the oxide 406_3b can be shaped freely. The formation process of the transistor will be described later. For the other components, refer to the structure of the transistor 200.

<Transistor Structure 3>

Here, a transistor 100B and a transistor 200B whose structures are different from those of FIGS. 2A to 2C and FIGS. 3A to 3C will be described.

Figure 6A:
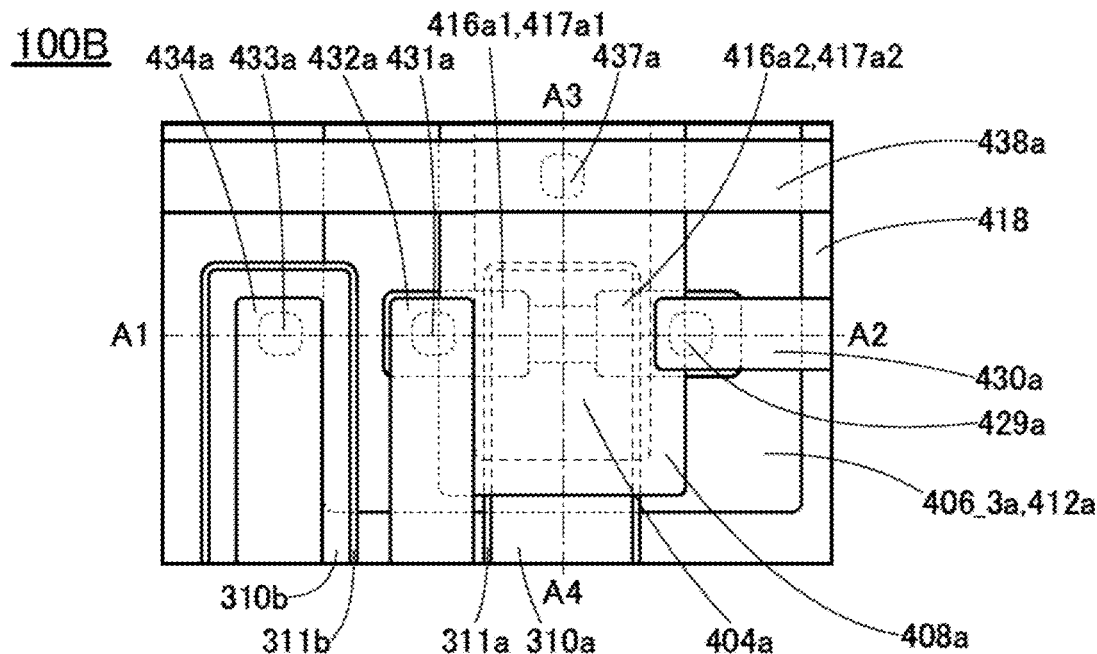
FIGS. 6A to 6C are a top view and cross-sectional views illustrating a structure of a transistor of one embodiment of the present invention.
Figures 6B, 6C:
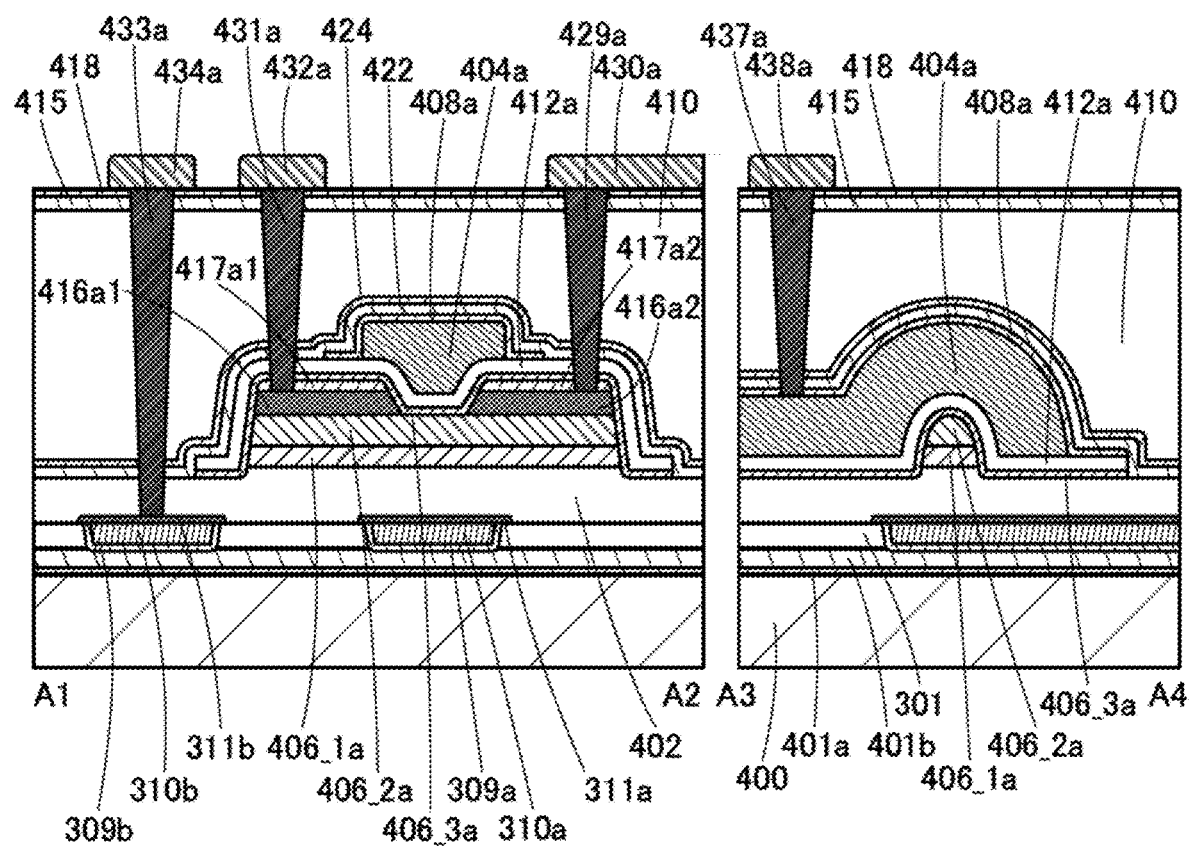

FIGS. 6A to 6C are a top view and cross-sectional views illustrating the transistor 100B of one embodiment of the present invention. FIG. 6A is the top view. FIG. 6B is a cross-sectional view taken along dashed-dotted line A1-A2 in FIG. 6A. FIG. 6C is a cross-sectional view taken along dashed-dotted line A3-A4 in FIG. 6A. Note that for simplification of the drawing, some components are not illustrated in the top view in FIG. 6A.

The transistor 100B illustrated in FIGS. 6A to 6C is different from the transistor 100 illustrated in FIGS. 2A to 2C in that a conductor 311a and a conductor 311b are provided and the insulators 302 and 303 are not provided.

Since each functioning as a conductive barrier film, the conductors 311a and 311b each have a function of inhibiting penetration of oxygen and impurities such as hydrogen. A conductor similar to that used for the conductors 309a and 309b can be used for the conductors 311a and 311b.

The bottom surface and side surfaces of the conductor 310a are covered with the conductor 309a, and a top surface of the conductor 310a is covered with the conductor 311a; thus, impurities such as hydrogen can be prevented from being released externally from the conductor 310a. In addition, oxygen can be prevented from entering the conductor 310a from the outside, preventing oxidation of the conductor 310a. Since the conductor 310b has the same structure described above, the conductor 310b has the same effects. For the other components, refer to the structure of the transistor 100.

FIGS. 7A to 7C are a top view and cross-sectional views illustrating the transistor 200B of one embodiment of the present invention. FIG. 7A is the top view. FIG. 7B is a cross-sectional view taken along dashed-dotted line B1-B2 in FIG. 7A. FIG. 7C is a cross-sectional view taken along dashed-dotted line B3-B4 in FIG. 7A. Note that for simplification of the drawing, some components are not illustrated in the top view in FIG. 7A.

The transistor 200B illustrated in FIGS. 7A to 7C is different from the transistor 200 illustrated in FIGS. 3A to 3C in that a conductor 311c is provided and the insulators 302 and 303 are not provided.

Since functioning as a conductive barrier film, the conductor 311c has a function of inhibiting penetration of oxygen and impurities such as hydrogen. A conductor similar to that used for the conductor 309c can be used for the conductor 311c.

The bottom surface and side surfaces of the conductor 310c are covered with the conductor 309c, and a top surface of the conductor 310c is covered with the conductor 311c; thus, impurities such as hydrogen can be prevented from being released externally from the conductor 310c. In addition, oxygen can be prevented from entering the conductor 310c from the outside, preventing oxidation of the conductor 310c. For the other components, refer to the structure of the transistor 200.

<Transistor Structure 4>

Here, a transistor 100C and a transistor 200C whose structures are different from those of FIGS. 2A to 2C and FIGS. 3A to 3C will be described.

FIGS. 8A to 8C are a top view and cross-sectional views illustrating the transistor 100C of one embodiment of the present invention. FIG. 8A is the top view. FIG. 8B is a cross-sectional view taken along dashed-dotted line A1-A2 in FIG. 8A. FIG. 8C is a cross-sectional view taken along dashed-dotted line A3-A4 in FIG. 8A. Note that for simplification of the drawing, some components are not illustrated in the top view in FIG. 8A.

The transistor 100C illustrated in FIGS. 8A to 8C is different from the transistor 100 illustrated in FIGS. 2A to 2C in that the insulators 422 and 424 are not provided. With such a structure, oxygen contained in the insulator 410 (also referred to as excess oxygen) can be injected to the oxides 406_1a and 406_2a through the insulator 402. In addition, the excess oxygen contained in the insulator 410 can be injected to the oxides 406_3a and 406_2a through the insulator 412a. For the other components, refer to the structure of the transistor 100.

FIGS. 9A to 9C are a top view and cross-sectional views illustrating the transistor 200C of one embodiment of the present invention. FIG. 9A is the top view. FIG. 9B is a cross-sectional view taken along dashed-dotted line B1-B2 in FIG. 9A. FIG. 9C is a cross-sectional view taken along dashed-dotted line B3-B4 in FIG. 9A. Note that for simplification of the drawing, some components are not illustrated in the top view in FIG. 9A.

The transistor 200C illustrated in FIGS. 9A to 9C is different from the transistor 200 illustrated in FIGS. 3A to 3C in that the insulators 422 and 424 are not provided. With such a structure, oxygen contained in the insulator 410 (also referred to as excess oxygen) can be injected to the oxides 406_1b, 406_2b, 406_1c, 406_2c, and 406_3b through the insulator 402. In addition, the excess oxygen contained in the insulator 410 can be injected to the oxides 406_3b, 406_2b, and 406_2c through the insulator 412b. For the other components, refer to the structure of the transistor 200.

<Transistor Structure 5>

Here, a transistor 200D whose structure is different from that of FIGS. 3A to 3C will be described.

Figure 10A:
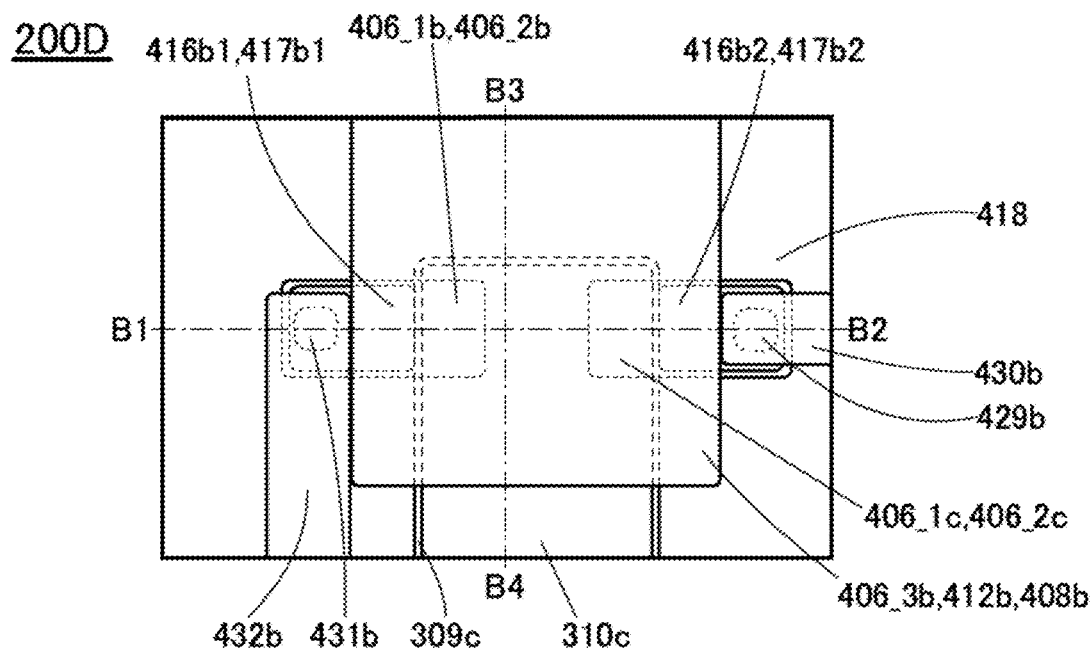
FIGS. 10A to 10C are a top view and cross-sectional views illustrating a structure of a transistor of one embodiment of the present invention.
Figure 10B:
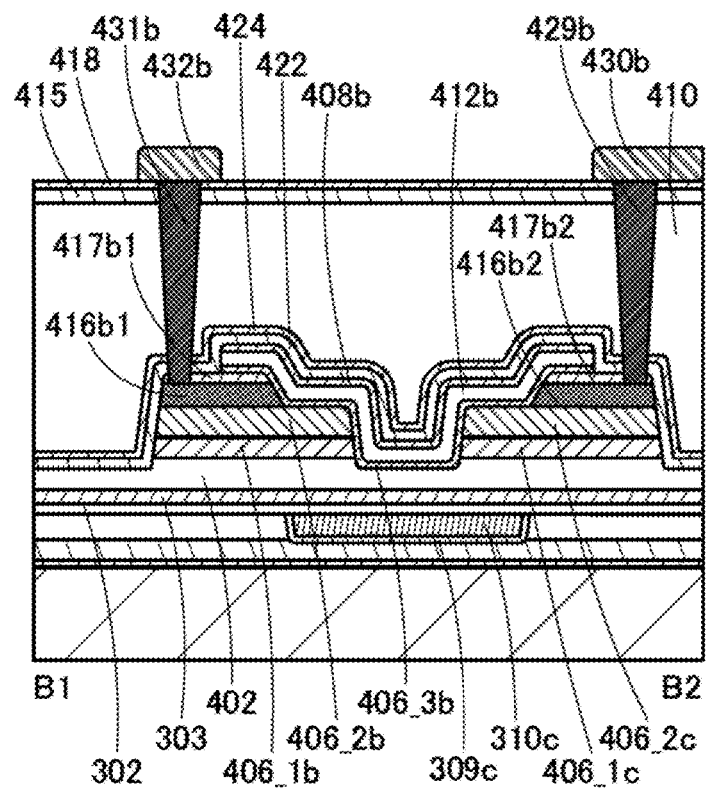
Figure 10C:
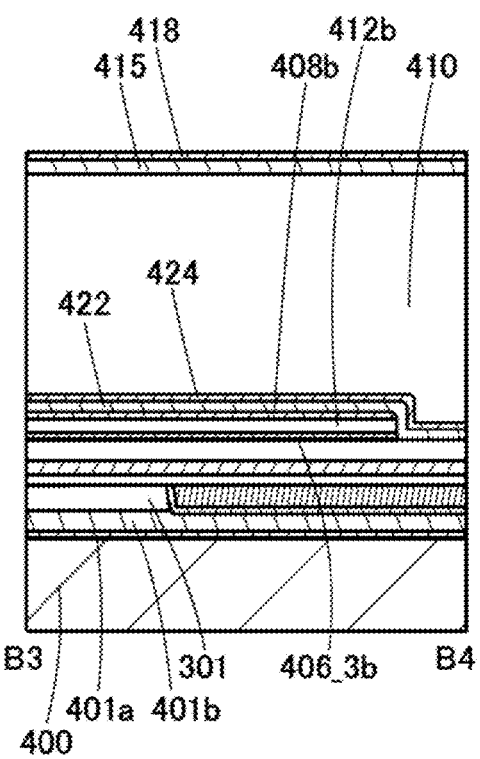

FIGS. 10A to 10C are a top view and cross-sectional views illustrating the transistor 200D of one embodiment of the present invention. FIG. 10A is the top view. FIG. 10B is a cross-sectional view taken along dashed-dotted line B1-B2 in FIG. 10A. FIG. 10C is a cross-sectional view taken along dashed-dotted line B3-B4 in FIG. 10A. Note that for simplification of the drawing, some components are not illustrated in the top view in FIG. 10A.

The transistor 200D illustrated in FIGS. 10A to 10C is different from the transistor 200 illustrated in FIGS. 3A to 3C in that a conductor having a function of a first gate electrode is not provided. In the transistor 200D, a channel is formed when a potential is applied to the conductors 309c and 310c having a function of the second gate electrode. Since the transistor 200D does not include the first gate electrode, an electric field is not applied to the insulator 412b when a potential is applied to the conductor 416b2. Accordingly, even when a high potential is applied to the conductor 416b2 having a function of the source electrode, a breakdown of the insulator 412b can be prevented. Thus, the transistor 200D has high reliability. For the other components, refer to the structure of the transistor 200.

<Transistor Structure 6>

Here, a transistor 200E whose structure is different from that of FIGS. 5A to 5C will be described.

Figure 11A:
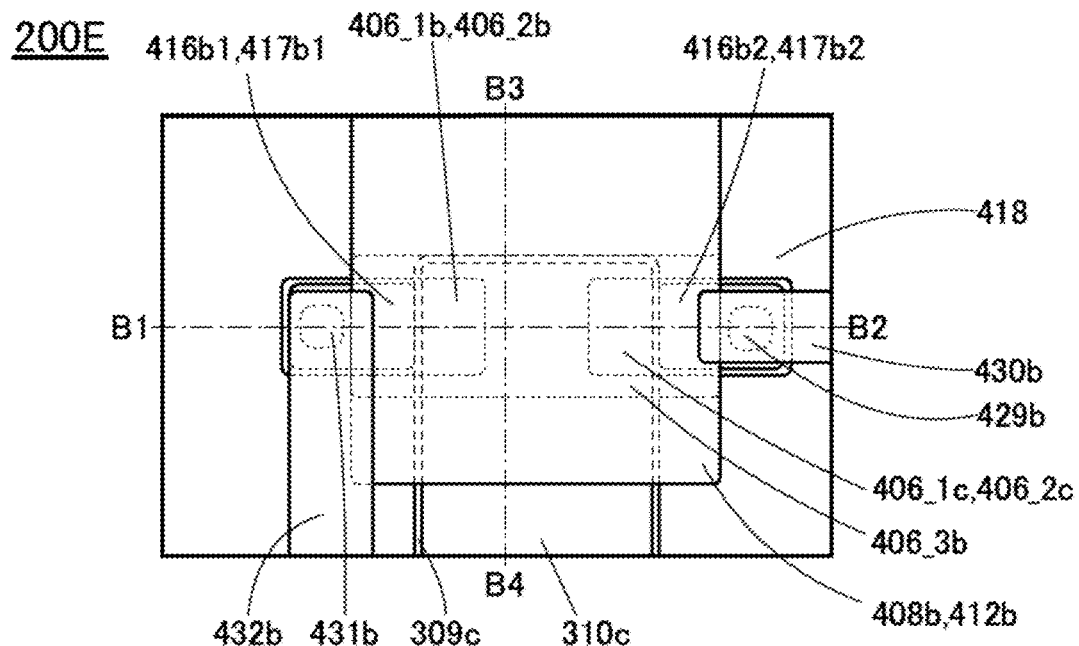
FIGS. 11A to 11C are a top view and cross-sectional views illustrating a structure of a transistor of one embodiment of the present invention.
Figure 11B:
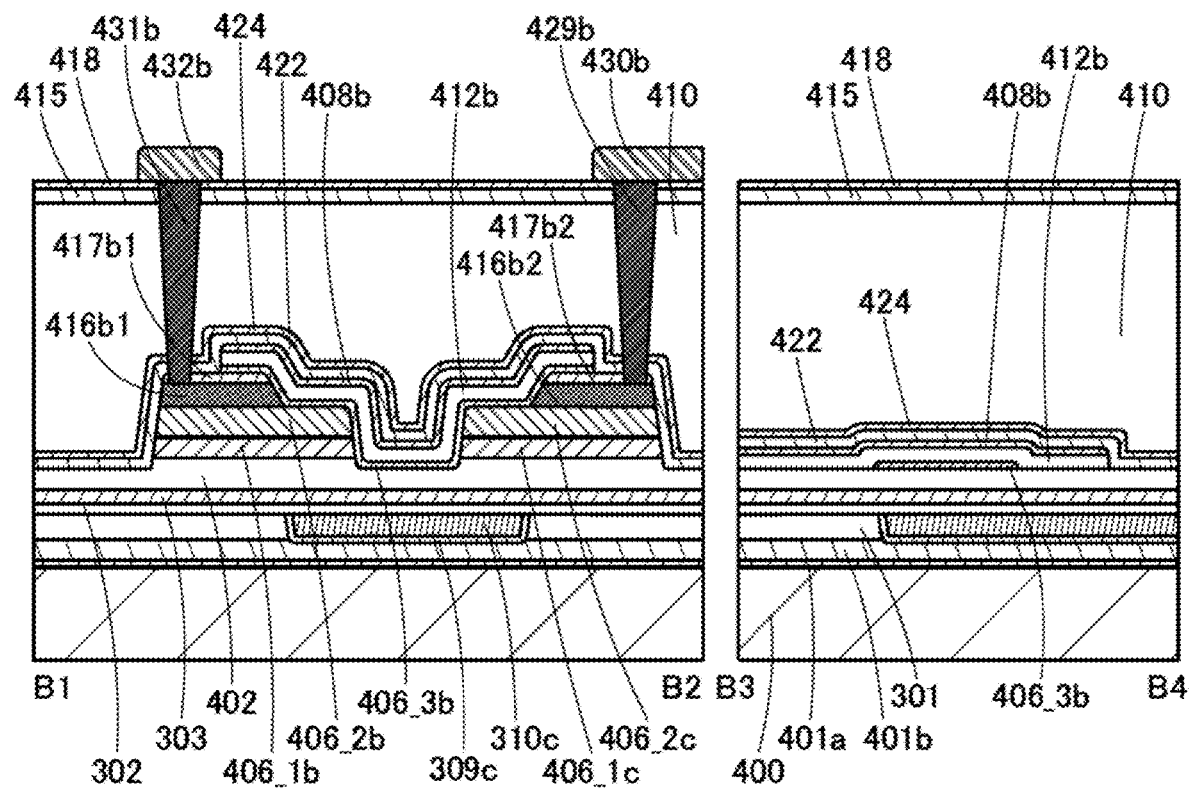
Figure 11C:
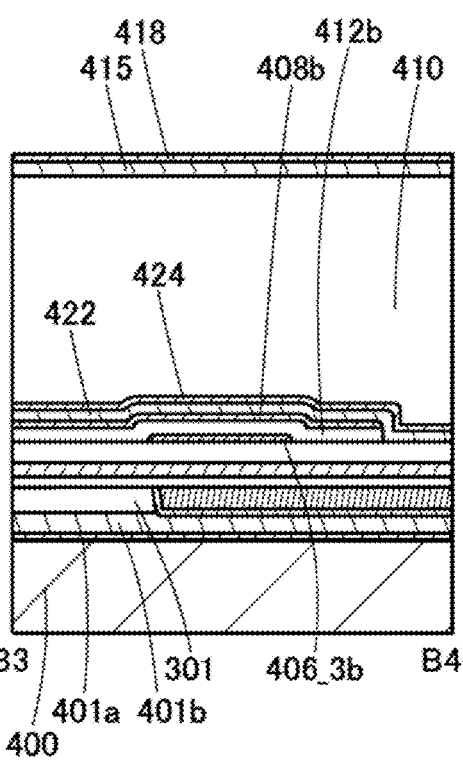

FIGS. 11A to 11C are a top view and cross-sectional views illustrating the transistor 200E of one embodiment of the present invention. FIG. 11A is the top view. FIG. 11B is a cross-sectional view taken along dashed-dotted line B1-B2 in FIG. 11A. FIG. 11C is a cross-sectional view taken along dashed-dotted line B3-B4 in FIG. 11A. Note that for simplification of the drawing, some components are not illustrated in the top view in FIG. 11A.

The transistor 200E illustrated in FIGS. 11A to 11C is different from the transistor 200A illustrated in FIGS. 5A to 5C in that a conductor having a function of a first gate electrode is not provided. In the transistor 200E, a channel is formed when a potential is applied to the conductors 309c and 310c having a function of the second gate electrode. Since the transistor 200E does not include the first gate electrode, an electric field is not applied to the insulator 412b when a potential is applied to the conductor 416b2. Accordingly, even when a high potential is applied to the conductor 416b2 having a function of the source electrode, a breakdown of the insulator 412b can be prevented. Thus, the transistor 200E has high reliability. For the other components, refer to the structure of the transistor 200A.

<Transistor Structure 7>

Here, a transistor 200F whose structure is different from that of FIGS. 7A to 7C will be described.

Figure 12A:
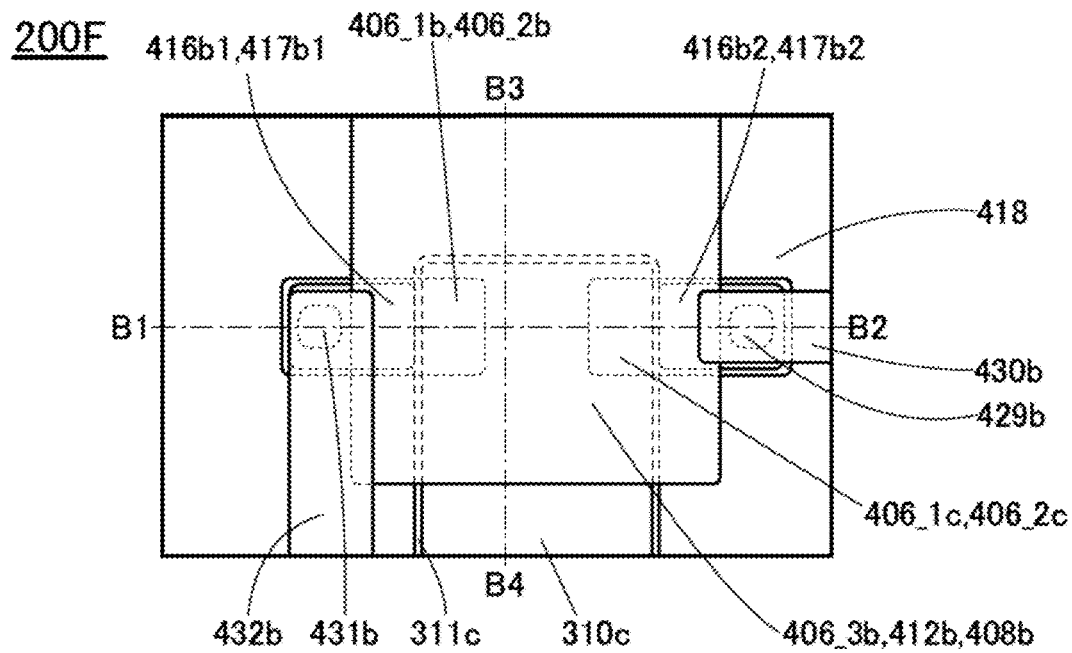
FIGS. 12A to 12C are a top view and cross-sectional views illustrating a structure of a transistor of one embodiment of the present invention.
Figure 12B:
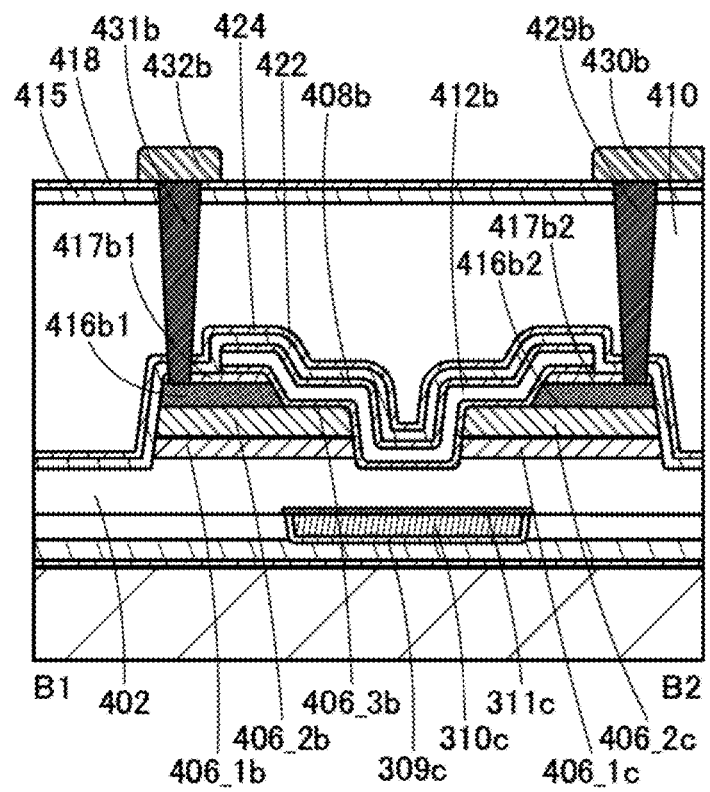
Figure 12C:
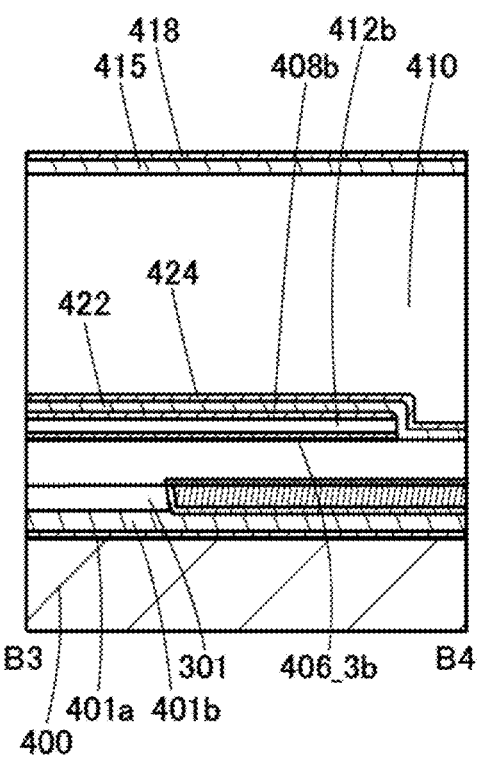

FIGS. 12A to 12C are a top view and cross-sectional views illustrating the transistor 200F of one embodiment of the present invention. FIG. 12A is the top view. FIG. 12B is a cross-sectional view taken along dashed-dotted line B1-B2 in FIG. 12A. FIG. 12C is a cross-sectional view taken along dashed-dotted line B3-B4 in FIG. 12A. Note that for simplification of the drawing, some components are not illustrated in the top view in FIG. 12A.

The transistor 200F illustrated in FIGS. 12A to 12C is different from the transistor 200B illustrated in FIGS. 7A to 7C in that a conductor having a function of a first gate electrode is not provided. In the transistor 200F, a channel is formed when a potential is applied to the conductors 309c and 310c having a function of the second gate electrode. Since the transistor 200F does not include the first gate electrode, an electric field is not applied to the insulator 412b when a potential is applied to the conductor 416b2. Accordingly, even when a high potential is applied to the conductor 416b2 having a function of the source electrode, a breakdown of the insulator 412b can be prevented. Thus, the transistor 200F has high reliability. For the other components, refer to the structure of the transistor 200B.

<Transistor Structure 8>

Here, a transistor 200G whose structure is different from that of FIGS. 9A to 9C will be described.

Figure 13A:
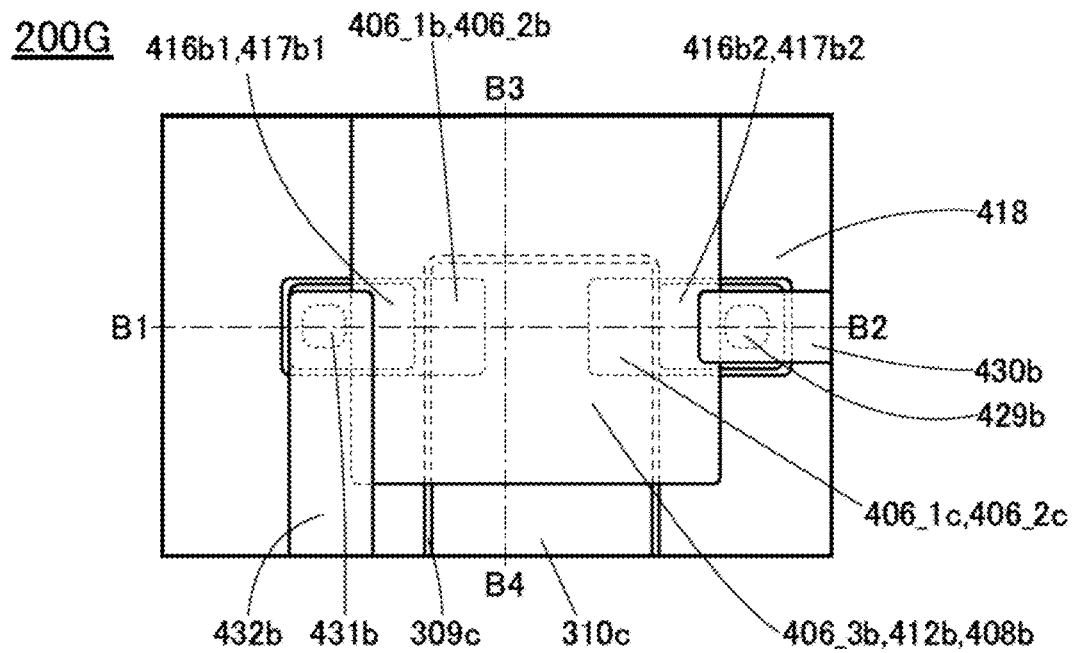
FIGS. 13A to 13C are a top view and cross-sectional views illustrating a structure of a transistor of one embodiment of the present invention.
Figure 13B:
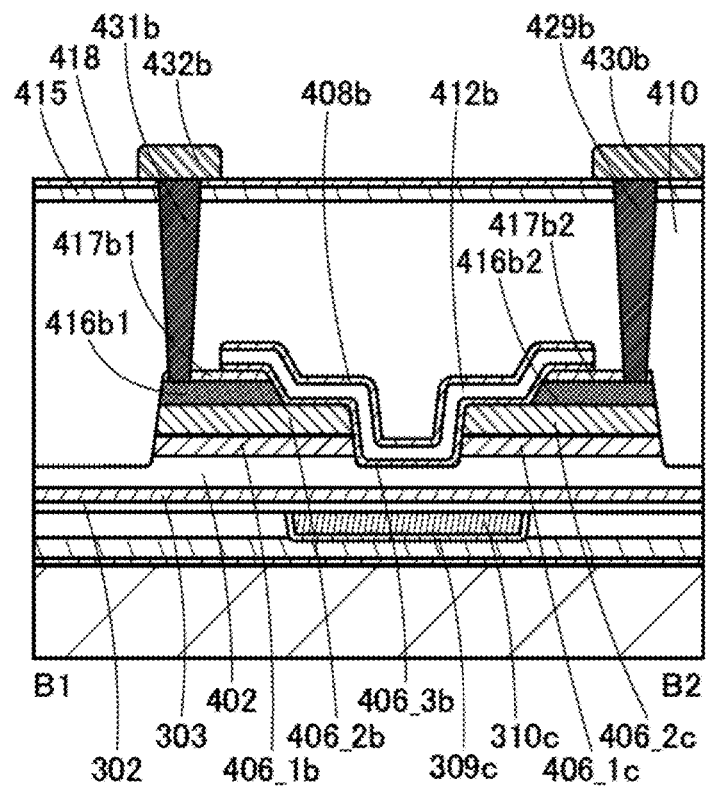
Figure 13C:
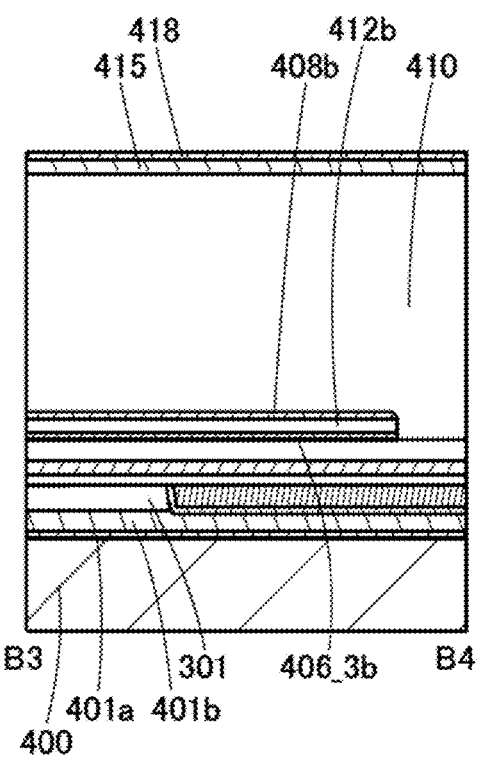

FIGS. 13A to 13C are a top view and cross-sectional views illustrating the transistor 200G of one embodiment of the present invention. FIG. 13A is the top view. FIG. 13B is a cross-sectional view taken along dashed-dotted line B1-B2 in FIG. 13A. FIG. 13C is a cross-sectional view taken along dashed-dotted line B3-B4 in FIG. 13A. Note that for simplification of the drawing, some components are not illustrated in the top view in FIG. 13A.

The transistor 200G illustrated in FIGS. 13A to 13C is different from the transistor 200C illustrated in FIGS. 9A to 9C in that a conductor having a function of a first gate electrode is not provided. In the transistor 200G, a channel is formed when a potential is applied to the conductors 309c and 310c having a function of the second gate electrode. Since the transistor 200G does not include the first gate electrode, an electric field is not applied to the insulator 412b when a potential is applied to the conductor 416b2. Accordingly, even when a high potential is applied to the conductor 416b2 having a function of the source electrode, a breakdown of the insulator 412b can be prevented. Thus, the transistor 200G has high reliability. For the other components, refer to the structure of the transistor 200C.

The structures, the methods, and the like described in this embodiment can be combined as appropriate with any of the structures, the methods, and the like described in the other embodiments and examples.

Embodiment 2

<Method for Manufacturing Semiconductor Device 1000>

A method for manufacturing a semiconductor device 1000 including the transistor 100 in FIGS. 2A to 2C and the transistor 200 in FIGS. 3A to 3C according to the present invention will be described below with reference to FIGS. 16A to 16D, FIGS. 17A to 17D, FIGS. 18A to 18D, FIGS. 19A to 19D, FIGS. 20A to 20D, FIGS. 21A to 21D, FIGS. 22A to 22D, and FIGS. 23A to 23D. FIG. 16A, FIG. 17A, FIG. 18A, FIG. 19A, FIG. 20A, FIG. 21A, FIG. 22A, and FIG. 23A are each a cross-sectional view taken along dashed-dotted line A1-A2 in FIG. 2A. FIG. 16B, FIG. 17B, FIG. 18B, FIG. 19B, FIG. 20B, FIG. 21B, FIG. 22B, and FIG. 23B are each a cross-sectional view taken along dashed-dotted line A3-A4 in FIG. 2A. FIG. 16C, FIG. 17C, FIG. 18C, FIG. 19C, FIG. 20C, FIG. 21C, FIG. 22C, and FIG. 23C are each a cross-sectional view taken along dashed-dotted line B1-B2 in FIG. 3A. FIG. 16D, FIG. 17D, FIG. 18D, FIG. 19D, FIG. 20D, FIG. 21D, FIG. 22D, and FIG. 23D are each a cross-sectional view taken along dashed-dotted line B3-B4 in FIG. 3A.

First, the substrate 400 is prepared.

Next, the insulator 401a is formed. The insulator 401a can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By using a PECVD method, a high-quality film can be formed at a relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a TCVD method not using plasma is employed, such plasma damage is not caused and the yield of the semiconductor device can be increased. A TCVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with a flow rate ratio of a source gas. For example, by a CVD method or an ALD method, a film with a certain composition can be formed by adjusting a flow rate ratio of a source gas. Moreover, by changing the flow rate ratio of a source gas during deposition by a CVD method or an ALD method, a film whose composition is continuously changed can be formed. In the case where a film is deposited while the flow rate ratio of a source gas is changed, the time for deposition can be shorter than in the case where a film is deposited using a plurality of deposition chambers because time for transfer and pressure adjustment can be saved. Thus, semiconductor devices can be manufactured with improved productivity in some cases.

Next, the insulator 401b is formed over the insulator 401a. The insulator 401b can be formed by a sputtering method, a CVD method, an MBE method, a PLD method, an ALD method, or the like. Then, the insulator 301 is formed over the insulator 401b. The insulator 301 can be formed by a sputtering method, a CVD method, an MBE method, a PLD method, an ALD method, or the like.

Then, openings are formed in the insulator 301 so as to reach the insulator 401b. Examples of the openings include holes and grooves. In forming the openings, wet etching may be employed; however, dry etching is preferably employed in terms of microfabrication. The insulator 401b is preferably an insulator that serves as an etching stopper film used in forming the openings by etching the insulator 301. For example, in the case where a silicon oxide film is used as the insulator 301 in which the openings are to be formed, the insulator 401b is preferably formed using a silicon nitride film, an aluminum oxide film, or a hafnium oxide film.

In this embodiment, aluminum oxide is deposited as the insulator 401a by an ALD method, and aluminum oxide is deposited as the insulator 401b by a sputtering method.

After the formation of the openings, a conductor to be the conductors 309a, 309b, and 309c is formed. The conductor to be the conductors 309a, 309b, and 309c desirably includes a conductor that allows less oxygen to pass therethrough. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductors 309a, 309b, and 309c can be formed by a sputtering method, a CVD method, an MBE method, a PLD method, an ALD method, or the like.

In this embodiment, tantalum nitride is deposited by a sputtering method as the conductor to be the conductors 309a, 309b, and 309c.

Next, a conductor to be the conductors 310a, 310b, and 310c is deposited over the conductor to be the conductors 309a, 309b, and 309c. The conductor to be the conductors 310a, 310b, and 310c can be deposited by a sputtering method, a CVD method, an MBE method, a PLD method, an ALD method, or the like.

In this embodiment, as the conductor to be the conductors 310a, 310b, and 310c, titanium nitride is deposited by a CVD method and tungsten is deposited over the titanium nitride by a CVD method.

Next, chemical mechanical polishing (CMP) is performed to remove the conductor to be the conductors 309a, 309b, and 309c and the conductor to be the conductors 310a, 310b, and 310c that are positioned over the insulator 301. Consequently, the conductor to be the conductors 309a, 309b, and 309c and the conductor to be the conductors 310a, 310b, and 310c remain only in each of the openings formed in the insulator 301, whereby the conductors 309a, 310a, 309b, 310b, 309c, and 310c that have flat top surfaces can be formed.

Next, the insulator 302 is formed over the insulator 301 and the conductors 309a, 310a, 309b, 310b, 309c, and 310c. The insulator 302 can be formed by a sputtering method, a CVD method, an MBE method, a PLD method, an ALD method, or the like.

Next, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment is performed at a temperature higher than or equal to 250° C. and lower than or equal to 650° C., preferably higher than or equal to 300° C. and lower than or equal to 500° C. In the case where a wiring or the like formed using copper is formed under the transistor described in this embodiment, the temperature of the first heat treatment is preferably 410° C. or lower. The first heat treatment is performed in an inert gas atmosphere. The first heat treatment may be performed in a reduced pressure. Preferably, the first heat treatment is performed in a nitrogen gas atmosphere at 400° C. By the first heat treatment, impurities such as hydrogen and water included in the insulator 402 can be removed.

Next, an oxide 406_1 is formed over the insulator 402. The oxide 406_1 can be formed by a sputtering method, a CVD method, an MBE method, a PLD method, an ALD method, or the like.

Next, treatment for adding oxygen to the oxide 406_1 may be performed. An ion implantation method, a plasma treatment method, or the like can be used for the treatment for adding oxygen. Note that oxygen added to the oxide 406_1 serves as excess oxygen. Oxygen is preferably added to a layer corresponding to the oxide 406_1.

Next, an oxide 406_2 is formed over the oxide 406_1. The oxide 406_2 can be formed by a sputtering method, a CVD method, an MBE method, a PLD method, an ALD method, or the like.

The oxide 406_1 and the oxide 406_2 are preferably formed by a sputtering method. This is because the oxide 406_1 and the oxide 406_2 formed by a sputtering method can have a higher density. As a sputtering gas, a rare gas (typically argon), oxygen, or a mixed gas of a rare gas and oxygen may be used as appropriate. As the sputtering gas, nitrogen may be contained. Deposition may be performed in the state where the substrate is heated.

Increasing the purity of the sputtering gas is preferred. For example, as an oxygen gas or an argon gas used for a sputtering gas, a gas that is highly purified to have a dew point of −40° C. or lower, preferably −80° C. or lower, more preferably −100° C. or lower, still more preferably −120° C. or lower is used, whereby entry of moisture or the like into the oxide 406_1 and the oxide 406_2 can be suppressed as much as possible.

A chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide 406_1 and the oxide 406_2 are removed as much as possible. Alternatively, a turbo molecular pump and a cold trap are preferably combined so as to prevent a backflow of a gas, especially a gas containing carbon or hydrogen, from an exhaust system to the inside of the chamber.

In addition, a DC power source, an AC power source, or an RF power source can be used as a power source of the sputtering apparatus.

In the sputtering apparatus, a target or a magnet may be rotated or moved. For example, the oxide films can be formed while a magnet unit is oscillated vertically and/or horizontally. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide 406_1 is preferably higher than or equal to room temperature and lower than or equal to 400° C. For example, the substrate temperature is set as appropriate in the above range to a temperature which is higher than or equal to the evaporation temperature of water (e.g., 100° C.) and enables favorable maintainability and throughput of an apparatus.

In formation of the oxide 406_1, a rare gas (typically, argon), oxygen, or a mixed gas of a rare gas and oxygen is used as a sputtering gas as appropriate. In the case of the mixed gas, the proportion of oxygen gas in a whole deposition gas is preferably 70% or higher, more preferably 80% or higher, still more preferably 100%. When an oxide containing excess oxygen is used for the oxide 406_1, oxygen can be supplied to the oxide 406_2 by later heat treatment.

As the deposition target of the oxide 406_1, the above-described In-M-Zn oxide target can be used. The atomic ratio of In to the element M in the In-M-Zn oxide target of the oxide 406_1 is preferably lower than that in an In-M-Zn oxide target of the oxide 406_2. For example, a metal oxide target having an atomic ratio of [In]:[M]:[Zn]=1:3:4 or in the neighborhood thereof is preferably used.

Preferably, the oxide 406_1 is formed in an atmosphere containing an oxygen gas at approximately 100% at a substrate temperature of 200° C. with an In—Ga—Zn oxide target having an atomic ratio of [In]:[Ga]:[Zn]=1:3:4.

The substrate temperature in forming the oxide 406_2 is preferably higher than or equal to room temperature and lower than 140° C. For example, the substrate temperature is set as appropriate in the above range to a temperature which is higher than or equal to the evaporation temperature of water (e.g., 100° C.) and enables favorable maintainability and throughput of an apparatus.

In formation of the oxide 406_2, a rare gas (typically, argon), oxygen, or a mixed gas of a rare gas and oxygen is used as a sputtering gas as appropriate. In the case of the mixed gas, the proportion of oxygen gas in a whole deposition gas is 0% or higher and 30% or lower, preferably 5% or higher and 20% or lower.

As the deposition target of the oxide 406_2, the above-described In-M-Zn oxide target can be used. The atomic ratio of In to the element M in the In-M-Zn oxide target of the oxide 406_2 is preferably higher than that in an In-M-Zn oxide target of the oxide 406_1. For example, a metal oxide target having an atomic ratio of [In]:[M]:[Zn]=4:2:4.1, 5:1:7, or in the neighborhood thereof is preferably used.

Preferably, the oxide 406_2 is formed using a mixed gas of a rare gas and oxygen (the proportion of the oxygen gas is higher than or equal to 0% and lower than 50%) at a substrate temperature higher than or equal to room temperature and lower than 250° C. with an In—Ga—Zn oxide target having an atomic ratio of [In]:[Ga]:[Zn]=4:2:4.1. More preferably, the oxide 406_2 is formed using a mixed gas of a rare gas and oxygen (the proportion of the oxygen gas is approximately 10%) at a substrate temperature higher than or equal to 100° C. and lower than 150° C. with an In—Ga—Zn oxide target having an atomic ratio of [In]:[Ga]:[Zn]=4:2:4.1.

After that, second heat treatment may be performed. For the second heat treatment, the conditions for the first heat treatment can be used. By the second heat treatment, the crystallinity of the oxide 406_2 can be increased and impurities such as hydrogen and water can be removed, for example. Preferably, treatment at 400° C. in a nitrogen atmosphere for one hour and treatment at 400° C. in an oxygen atmosphere for one hour are successively performed in this order.

Next, a conductor 416 is formed over the oxide 406_2. The conductor 416 can be formed by a sputtering method, a CVD method, an MBE method, a PLD method, an ALD method, or the like. As the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material containing one or more of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon including an impurity element such as phosphorus, or a silicide such as nickel silicide may be deposited over the oxide.

The oxide may have a function of absorbing hydrogen in the oxides 406_1 and 406_2 and capturing hydrogen diffused from the outside; thus, the electrical characteristics and reliability of the transistors 100 and 200 are improved in some cases. Titanium instead of the oxide may give a similar effect.

Then, a barrier film 417 is formed over the conductor 416. The barrier film 417 can be formed by a sputtering method, a CVD method, an MBE method, a PLD method, an ALD method, or the like. In this embodiment, aluminum oxide is deposited as the barrier film 417.

Subsequently, a conductor 411 is formed over the barrier film 417. The conductor 411 can be formed by a sputtering method, a CVD method, an MBE method, a PLD method, an ALD method, or the like. In this embodiment, tantalum nitride is deposited as the conductor 411 (see FIGS. 16A to 16D).

Next, the conductor 411 and the barrier film 417 are processed by a lithography method to form a conductor 411a, a barrier film 417a, a conductor 411b, and a barrier film 417b. The conductor 411a, the barrier film 417a, the conductor 411b, and the barrier film 417b preferably have a tapered cross section. The taper angle between the cross section and a plane parallel to the bottom surface of the substrate is greater than or equal to 30° and less than 75°, preferably greater than or equal to 30° and less than 70°. With such a taper angle of the conductor 411a, the barrier film 417a, the conductor 411b, and the barrier film 417b, coverage with films formed later in the manufacturing process can be improved. The processing is preferably performed by a dry etching method. The dry etching method is suitable for microfabrication and the above described formation of a tapered shape (see FIGS. 17A to 17D).

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask for the exposure of the resist to light is not necessary in the case of using an electron beam or an ion beam because direct drawing is performed on the resist. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a resist 421 is formed by a lithography method. The resist 421 is positioned to cover a region 406W1 and a region 406W2 (see FIGS. 18A to 18D).

Next, the conductor 411a, the conductor 411b, the barrier film 417a, the barrier film 417b, and the conductor 416 are etched with the use of the resist 421 as an etching mask to form a conductor 411a1, a conductor 411a2, a conductor 411b1, a conductor 411b2, the barrier film 417a1, the barrier film 417a2, the barrier film 417b1, the barrier film 417b2, a conductor 416a, the conductor 416b1, and the conductor 416b2 (see FIGS. 19A to 19D).

Then, after the resist 421 is removed, with the use of the conductors 411a1, 411a2, 411b1, and 411b2, a portion of the conductor 416a in which the surface thereof is exposed, a portion of the conductor 416b1 in which the surface thereof is exposed, and a portion of the conductor 416b2 in which the surface thereof is exposed as etching masks, the oxides 406_1 and 406_2 are etched to form the oxides 406_1a, 406_2a, 406_1b, 406_2b, 406_1c, and 406_2c (see FIGS. 20A to 20D).

Next, the conductors 411a1, 411a2, 411b1, and 411b2, the portion of the conductor 416a with an exposed surface, the portion of the conductor 416b1 with an exposed surface (the region 406W1), and the portion of the conductor 416b2 with an exposed surface (the region 406W2) are etched to form the conductors 416a1 and 416a2. Part of the top surface of the oxide 406_2b is exposed by the etching of the portion of the conductor 416b1 with the exposed surface (the region 406W1), and part of the top surface of the oxide 406_2c is exposed by the etching of the portion of the conductor 416b2 with the exposed surface (the region 406W2) (see FIGS. 21A to 21D). In some cases, part of the insulator 402 is removed by the etching process.

Then, washing treatment may be performed using an aqueous solution in which hydrofluoric acid is diluted with pure water (diluted hydrogen fluoride solution). A diluted hydrogen fluoride solution refers to a solution in which hydrofluoric acid is mixed into pure water at a concentration of approximately 70 ppm. Next, third heat treatment is performed. For the third heat treatment, the conditions for the first heat treatment can be used. Preferably, treatment at 400° C. in a nitrogen atmosphere for one hour and treatment at 400° C. in an oxygen atmosphere for one hour are successively performed in this order. More preferably, treatment at 400° C. in a nitrogen atmosphere for 30 minutes and treatment at 400° C. in an oxygen atmosphere for 30 minutes are successively performed in this order.

In some cases, dry etching performed in the above process causes the attachment or diffusion of an impurity due to an etching gas to a surface or an inside portion of the oxides 406_1a, 406_2a, 406_1b, 406_2b, 406_1c, and 406_2c, or the like. The impurity is fluorine or chlorine, for example.

The above heat treatment allows a reduction in impurity concentration. Furthermore, the moisture concentration and the hydrogen concentration in the oxides 406_1a, 406_2a, 406_1b, 406_2b, 406_1c, and 406_2c can be reduced.

Next, an oxide 406_3 to be the oxides 406_3a and 406_3b is deposited. The oxide 406_3 can be formed by a sputtering method, a CVD method, an MBE method, a PLD method, an ALD method, or the like. A sputtering method is especially preferred for the deposition. Furthermore, sputtering conditions are as follows: a mixed gas of oxygen and argon is used, preferably the oxygen partial pressure is high, more preferably an oxygen atmosphere is employed; and the deposition temperature is higher than or equal to room temperature and lower than or equal to 200° C., preferably room temperature. When the oxide 406_3 is deposited in an oxygen atmosphere, oxygen can be added to the oxide 406_2a. Thus, oxygen vacancies in the oxide 406_2a can be reduced.

As the deposition target of the oxide 406_3, the above-described In-M-Zn oxide target can be used. The atomic ratio of In to the element M in the In-M-Zn oxide target of the oxide 406_3 is preferably lower than that in an In-M-Zn oxide target of the oxide 406_2. For example, a metal oxide target having an atomic ratio of [In]:[M]:[Zn]=1:1:1 or in the neighborhood thereof is preferably used.

The oxide 406_3 is preferably deposited under the above conditions, in which case excess oxygen can be introduced into the oxides 406_2a, 406_2b, 406_2c, and the insulator 402.

Next, an insulator 412 to be the insulator 412a and the insulator 412b is formed over the oxide 406_3. The insulator 412 can be formed by a sputtering method, a CVD method, an MBE method, a PLD method, an ALD method, or the like.

Here, fourth heat treatment may be performed. For the fourth heat treatment, the conditions for the first heat treatment can be used. Preferably, treatment at 400° C. in a nitrogen atmosphere for one hour and treatment at 400° C. in an oxygen atmosphere for one hour are successively performed in this order. Alternatively, only heat treatment at 400° C. in a nitrogen atmosphere for one hour is performed. The moisture concentration and the hydrogen concentration in the insulator 412 can be reduced by the fourth heat treatment.

Next, a conductor to be the conductors 404a and 404b is deposited. The conductor to be the conductors 404a and 404b can be formed by a sputtering method, a CVD method, an MBE method, a PLD method, an ALD method, or the like.

The conductor to be the conductors 404a and 404b may be a multilayer film. For example, for a first layer of the conductor, oxide may be deposited under the conditions the same as those for the oxide 406_3. Thus, oxygen can be added from the oxide to the insulator 412. Oxygen added to the insulator 412 serves as excess oxygen.

Then, a conductor is deposited over the oxide by a sputtering method, whereby the electric resistivity of the oxide can be decreased.

Next, fifth heat treatment may be performed. For the fifth heat treatment, the conditions for the first heat treatment can be used. Preferably, treatment at 400° C. in a nitrogen atmosphere for one hour and treatment at 400° C. in an oxygen atmosphere for one hour are successively performed in this order. More preferably, only treatment at 400° C. in a nitrogen atmosphere for one hour is performed. Oxygen added to the insulator 412 when the conductor to be the conductor 404a and the conductor 404b is deposited by the fifth heat treatment can be diffused into the oxide 406_1a, the oxide 406_2a, and the oxide 406_3. Thus, oxygen vacancies in the oxide 406_1a, the oxide 406_2a, and the oxide 406_3 can be reduced.

The conductor to be the conductors 404a and 404b is processed by a lithography method to form the conductors 404a and 404b.

After that, an insulator to be the insulators 408a and 408b is formed. The insulator to be the insulators 408a and 408b can be formed by a sputtering method, a CVD method, an MBE method, a PLD method, an ALD method, or the like. An aluminum oxide is preferably deposited by an ALD method as the insulator to be the insulators 408a and 408b. By an ALD method, the aluminum oxide with fewer pinholes can be deposited uniformly on top and side surfaces of the conductors 404a and 404b, which suppresses oxidation of the conductors 404a and 404b.

Next, part of the insulator to be the insulators 408a and 408b is selectively removed by a lithography method, whereby the insulators 408a and 408b are formed. The insulators 408a and 408b preferably cover the conductors 404a and 404b. Thus, surrounding excess oxygen can be prevented from being used for oxidation of the conductors 404a and 404b.

Then, the insulator 412 and the oxide 406_3 are processed into the insulators 412a and 412b and the oxides 406_3a and 406_3b by a lithography method (see FIGS. 22A to 22D).

When the oxide 406_3 is etched by dry etching, part of the oxide 406_3 might remain as a residue to be attached to the side surfaces of the oxides 406_1a, 406_2a, 406_1b, 406_2b, 406_1c, and 406_2c. The residue can be removed by using a chemical solution that can etch the oxide 406_3. As the chemical solution that can etch the oxide 406_3, for example, a diluted hydrofluoric acid or a diluted phosphoric acid solution can be used.

The residue is preferably removed, in which case excess oxygen can be injected efficiently from the side surfaces of the oxides 406_1a, 406_2a, 406_1b, 406_2b, 406_1c, and 406_2c into the oxides 406_1a, 406_2a, 406_1b, 406_2b, 406_1c, and 406_2c.

Next, the insulator 422 is formed. The insulator 422 can be formed by a sputtering method, a CVD method, an MBE method, a PLD method, an ALD method, or the like. In this embodiment, aluminum oxide is deposited by a sputtering method, in which case oxygen in the aluminum oxide can be added to the insulator 402 and the oxides 406_1a, 406_2a, 406_3a, 406_1b, 406_2b, 406_1c, 406_2c, and 406_3b. Hydrogen contained in the insulator 402 and the oxides 406_1a, 406_2a, 406_3a, 406_1b, 406_2b, 406_1c, 406_2c, and 406_3b can be reduced by heat treatment performed later.

Next, the insulator 424 is formed. The insulator 424 can be formed by a sputtering method, a CVD method, an MBE method, a PLD method, an ALD method, or the like. In this embodiment, aluminum oxide is deposited by an ALD method, in which case hydrogen can be prevented from entering the components below the aluminum oxide from above the aluminum oxide.

Then, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably employed. More preferably, a plasma CVD method is employed. In the case of formation by a plasma CVD method, a step 1 of depositing an insulator and a step 2 of performing treatment using plasma including oxygen may be repeatedly conducted. By conducting the step 1 and the step 2 more than once, the insulator 410 including excess oxygen can be formed.

The insulator 410 may be formed to have a flat top surface. For example, the top surface of the insulator 410 may have flatness immediately after the formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410 is not necessarily flat.

Then, the insulator 415 is formed over the insulator 410. The insulator 415 can be formed by a sputtering method, a CVD method, an MBE method, a PLD method, an ALD method, or the like. A sputtering method is preferably used in formation of the insulator 415. The insulator 415 may be formed by a sputtering method successively after heat treatment in a vacuum or reverse sputtering is performed.

When the insulator 415 is formed by a sputtering method with the use of plasma including oxygen, oxygen can be added to the insulator 410. The added oxygen serves as excess oxygen in the insulator 410 and is added to the oxides 406_1a, 406_2a, 406_3a, and 406_3b by heat treatment or the like, so that oxygen vacancies in the oxides 406_1a, 406_2a, 406_3a, and 406_3b can be filled. In addition, the moisture concentration and the hydrogen concentration in the insulator 410 can be reduced.

Next, the insulator 418 is formed over the insulator 415 (see FIGS. 23A to 23D). The insulator 418 can be formed by a sputtering method, a CVD method, an MBE method, a PLD method, an ALD method, or the like. For the formation of the insulator 418, an ALD method is preferably employed.

For example, when the insulator 418 contains aluminum oxide, impurities such as hydrogen can be prevented from entering the oxides 406_1a, 406_2a, 406_3a, and 406_3b through the insulator 418. Furthermore, for example, when the insulators 401a, 401b, 408a, 408b, 415, and 418 contain aluminum oxide, diffusion of the oxygen added to the oxides 406_1a, 406_2a, 406_3a, and 406_3b to the outside of the insulators 401a, 401b, 408a, 408b, 415, and 418 can be reduced. In other words, oxygen added to the oxides 406_1a, 406_2a, 406_3a, and 406_3b can be sealed.

Here, sixth heat treatment can be performed. For the sixth heat treatment, the conditions for the first heat treatment can be used. Preferably, treatment at 400° C. in a nitrogen atmosphere for one hour and treatment at 400° C. in an oxygen atmosphere for one hour are successively performed in this order. The moisture concentration and the hydrogen concentration in the insulator 410 can be reduced by the sixth heat treatment.

Next, an opening that passes through the insulators 418, 415, 410, 424, 422, 402, 303, and 302 and reaches the conductor 310b; an opening that passes through the insulators 418, 415, 410, 424, 422, and 412a, the oxide 406_3a, and the barrier film 417a1 and reaches the conductor 416a1; an opening that passes through the insulators 418, 415, 410, 424, 422, and 412a, the oxide 406_3a, and the barrier film 417*a*2 and reaches the conductor 416*a*2; an opening that passes through the insulators 418, 415, 410, 424, 422, and 408*a* and reaches the conductor 404*a*; an opening that passes through the insulators 418, 415, 410, 424, and and the barrier film 417*b*1 and reaches the conductor 416*b*1; an opening that passes through the insulators 418, 415, 410, 424, and and the barrier film 417*b*2 and reaches the conductor 416*b*2; and an opening that passes through the insulators 418, 415, 410, 424, 422, and 408*b* and reaches the conductor 404*b* are formed by a lithography method.

As another method for forming the openings, the following steps may be employed: a conductor is formed over the insulator 418, an insulator is formed over the conductor, the conductor and the insulator are processed by a lithography method to form a hard mask including the conductor and the insulator, and etching is performed with the use of the hard mask as an etching mask, whereby openings are formed. When the hard mask is used as the etching mask, the openings can be prevented from extending laterally or deformation. Note that the hard mask may be a single layer of the insulator or the conductor.

The openings can be formed at once by a lithograph step. Alternatively, the openings may be formed separately by performance of lithography steps a plurality of times.

Next, the conductors 429*a*, 431*a*, 433*a*, 437*a*, 429*b*, 431*b*, and 437*b* are embedded in the openings.

Next, a conductor is formed over the insulator 418 and the conductors 429*a*, 431*a*, 433*a*, 437*a*, 429*b*, 431*b*, and 437*b* and processed by a lithography method or the like, whereby the conductor 430*a* in contact with the top surface of the conductor 429*a*, the conductor 432*a* in contact with the top surface of the conductor 431*a*, the conductor 434*a* in contact with the top surface of the conductor 433*a*, the conductor 438*a* in contact with the top surface of the conductor 437*a*, the conductor 430*b* in contact with the top surface of the conductor 429*b*, the conductor 432*b* in contact with the top surface of the conductor 431*b*, and the conductor 438*b* in contact with the top surface of the conductor 437*b* are formed. Through the above steps, the semiconductor device 1000 including the transistor 100 illustrated in FIGS. 2A to 2C and the transistor 200 illustrated in FIGS. 3A to 3C can be manufactured (see FIGS. 2A to 2C and FIGS. 3A to 3C).

The structures, the methods, and the like described in this embodiment can be combined as appropriate with any of the structures, the methods, and the like described in the other embodiments and examples.

Embodiment 3

<Structure of Semiconductor Device>

In this embodiment, an example of a semiconductor device including any of the transistors disclosed in this specification and the like is described.

Figure 24:
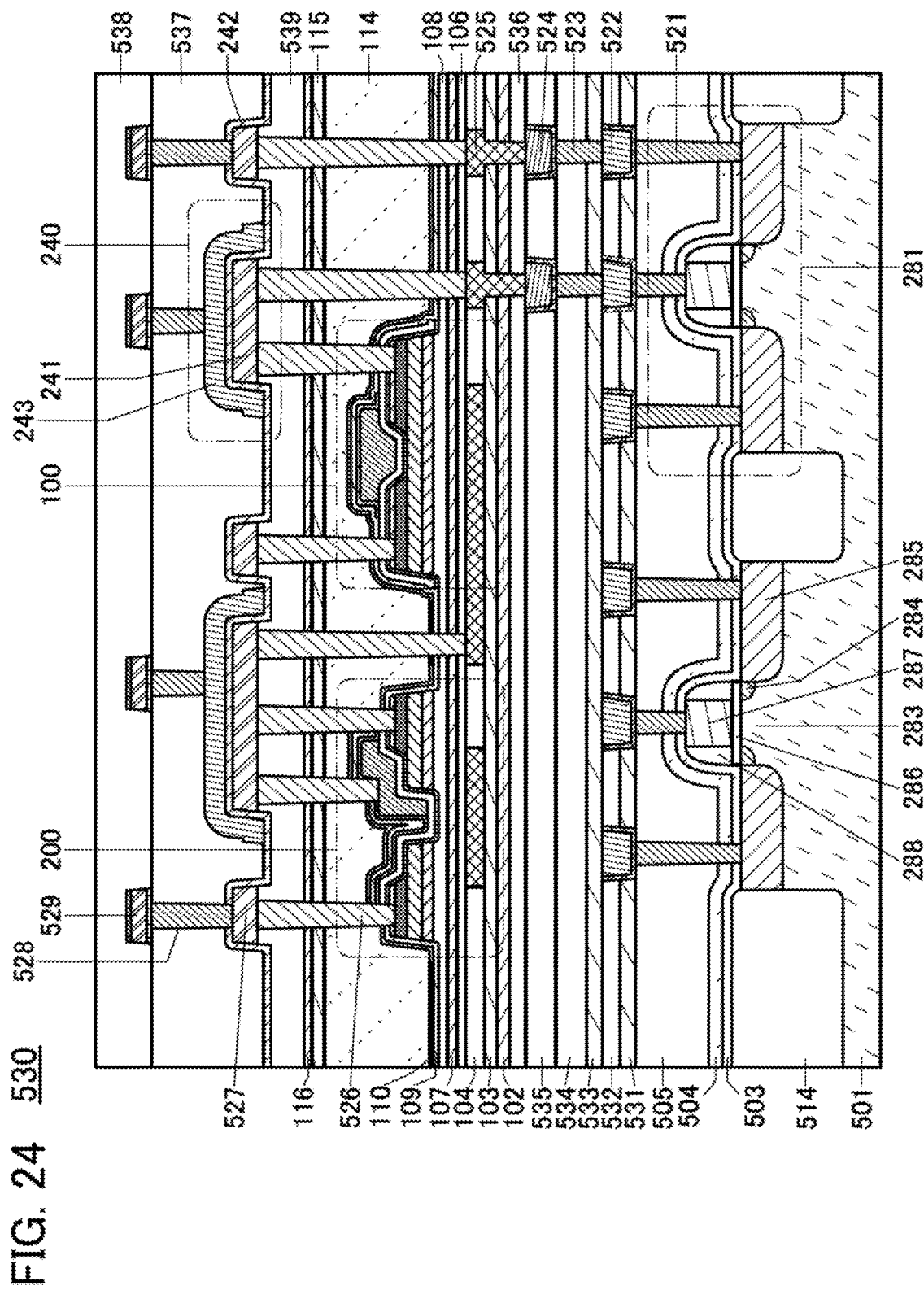
FIG. 24 illustrates a semiconductor device of one embodiment of the present invention.

FIG. 24 is a cross-sectional view of a semiconductor device 530. The semiconductor device 530 includes the transistor 100, the transistor 200, a transistor 281, and a capacitor 240.

In the semiconductor device 530, an n-type semiconductor is used for a substrate 501. The transistor 281 includes a channel formation region 283, high-concentration p-type impurity regions 285, an insulator 286, a conductor 287, and a sidewall 288. In regions overlapping with the sidewall 288 with the insulator 286 positioned therebetween, low-concentration p-type impurity regions 284 are provided. The insulator 286 can function as a gate insulator. The conductor 287 can function as a gate electrode. The channel formation region 283 of the transistor 281 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 514. The element isolation layer can be formed by a local oxidation of silicon (LOCOS) method, a shallow trench isolation (STI) method, or the like.

In the semiconductor device 530, an insulator 531, an insulator 532, an insulator 533, an insulator 534, an insulator 535, and an insulator 536 are provided over an insulator 505 covering the transistor 281. In addition, the semiconductor device 530 includes a conductor 522 and a conductor 524 over the insulator 505.

The conductor 522 is provided to be embedded in the insulators 531 and 532. The conductor 522 is electrically connected to the transistor 281 through a conductor 521 provided in the insulators 503, 504, and 505.

The conductor 524 is provided to be embedded in the insulator 535. The conductor 524 is electrically connected to the conductor 522 through a conductor 523 provided in the insulators 533 and 534.

The semiconductor device 530 includes the transistors 100 and 200 over the insulator 536 with an insulator 102 and an insulator 103 provided therebetween. An insulator 115, an insulator 116, and an insulator 539 are provided over the transistors 100 and 200, and a conductor 527 and a conductor 241 are provided over the insulator 539. An insulator 242 covering the conductors 527 and 241 is provided. Furthermore, a conductor 243 covering the conductor 241 is provided over the insulator 242.

A region where the conductor 241, the insulator 242, and the conductor 243 overlap with each other functions as the capacitor 240. By providing the conductor 243 to cover the conductor 241, not only a top surface but also side surfaces of the conductor 241 can function as the capacitor.

The conductor 527 is electrically connected to a source of the transistor 200 through a conductor 526 provided in part of the insulators 539, 116, 115, 114, 110, and 109 and the barrier film 417.

An insulator 537 is provided over the conductor 243 and the insulator 242, a conductor 529 is provided over the insulator 537, and an insulator 538 is provided over the conductor 529 and the insulator 537. The conductor 529 is electrically connected to the conductor 527 through a conductor 528 provided in part of the insulator 537 and the insulator 242.

The insulators 102, 103, 104, 106, 107, 108, 109, 110, 115, 116, 531, 532, 533, 534, 535, 536, 539, 242, 537, and 538 can be formed using a material and a method which are similar to those of the insulators described in the above embodiments and the like. The conductors 521, 522, 523, 524, 525, 526, 527, 241, 243, 528, and 529 can be formed using a material and a method which are similar to those of the conductors described in the above embodiments and the like.

The conductors 521, 522, 523, 524, 525, 526, 527, 528, and 529 may be formed by a damascene method, a dual damascene method, or the like.

<Example of Memory Element>

Figure 25A:
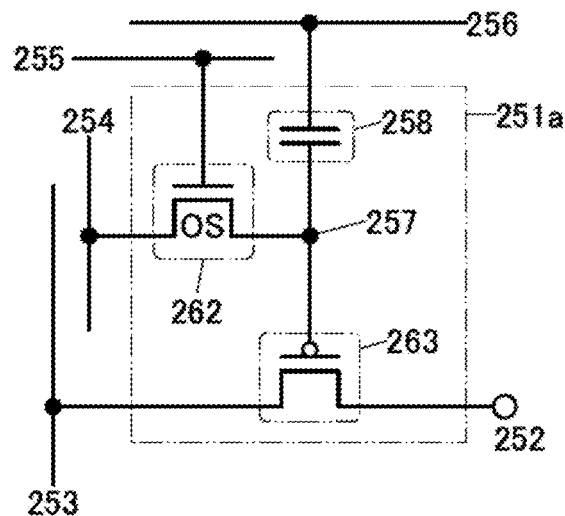
FIGS. 25A to 25D are circuit diagrams each illustrating a semiconductor device of one embodiment of the present invention.

A circuit illustrated in FIG. 25A has a configuration of a memory element 251a in which one of a source and a drain of a transistor 262 is connected to a gate of a transistor 263 and one electrode of a capacitor 258. A circuit illustrated in FIG. 25B has a configuration of a memory element 261a in which one of the source and the drain of the transistor 262 is connected to one electrode of the capacitor 258.

In each of the memory elements 251a and 261a, charges injected through a wiring 254 and the transistor 262 can be retained at a node 257. The transistor 262 is an OS transistor, which enables charges to be stored at the node 257 for a long period.

The memory element 251a includes the transistor 263. Although the transistor 263 is a p-channel transistor in FIG. 25A, the transistor 263 may be an n-channel transistor. For example, the transistor 281 illustrated in FIG. 24 may be used as the transistor 263. An OS transistor may also be used as the transistor 263.

Figure 25B:
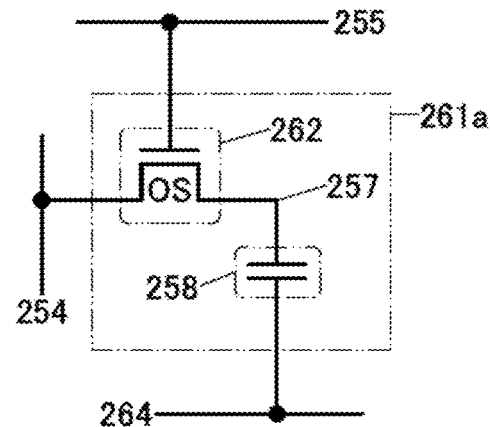

The memory element 251a illustrated in FIG. 25A and the memory element 261a illustrated in FIG. 25B are described in detail here.

The memory element 251a includes the transistor 263 using a first semiconductor, the transistor 262 using a second semiconductor, and the capacitor 258.

As the transistor 262, the OS transistor disclosed in the above embodiments can be used. When a transistor having a small off-state current is used as the transistor 262, data can be retained at the node 257 for a long period. In other words, power consumption of the memory element 251a can be reduced because refresh operation becomes unnecessary or the frequency of refresh operation can be extremely low.

In FIG. 25A, a wiring 252 is electrically connected to one of a source and a drain of the transistor 263, and a wiring 253 is electrically connected to the other of the source and the drain of the transistor 263. The gate of the transistor 263, the one of the source and the drain of the transistor 262, and the one electrode of the capacitor 258 are electrically connected to the node 257. The wiring 254 is electrically connected to the other of the source and the drain of the transistor 262, and a wiring 255 is electrically connected to a gate of the transistor 262. A wiring 256 is electrically connected to the other electrode of the capacitor 258.

The memory element 251a in FIG. 25A has a feature that the charges supplied to the node 257 can be retained, and thus enables writing, retaining, and reading of data as follows.

[Writing and Retaining Operations]

Data writing and data retaining operations of the memory element 251a will be described. First, the potential of the wiring 255 is set to a potential at which the transistor 262 is turned on. Accordingly, the potential of the wiring 254 is supplied to the node 257. That is, a predetermined charge is supplied to the node 257 (writing operation). Here, one of two kinds of charges providing different potential levels (hereinafter also referred to as a "low-level charge" and a "high-level charge") is supplied. After that, the potential of the wiring 255 is set to a potential at which the transistor 262 is turned off. Thus, the charge is retained at the node 257 (retaining operation).

Note that the high-level charge is a charge for supplying a higher potential to the node 257 than the low-level charge. In the case where the transistor 263 is a p-channel transistor, each of the high-level and low-level charges is a charge for supplying a potential higher than the threshold voltage of the transistor 263. In the case where the transistor 263 is an n-channel transistor, each of the high-level and low-level charges is a charge for supplying a potential lower than the threshold voltage of the transistor 263. In other words, each of the high-level and low-level charges is a charge for supplying a potential at which the transistor 263 is turned off.

[Reading Operation 1]

Next, operation of reading data will be described. A reading potential $V_R$ is supplied to the wiring 256 while a predetermined potential (a constant potential) different from the potential of the wiring 253 is supplied to the wiring 252, whereby data retained at the node 257 can be read.

The reading potential $V_R$ is set to $\{(\text{Vth}-V_H)+(\text{Vth}-V_L)\}/2$, where $V_H$ is the potential supplied in the case of the high-level charge and $V_L$ is the potential supplied in the case of the low-level charge. Note that the potential of the wiring 256 in a period during which data is not read is set to a potential higher than $V_H$ in the case where the transistor 263 is a p-channel transistor, and is set to a potential lower than $V_L$ in the case where the transistor 263 is an n-channel transistor.

For example, in the case where the transistor 263 is a p-channel transistor, $V_R$ is −2 V when Vth of the transistor 263 is −2 V, $V_H$ is 1 V, and $V_L$ is −1 V. When the potential written to the node 257 is $V_H$ and $V_R$ is applied to the wiring 256, $V_R+V_H$, i.e., −1 V, is applied to the gate of the transistor 263. Since −1 V is higher than Vth, the transistor 263 is not turned on. Thus, the potential of the wiring 253 is not changed. When the potential written to the node 257 is $V_L$ and $V_R$ is applied to the wiring 256, $V_R+V_L$, i.e., −3 V, is applied to the gate of the transistor 263. Since −3 V is lower than Vth, the transistor 263 is turned on. Thus, the potential of the wiring 253 is changed.

In the case where the transistor 263 is an n-channel transistor, $V_R$ is 2 V when Vth of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than Vth, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than Vth, the transistor 263 is not turned on. Thus, the potential of the wiring 253 is not changed.

By determining the potential of the wiring 253, data retained at the node 257 can be read.

The memory element 261a illustrated in FIG. 25B is different from the memory element 251a in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261a in a manner similar to that of the memory element 251a.

[Reading Operation 2]

Operation of reading data of the memory element 261a will be described. When a potential at which the transistor 262 is turned on is supplied to the wiring 255, the wiring 254 which is in a floating state and the capacitor 258 are brought into conduction, and the charge is redistributed between the wiring 254 and the capacitor 258. As a result, the potential of the wiring 254 is changed. The amount of change in the potential of the wiring 254 varies depending on the potential of the node 257 (or the charge accumulated at the node 257).

For example, the potential of the wiring 254 after the charge redistribution is $(C_B \times V_{B0} + C \times V)/(C_B + C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0(V_1 > V_0)$, the potential of the wiring 254 in the case of retaining the potential $V_1(=(C_B \times V_{B0} + C \times V_1)/(C_B + C))$ is higher than the potential of the wiring 254 in the case of retaining the potential $V_0(=(C_B \times V_{B0} + C \times V_0)/(C_B + C))$.

Then, by comparing the potential of the wiring 254 with a predetermined potential, data stored at the node 257 can be read.

When including a transistor using an oxide semiconductor and having an extremely small off-state current, the memory element described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory element, a high voltage is not needed for data writing and deterioration of the element is less likely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

Figure 25C:
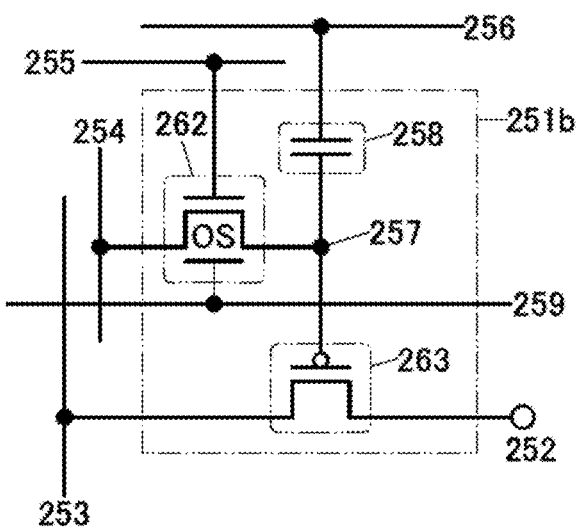
Figure 25D:
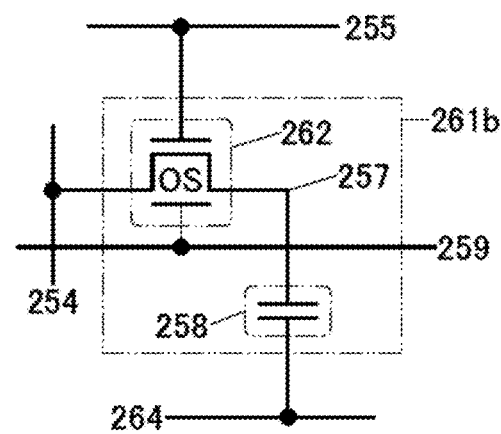

The transistor 262 may be a transistor including a back gate. By controlling the potential supplied to the back gate, the threshold voltage of the transistor 262 can be appropriately changed. A memory element 251b illustrated in FIG. 25C has substantially the same circuit configuration as the memory element 251a. The memory element 251b is different from the memory element 251a in that a transistor including a back gate is used as the transistor 262. A memory element 261b illustrated in FIG. 25D has substantially the same circuit configuration as the memory element 261a. The memory element 261b is different from the memory element 261a in that a transistor including a back gate is used as the transistor 262.

In each of the memory elements 251b and 261b, the back gate of the transistor 262 is electrically connected to a wiring 259. By controlling the potential supplied to the wiring 259, the threshold voltage of the transistor 262 can be appropriately changed.

<Example of Memory Device>

FIGS. 26A and 26B are circuit diagrams showing examples of a memory device including any of the above memory elements. A memory device 300 illustrated in FIG. 26A includes a memory circuit 350 and a voltage retention circuit 320. A memory device 300a illustrated in FIG. 26B includes a memory circuit 350a and the voltage retention circuit 320. The memory circuits 350 and 350a each include a plurality of memory elements. FIGS. 26A and 26B illustrate the case where three memory elements 261b (memory elements 261b_1 to 261b_3) are provided.

In the memory device 300 illustrated in FIG. 26A, the memory element 261b_1 included in the memory circuit 350 is electrically connected to a wiring 255_1 and a wiring 254_1. The memory element 261b_2 included in the memory circuit 350 is electrically connected to a wiring 255_2 and a wiring 254_2. The memory element 261b_3 included in the memory circuit 350 is electrically connected to a wiring 255_3 and a wiring 254_3. The memory elements 261b_1 to 261b_3 included in the memory circuit 350 are electrically connected to the wiring 264.

In the memory device 300a illustrated in FIG. 26B, the memory elements 261b_1 to 261b_3 included in the memory circuit 350a are electrically connected to the wiring 255. The memory element 261b_1 included in the memory circuit 350a is electrically connected to the wiring 254_1 and a wiring 264_1. The memory element 261b_2 included in the memory circuit 350a is electrically connected to the wiring 254_2 and a wiring 264_2. The memory element 261b_3 included in the memory circuit 350a is electrically connected to the wiring 254_3 and a wiring 264_3.

Note that the above description of the memory element 261b can be referred to for configurations, operations, and the like of the memory elements 261b_1 to 261b_3. Thus, detailed description is omitted here.

The voltage retention circuit 320 includes a transistor 323 and a capacitor 324. In FIGS. 26A and 26B, one of a source and a drain of the transistor 323 is electrically connected to a terminal 321. The other of the source and the drain, a gate, and the back gate of the transistor 323 are electrically connected to the wiring 259. One electrode of the capacitor 324 is electrically connected to the wiring 259. The other electrode of the capacitor 324 is electrically connected to a wiring 322.

Note that in the transistor 323 of one embodiment of the present invention illustrated in FIGS. 26A and 26B, the other of the source and the drain, the gate, and the back gate are electrically connected to the wiring 259; however, a structure in which only the other of the source and the drain and the back gate are electrically connected to the wiring 259 and the gate is independently controlled may be employed.

Note that the gate of the transistor 323 of one embodiment of the present invention is provided only on the side of the other of the source and the drain of the transistor 323. Such a gate structure significantly suppresses a breakdown of the gate insulator of the transistor 323 when a high negative potential is applied to one of the source and the drain of the transistor 323 at the time of data retention operation of the memory circuit 350 (details will be described later).

The gate structure of the transistor 323 of one embodiment of the present invention is not limited to the above structure. For example, the transistor 323 may be a transistor that does not include a gate and is operated only by the back gate. Also this structure significantly suppresses a breakdown of the gate insulator of the transistor 323 when a high negative potential is applied to one of the source and the drain of the transistor 323 at the time of data retention operation of the memory circuit 350 (details will be described later).

Hereinafter one of the source and the drain of the transistor 323 is called source, the other of the source and the drain is called drain.

By controlling the potential of the wiring 322 in the memory devices 300 and 300a, the potential of the wiring 259 can be changed. In the reading operation and the writing operation of the memory devices 300 and 300a, a potential is supplied to the wiring 322 so that the potential of the wiring 259 is higher than a negative potential (a potential lower than GND) described later and lower than a potential corresponding to Vth of the transistor 262 (a potential at which the transistor 262 is turned on).

In the case where gates of the transistors 262 in the memory elements 261b_1 to 261b_3 are electrically connected to the wiring 259 as in the memory device 300a, the potential of the wiring 259 may be higher than or equal to a potential corresponding to Vth of the transistor 262.

By controlling the potential of the wiring 259, the operation speed of the transistor 262 can be increased. Furthermore, apparent Vth of the transistor 262 can be decreased. Thus, the data writing speed and the data reading speed can be increased.

In the retention operation of the memory circuit 350 (the memory circuit 350a), a fixed potential is supplied to the wiring 322. For example, GND is supplied. After that, a negative potential (a potential lower than GND) is supplied to the terminal 321. When a negative potential is supplied to the terminal 321, the gate potential of the transistor 323 becomes relatively high, so that the transistor 323 is turned on. Consequently, the negative potential is supplied to the wiring 259 through the transistor 323. More accurately, the wiring 259 is supplied with a potential higher than the negative potential by Vth of the transistor 323. Note that the wiring 259 is supplied with the negative potential in this embodiment and the like for easy understanding.

Since in one embodiment of the present invention, the transistor 323 has a structure in which the gate is provided only on the drain side as described above, a breakdown of the insulator of the transistor 323 can be prevented when a negative potential is applied from the terminal 321 to the source of the transistor 323.

The effect of preventing a breakdown is also obtained in the case where the transistor 323 has a structure without a gate.

When the wiring 259 is supplied with a negative potential, the potential of the back gate of the transistor 262 is decreased, and the transistor 262 is turned off; thus, data written to the memory circuit 350 can be retained. Furthermore, by supplying the negative potential to the back gate of the transistor 262, apparent Vth of the transistor 262 is increased. Thus, even when the potential of the gate of the transistor 262 is changed, data written to the memory circuit 350 (the memory circuit 350a) can be retained.

Next, a potential higher than or equal to GND is supplied to the terminal 321. For example, GND is supplied. Since the potential of the wiring 259 is the negative potential, the potential of the gate of the transistor 323 becomes the negative potential. Accordingly, the transistor 323 is turned off. Even when power supply to the memory device 300 (the memory device 300a) is stopped after that, the transistors 323 and 262 can remain off.

The voltage retention circuit 320 has a function of suppressing a change in the potential of the wiring 259 in the retention operation of the memory device 300 (the memory device 300a). The voltage retention circuit 320 has a function of suppressing a change in the potential of the wiring 259 even when power supply to the memory device 300 (the memory device 300a) is stopped. In other words, the voltage retention circuit 320 has a function of retaining the potential of the wiring 259. The transistor 323 is preferably a transistor having a small off-state current to retain the potential of the wiring 259. For example, when the capacitance of the capacitor 324 is 10 pF and an acceptable increase in the potential of the wiring 259 is 0.5 V, a period during which the potential of the wiring 259 is increased by 0.5 V is an hour in the case where the off-state current of the transistor 323 is $1.39 \times 10^{-15}$ A, a day in the case where the off-state current of the transistor 323 is $5.79 \times 10^{-17}$ A, a year in the case where the off-state current of the transistor 323 is $1.59 \times 10^{-19}$ A, and ten years in the case where the off-state current of the transistor 323 is $1.59 \times 10^{-20}$ A. When the off-state current of the transistor 323 is smaller than or equal to $1.59 \times 10^{-20}$ A, data written to the memory circuit 350 (the memory circuit 350a) can be retained for ten years or more.

For example, by using an OS transistor as the transistor 323, an extremely small off-state current of the transistor can be achieved. In order to reduce the off-state current, the transistor 323 preferably has a large channel length. Alternatively, the transistor 323 preferably has a short channel width. Alternatively, the transistor 323 preferably has a channel length larger than a channel width.

The transistor 323 is particularly preferably a transistor having a small off-state current at $V_g$ of 0 V. Thus, a transistor having high Vth is preferably used as the transistor 323. As the transistor having high Vth, the transistor 200 or the like described above can be used. Since the transistor 262 writes or reads data, a transistor having low Vth is preferably used as the transistor 262. Furthermore, a transistor having a large on-state current and high field-effect mobility is preferably used as the transistor 262. The transistor 100 or the like described above can be used as the transistor 262.

Figure 27:
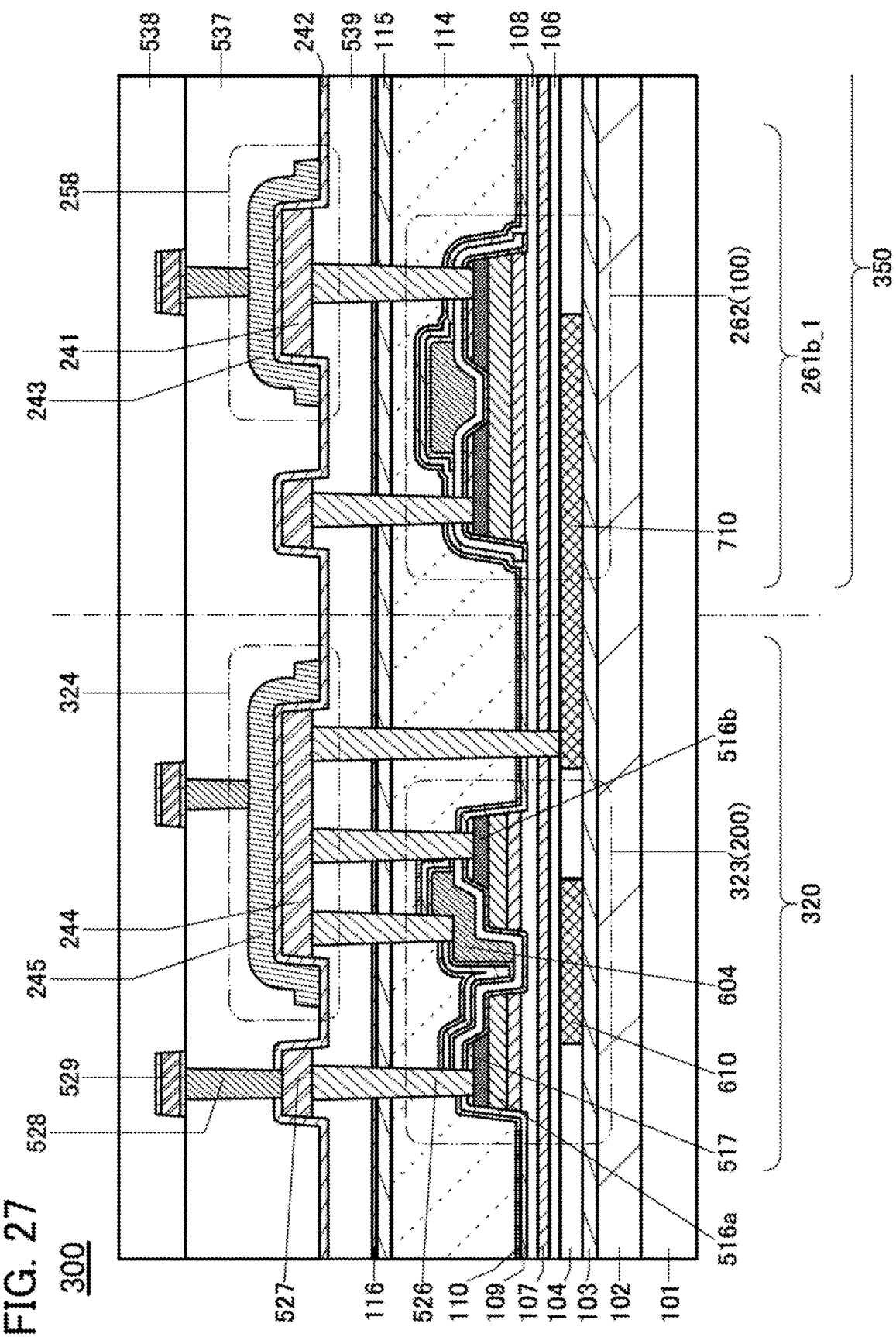
FIG. 27 illustrates a memory device of one embodiment of the present invention.

FIG. 27 is a cross-sectional view illustrating part of a cross-sectional structure of the memory device 300 in the case where the transistor 100 is used as the transistor 262 of the memory circuit 350 and the transistor 200 is used as the transistor 323 of the voltage retention circuit 320.

In FIG. 27, the memory device 300 includes the transistors 262 and 323 over a substrate 101 with the insulators 102 and 103 provided therebetween; the insulators 115, 116, and 539 over the transistors 262 and 323; the conductor 241, a conductor 244, and the conductor 527 over the insulator 539; the insulator 242 covering the conductors 241, 244, and 527; and the conductor 243 covering the conductor 241 and a conductor 245 covering the conductor 244, over the insulator 242.

A region where the conductor 241, the insulator 242, and the conductor 243 overlap with each other functions as the capacitor 258. By providing the conductor 243 to cover the conductor 241, not only a top surface but also side surfaces of the conductor 241 can function as the capacitor. A region where the conductor 244, the insulator 242, and the conductor 245 overlap with each other functions as the capacitor 324. By providing the conductor 245 to cover the conductor 244, not only a top surface but also side surfaces of the conductor 244 can function as the capacitor.

The conductor 527 is electrically connected to a source (a conductor 516a) of the transistor 323 through the conductor 526 provided in part of the insulators 539, 116, 115, 114, 110, and 109 and part of the barrier film 517.

The insulator 537 is provided over the conductors 243 and 245 and the insulator 242, the conductor 529 is provided over the insulator 537, and the insulator 538 is provided over the insulator 537 and the conductor 529. The conductor 529 is electrically connected to the conductor 527 through the conductor 528 provided in part of the insulator 537 and part of the insulator 242.

The drain (a conductor 516b) of the transistor 323 is electrically connected to a gate (a conductor 604) of the transistor 323 and a back gate (a conductor 710) of the transistor 262. Although not illustrated, the drain (the conductor 516*b*) and the gate (the conductor 604) of the transistor 323 are also electrically connected to the back gate (a conductor 610) of the transistor 323.

Note that although in FIG. 27, the drain (the conductor 516*b*) of the transistor 323 and the gate (the conductor 604) of the transistor 323 are electrically connected to each other, the gate (the conductor 604) may be independently controlled in one embodiment of the present invention. In that case, the drain (the conductor 516*b*) of the transistor 323, the back gate (the conductor 610) of the transistor 323, and the back gate (the conductor 710) of the transistor 262 are electrically connected to one another; thus, the gate (the conductor 604) of the transistor 323 is independently controlled.

Although the transistor 323 includes the gate (the conductor 604) in FIG. 27, the transistor 323 does not necessarily include a gate (the conductor 604) in one embodiment of the present invention. In that case, the drain (the conductor 516*b*) of the transistor 323, the back gate (the conductor 610) of the transistor 323, and the back gate (the conductor 710) of the transistor 262 are electrically connected to one another.

The insulators 102, 103, 104, 106, 107, 108, 109, 110, 115, 116, 242, 539, 537, and 538 can be formed using a material and a method which are similar to those of the insulators described in the above embodiments and the like. The conductors 526, 527, 241, 243, 244, 245, 528, and 529 can be formed using a material and a method which are similar to those of the conductors described in the above embodiments and the like. The conductors 241, 244, and 527 can be formed through the same steps at the same time. The conductors 243 and 245 can be formed through the same steps at the same time.

According to one embodiment of the present invention, transistors having different electrical characteristics can be manufactured through substantially the same process. That is, according to one embodiment of the present invention, a memory device with high productivity can be provided. According to one embodiment of the present invention, a memory device which can retain data for a long period even when power supply is stopped can be provided. For example, a memory device which can retain data for a year or more, ten years or more after power supply is stopped can be provided. Thus, a memory device of one embodiment of the present invention can be regarded as a nonvolatile memory.

The structures, the methods, and the like described in this embodiment can be combined as appropriate with any of the structures, the methods, and the like described in the other embodiments and examples.

Embodiment 4

<Electronic Device>

A semiconductor device of one embodiment of the present invention can be used for a variety of electronic devices. FIGS. 28A to 28G illustrate specific examples of the electronic devices including the semiconductor device of one embodiment of the present invention.

Figure 28A:
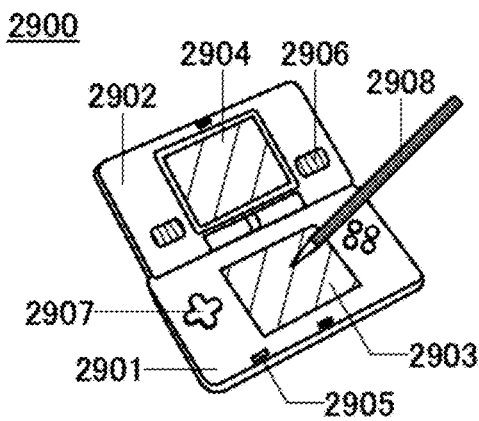
FIGS. 28A to 28G each illustrate an electronic device of one embodiment of the present invention.

A portable game machine 2900 illustrated in FIG. 28A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 28A has the two display portions 2903 and 2904, the number of display portions is not limited to this. The display portion 2903 is provided with a touch screen as an input device, which can be handled with a stylus 2908 or the like.

Figure 28B:
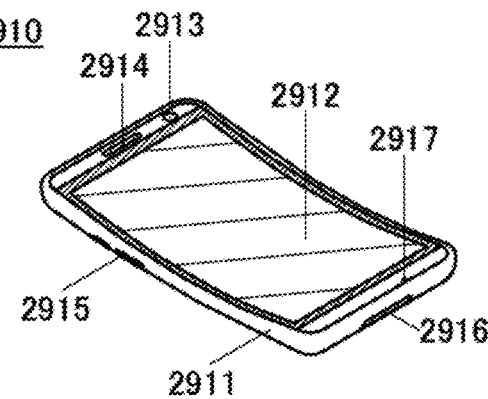

An information terminal 2910 illustrated in FIG. 28B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 28C:
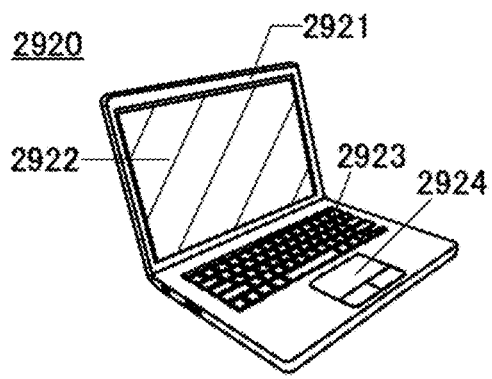

A notebook personal computer 2920 illustrated in FIG. 28C includes a housing 2921, a display portion 2922, a keyboard 2923, a pointing device 2924, and the like. In the housing 2921 of the notebook personal computer 2920, an antenna, a battery, and the like are provided.

Figure 28D:
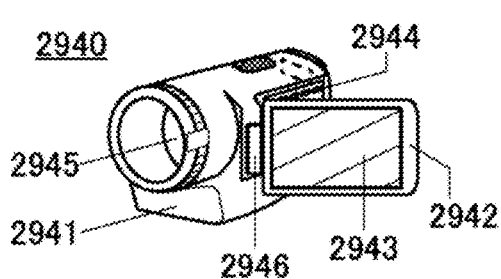

A video camera 2940 illustrated in FIG. 28D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 28E:
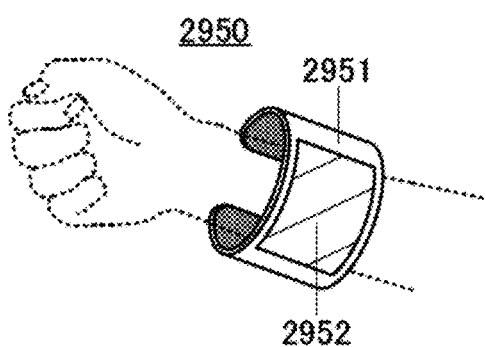

FIG. 28E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 28F:
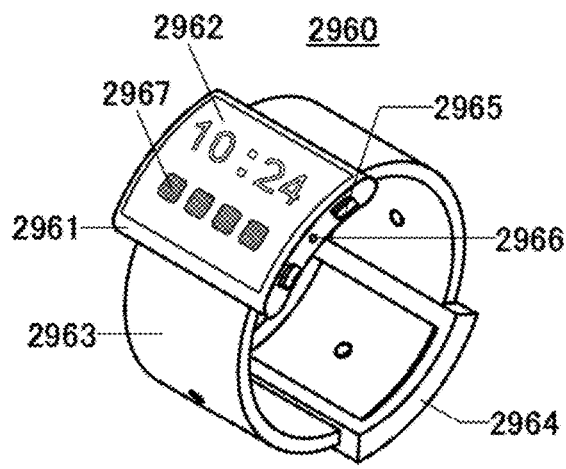

FIG. 28F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 28G:
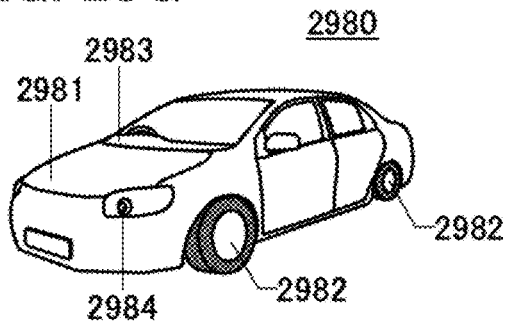

FIG. 28G is an external view illustrating an example of a car. A car 2980 includes a car body 2981, wheels 2982, a dashboard 2983, lights 2984, and the like. The car 2980 also includes an antenna, a battery, and the like.

Each of the above-described electronic devices has a memory function of retaining control data, a control program, or the like. A memory device including the semiconductor device of one embodiment of the present invention can retain control data, a control program, or the like of the above electronic device for a long time. With use of the semiconductor device of one embodiment of the present invention, highly reliable electronic devices can be achieved.

The structures, the methods, and the like described in this embodiment can be combined as appropriate with any of the structures, the methods, and the like described in the other embodiments and examples.

Example 1

In this example, device simulation was performed on a transistor of one embodiment of the present invention to examine the electrical characteristics of the transistor.

As described above, in the semiconductor device (the memory device 300 or the memory device 300*a*) of one embodiment of the present invention illustrated in FIGS. 26A and 26B, a negative potential is applied to the back gate of the transistor 262 via the voltage retention circuit 320 in order to control Vth of the transistor 262 in the memory circuit 350 or the memory circuit 350*a* at the time of retention operation. That is, at the time of the retention operation, a negative potential is applied from the terminal 321 to the source of the transistor 323 in the voltage retention circuit 320.

In this example, potential distribution inside the transistor 200C in the case where the transistor 200C illustrated in FIGS. 9A to 9C is assumed as the transistor 323 and a negative potential is applied to the source electrode of the transistor 200C, was estimated by device simulation. Note that in the device simulation, the length in the channel length direction (hereinafter referred to as offset length) of a region between the conductor 404*b* having a function of the first gate electrode of the transistor 200C and the conductor 416*b*2 having a function of the source electrode (hereinafter referred to as offset region) was changed to examine offset length dependence of the potential distribution inside the transistor 200C.

A device simulator "Atlas 2D" developed by Silvaco Inc. was used for the calculation. Table 1 lists parameters used for the calculation. In Table 1, the density of states in the conduction band ($N_c$) represents the density of states at the conduction band minimum, and the density of states in the valence band ($N_v$) represents the density of states at the valence band maximum. The calculation was performed under four conditions of the offset length of the transistor 200C: 0 μm, 0.15 μm, 0.55 μm, and 0.75 μm.

TABLE 1

| Structure | | |
|---|---|---|
| | Channel length (L) | 1 [μm] |
| | Channel width (W) | 0.35 [μm] |
| Insulator 408b | Material | AlOx |
| | Thickness | 10 [nm] |
| Conductor 404b | Work function | 6.0 [eV] |
| | Thickness | 45 [nm] |
| Insulator 412b | Relative permittivity | 4.1 |
| | Thickness | 10 [nm] |
| Oxide 406_3b | Atomic ratio | In:Ga:Zn = 1:3:2 |
| | Electron affinity | 4.5 [eV] |
| | Band gap (Eg) | 3.5 [eV] |
| | Relative permittivity | 15 |
| | Electron mobility | 0.01 [cm$^2$/Vs] |
| | Hole mobility | 0.001 [cm$^2$/Vs] |
| | Density of states in the conduction band (Nc) | 5.0E+18 [cm$^{-3}$] |
| | Density of states in the valence band (Nv) | 1.0E+20 [cm$^{-3}$] |
| | Thickness | 20 [nm] |
| Barrier film 417b1, Barrier film 417b2 | Material | AlOx |
| | Thickness | 5 [nm] |
| Conductor 416b1, Conductor 416b2 | Work function | 4.9 [eV] |
| | Thickness | 20 [nm] |
| Oxide 406_2b, Oxide 406_2c | Atomic ratio | In:Ga:Zn = 1:1:1 |
| | Electron affinity | 4.7 [eV] |
| | Band gap (Eg) | 3.2 [eV] |
| | Relative permittivity | 15 |
| | Electron mobility | 10 [cm$^2$/Vs] |
| | Hole mobility | 0.01 [cm$^2$/Vs] |
| | Density of states in the conduction band (Nc) | 5.0E+18 [cm$^{-3}$] |
| | Density of states in the valence band (Nv) | 5.0E+18 [cm$^{-3}$] |
| | Thickness | 15 [nm] |
| Oxide 406_1b, Oxide 406_1c | Atomic ratio | In:Ga:Zn = 1:3:2 |
| | Thickness | 5 [nm] |
| Insulator 402 | Material | SiON |
| | Relative permittivity | 4.1 |
| | Thickness | 30 [nm] |
| Insulator 303 | Material | AlOx |
| | Relative permittivity | 8.1 |
| | Thickness | 20 [nm] |
| Insulator 302 | Material | SiON |
| | Relative permittivity | 4.1 |
| | Thickness | 10 [nm] |
| Conductor 310c | Work function | 6.0 [eV] |
| | Thickness | 150 [nm] |

FIGS. 29A to 29D show device simulation results of potential distribution inside the transistor 200C in the case where a negative potential of −9 V is applied to the source electrode (the conductor 416*b*2) of the transistor 200C. FIG. 29A, FIG. 29B, FIG. 29C, and FIG. 29D show the calculation results when the offset length is 0 μm, 0.15 μm, 0.55 μm, and 0.75 μm, respectively. Note that when a negative potential is applied to the source electrode (the conductor 416*b*2) of the transistor 200C, the drain electrode (the conductor 416*b*1) of the transistor 200C, the first gate electrode (the conductor 404*b*) of the transistor 200C, and the second gate electrode (the conductor 310*c*) of the transistor 200C are short-circuited and have a potential of 0 V.

Figure 29A:
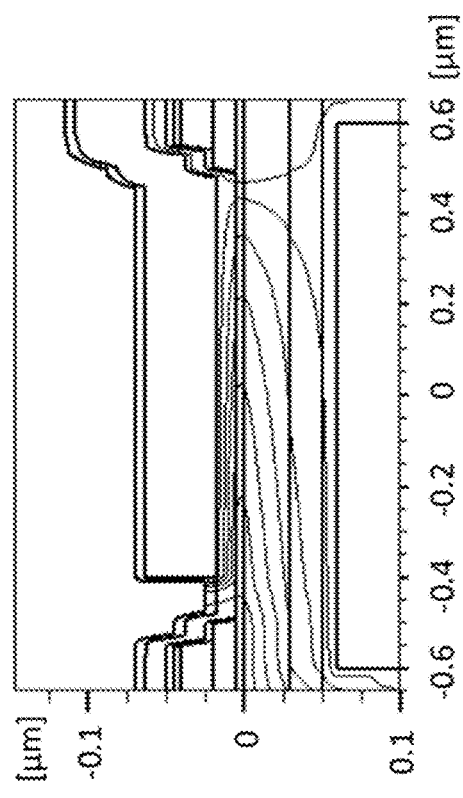
FIGS. 29A to 29D are graphs showing calculation results in Example.

As shown in FIG. 29A, when the offset length is 0 μm, the density of potential contour lines in the first gate insulator (the insulator 412*b*) on the source electrode (the conductor 416*b*2) side is high, which means that high electric field concentration occurs in the first gate insulator (the insulator 412*b*) on the source electrode (the conductor 416*b*2) side.

Figure 29B:
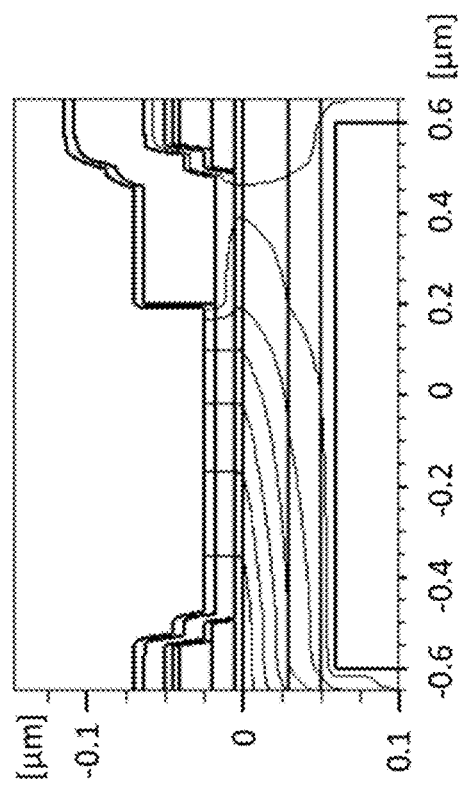

In contrast, as shown in FIG. 29B, in the structure with an offset length of 0.15 μm, the spacing between potential contour lines in the first gate insulator (the insulator 412*b*)

under the offset region is wider than that in the structure with an offset length of 0 µm (FIG. 29A), which means that electric field concentration in the first gate insulator (the insulator 412b) on the source electrode (the conductor 416b2) side is relieved.

Figure 29C:
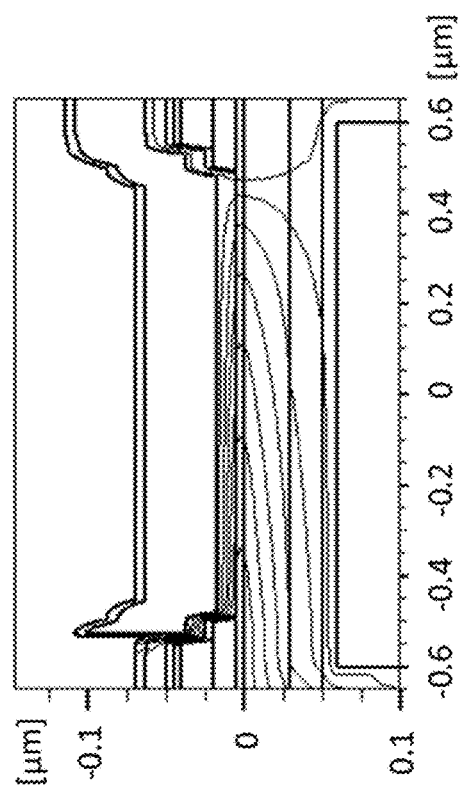
Figure 29D:
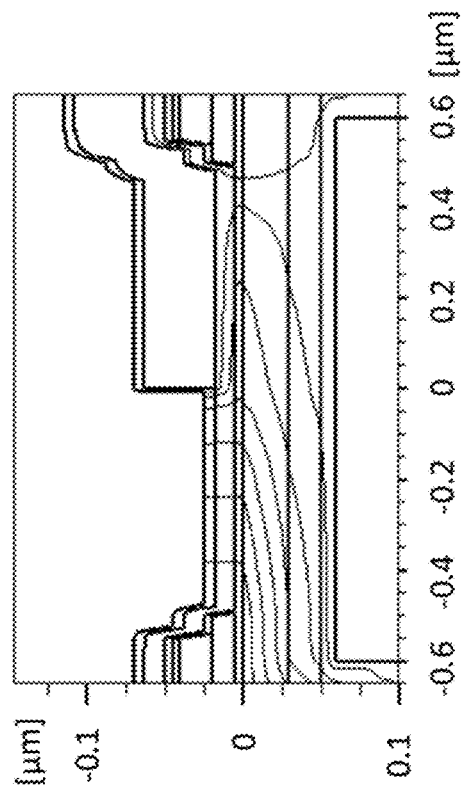

Furthermore, as shown in FIG. 29C, in the structure where the offset length is increased to 0.55 µm, electric field concentration not only in the first gate insulator (the insulator 412b) under the offset region but also in the first gate insulator (the insulator 412b) under the first gate electrode (the conductor 404b) is significantly relieved. Also in the structure with an offset length of 0.75 µm shown in FIG. 29D, substantially the same effects are obtained.

As described above, since the transistor of one embodiment of the present invention has a structure in which the offset region is provided on the source electrode side, electric field concentration that occurs in the first gate insulator when a negative potential is applied to the source electrode can be relieved. In addition, making the offset length as large as possible, preferably making the offset length a half or more of the channel length is more effective in relieving the electric field concentration. In the transistor of one embodiment of the present invention, even when a high potential is applied to the source electrode, a breakdown of the first gate insulator can be prevented; therefore, the transistor has high reliability.

The structures, the methods, and the like described in this embodiment can be combined as appropriate with any of the structures, the methods, and the like described in the other embodiments and examples.

Example 2

In this example, device simulation was performed on a transistor of one embodiment of the present invention, which is different from the transistor described in Example 1, to examine the electrical characteristics of the transistor.

In this example, potential distribution inside the transistor 200G in the case where the transistor 200G illustrated in FIGS. 13A to 13C is assumed as the transistor 323 and a negative potential is applied to the source electrode of the transistor 200G, was estimated by device simulation.

A device simulator "Atlas 2D" developed by Silvaco Inc. was used for the calculation. Specific parameters used for the calculation are shown in Table 1 shown above. Note that since the transistor 200G assumed in this example has a structure without the first gate electrode, the parameters of the conductor 404b that corresponds to the first gate electrode in Table 1 were not used for the calculation.

Figure 30:
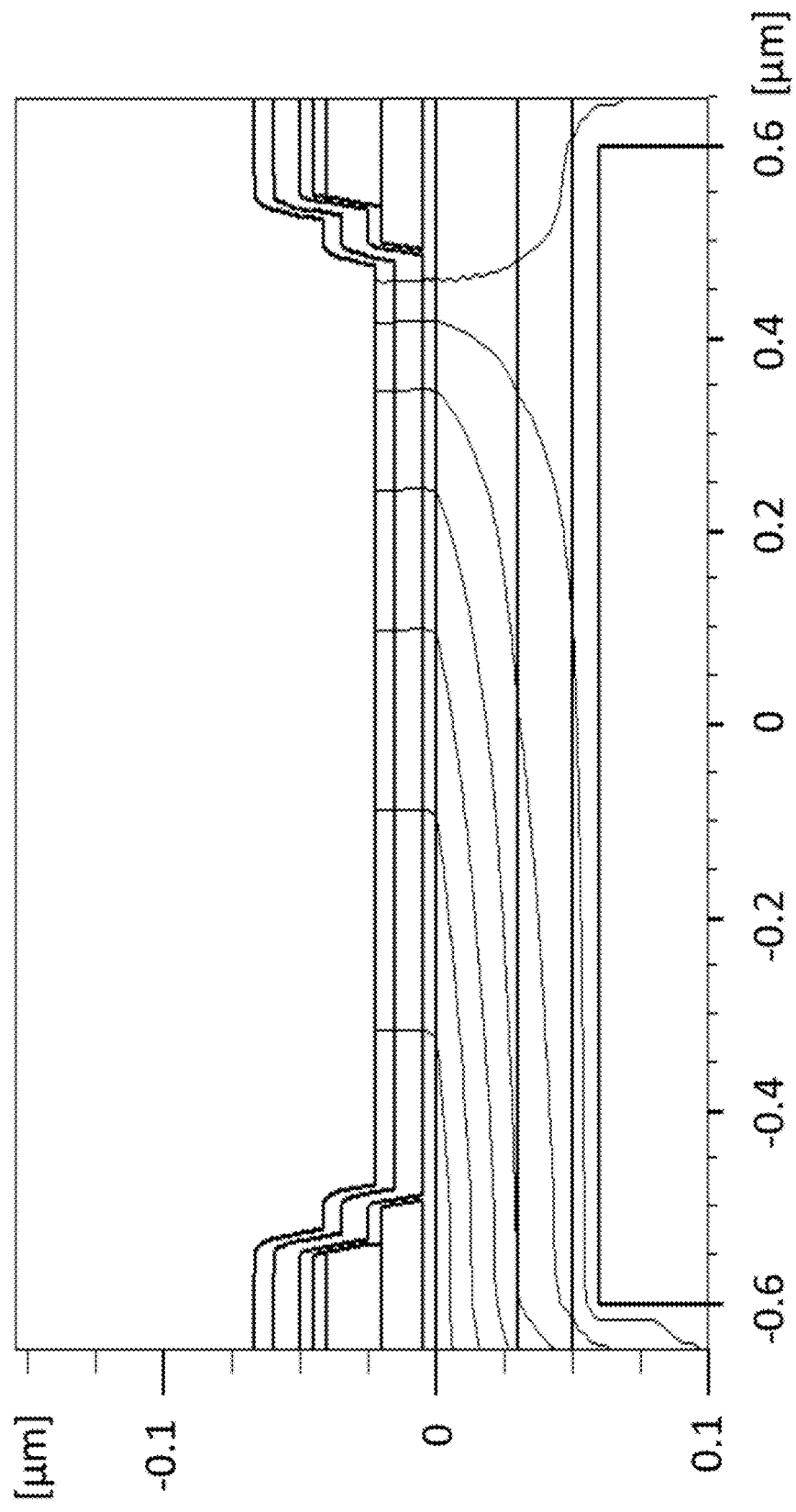
FIG. 30 is a graph showing calculation results in Example.

FIG. 30 shows device simulation results of potential distribution inside the transistor 200G in the case where a negative potential of −9 V is applied to the source electrode (the conductor 416b2) of the transistor 200G. Note that when a negative potential is applied to the source electrode (the conductor 416b2) of the transistor 200G, the drain electrode (the conductor 416b1) of the transistor 200G and the second gate electrode (the conductor 310c) of the transistor 200G are short-circuited and have a potential of 0 V.

As shown in FIG. 30, owing to the structure without the first gate electrode, an electric field from the source electrode is not applied to the insulator 412b.

As described above, since the transistor of one embodiment of the present invention does not include the first gate electrode, an electric field is not applied to the first gate insulator when a negative potential is applied to the source electrode. In the transistor of one embodiment of the present invention, even when a high potential is applied to the source electrode, a breakdown of the insulator 412b can be prevented; therefore, the transistor has high reliability.

The structures, the methods, and the like described in this embodiment can be combined as appropriate with any of the structures, the methods, and the like described in the other embodiments and examples.

This application is based on Japanese Patent Application Serial No. 2016-147684 filed with Japan Patent Office on Jul. 27, 2016, the entire contents of which are hereby incorporated by reference.

What is claimed is:

1. A transistor comprising:
    a first gate electrode;
    a first gate insulator over the first gate electrode;
    a first oxide and a second oxide over the first gate insulator;
    a first conductor over and in contact with the first oxide;
    a second conductor over and in contact with the second oxide;
    a third oxide over the first gate insulator, the first oxide, the first conductor, the second oxide, and the second conductor;
    a second gate insulator over the third oxide; and
    a second gate electrode over the second gate insulator,
    wherein a first side surface of the first conductor recedes from a first side surface of the first oxide so that a top surface of the first oxide is exposed,
    wherein a first side surface of the second conductor recedes from a first side surface of the second oxide so that a top surface of the second oxide is exposed,
    wherein the third oxide is in contact with the first side surface of the first conductor, the top surface and the first side surface of the first oxide, the first side surface of the second conductor, and the top surface and the first side surface of the second oxide,
    wherein the first oxide and the second oxide are spaced from each other,
    wherein the first oxide, the second oxide, and the third oxide each comprise an oxide semiconductor containing indium, an element M and zinc,
    wherein the element M is at least one of aluminum, gallium, yttrium, and tin,
    wherein the second gate electrode does not have a region overlapping with the first conductor, and
    wherein the second gate electrode has a region overlapping with the second conductor.

2. The transistor according to claim 1,
    wherein a second side surface of the first conductor is aligned with a second side surface of the first oxide, and
    wherein a second side surface of the second conductor is aligned with a second side surface of the second oxide.

3. The transistor according to claim 1,
    wherein the third oxide comprises a channel formation region,
    wherein the first conductor serves as a source electrode, and
    wherein the second conductor serves as a drain electrode.

4. The transistor according to claim 3,
    wherein a region of the channel formation region which is not covered with the second gate electrode is larger than a region of the channel formation region which is covered with the second gate electrode.

5. The transistor according to claim 1,
    wherein the first gate electrode and the second conductor are electrically connected to each other.

6. The transistor according to claim 1,
wherein the first gate electrode, the second conductor, and the second gate electrode are electrically connected to one another.

7. The transistor according to claim 1,
wherein the first oxide and the second oxide have the same composition, and
wherein an atomic ratio of indium to the element M in the third oxide is lower than an atomic ratio of indium to the element M in the first oxide.

8. A transistor comprising:
a first gate electrode;
a first gate insulator over the first gate electrode;
a first oxide and a second oxide over the first gate insulator;
a first conductor over and in contact with the first oxide;
a second conductor over and in contact with the second oxide;
a third oxide over the first oxide, the first conductor, the second oxide, and the second conductor;
a second gate insulator over the third oxide; and
a second gate electrode over the second gate insulator,
wherein a region of the third oxide is in contact with a top surface of the first gate insulator in a region between the first oxide and the second oxide,
wherein a first side surface of the first conductor recedes from a first side surface of the first oxide so that a top surface of the first oxide is exposed,
wherein a first side surface of the second conductor recedes from a first side surface of the second oxide so that a top surface of the second oxide is exposed,
wherein the third oxide is in contact with the first side surface of the first conductor, the top surface and the first side surface of the first oxide, the first side surface of the second conductor, and the top surface and the first side surface of the second oxide,
wherein the first oxide, the second oxide, and the third oxide each comprise an oxide semiconductor containing indium, an element M, and zinc,
wherein the element M is at least one of aluminum, gallium, yttrium, and tin,
wherein a region of the second gate electrode overlaps with the second conductor, and
wherein an end portion of the second gate electrode overlaps with the region of the third oxide.

9. The transistor according to claim 8,
wherein a second side surface of the first conductor is aligned with a second side surface of the first oxide, and
wherein a second side surface of the second conductor is aligned with a second side surface of the second oxide.

10. The transistor according to claim 8,
wherein the third oxide comprises a channel formation region,
wherein the first conductor serves as a source electrode, and
wherein the second conductor serves as a drain electrode.

11. The transistor according to claim 10,
wherein a region of the channel formation region which is not covered with the second gate electrode is larger than a region of the channel formation region which is covered with the second gate electrode.

12. The transistor according to claim 8,
wherein the first gate electrode and the second conductor are electrically connected to each other.

13. The transistor according to claim 8,
wherein the first gate electrode, the second conductor, and the second gate electrode are electrically connected to one another.

14. The transistor according to claim 8,
wherein the first oxide and the second oxide have the same composition, and
wherein an atomic ratio of indium to the element M in the third oxide is lower than an atomic ratio of indium to the element M in the first oxide.

* * * * *